US012765257B2

(12) United States Patent
Bae et al.

(10) Patent No.: US 12,765,257 B2
(45) Date of Patent: Oct. 13, 2026

(54) ORGANIC LIGHT-EMITTING DEVICE AND AN APPARATUS INCLUDING THE SAME

(71) Applicant: Samsung Display Co., Ltd., Yongin-si (KR)

(72) Inventors: Sungsoo Bae, Yongin-si (KR); Soungwook Kim, Yongin-si (KR); Seulong Kim, Yongin-si (KR); Hyein Jeong, Yongin-si (KR); Hyewon Choi, Yongin-si (KR); Jaeweon Hur, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1220 days.

(21) Appl. No.: 17/560,206

(22) Filed: Dec. 22, 2021

(65) Prior Publication Data

US 2022/0209133 A1 Jun. 30, 2022

(30) Foreign Application Priority Data

Dec. 23, 2020 (KR) ........................ 10-2020-0182421

(51) Int. Cl.
*H10K 85/60* (2023.01)
*H10K 50/12* (2023.01)
(Continued)

(52) U.S. Cl.
CPC ......... *H10K 85/654* (2023.02); *H10K 85/342* (2023.02); *H10K 85/346* (2023.02);
(Continued)

(58) Field of Classification Search
CPC ........ H10K 50/11; H10K 50/12; H10K 50/13; H10K 50/85; H10K 59/12; H10K 85/342;
(Continued)

(56) References Cited

U.S. PATENT DOCUMENTS 6,274,980 B1 8/2001 Burrows et al.
7,045,952 B2 5/2006 Lu
(Continued)

FOREIGN PATENT DOCUMENTS

CN 106611822 A 5/2017
CN 106910831 A 6/2017
(Continued)

OTHER PUBLICATIONS

Office action for CN Patent Application No. 202111630530.0 dated Jul. 1, 2026, 6pp.

*Primary Examiner* — Elizabeth M. Dahlburg
(74) *Attorney, Agent, or Firm* — Womble Bond Dickinson (US) LLP

(57) ABSTRACT

An organic light-emitting device includes: a first electrode; a second electrode; and an organic layer between the first electrode and the second electrode, wherein the organic layer includes: an emission region; a hole transport region between the first electrode and the emission region; and an electron transport region between the emission region and the second electrode, the emission region includes a first emission layer proximate to the hole transport region and a second emission layer proximate to the electron transport region, the first emission layer and the second emission layer are different from each other, and Equation 1 is satisfied, as described herein.

14 Claims, 5 Drawing Sheets

(51) Int. Cl.

| | |
|---|---|
| ***H10K 50/13*** | (2023.01) |
| ***H10K 85/30*** | (2023.01) |
| *H10K 50/85* | (2023.01) |
| *H10K 59/12* | (2023.01) |

(52) U.S. Cl.
CPC ....... *H10K 85/626* (2023.02); *H10K 85/6572* (2023.02); *H10K 85/6574* (2023.02); *H10K 50/12* (2023.02); *H10K 50/13* (2023.02); *H10K 50/85* (2023.02); *H10K 59/12* (2023.02)

(58) Field of Classification Search
CPC .. H10K 85/346; H10K 85/626; H10K 85/654; H10K 85/6572; H10K 85/6574; H10K 85/6576; H10K 2101/40; H10K 2101/90; H10K 2101/351
See application file for complete search history.

(56) References Cited

U.S. PATENT DOCUMENTS

| | | | |
|---|---|---|---|
| 7,906,897 | B2 | 3/2011 | Satou |
| 8,470,455 | B2 | 6/2013 | Matsuura et al. |
| 2008/0187748 | A1 | 8/2008 | Mishima |
| 2010/0301315 | A1 | 12/2010 | Masui |
| 2013/0009139 | A1 | 1/2013 | Ohsawa et al. |
| 2015/0263289 | A1 | 9/2015 | Kim et al. |
| 2015/0318510 | A1 | 11/2015 | Ito et al. |
| 2015/0318511 | A1* | 11/2015 | Kim ..................... H10K 50/121 257/40 |
| 2015/0380662 | A1 | 12/2015 | Kim et al. |
| 2016/0365521 | A1 | 12/2016 | Jun et al. |
| 2017/0117486 | A1 | 4/2017 | Cho et al. |
| 2017/0179395 | A1 | 6/2017 | Kim et al. |
| 2017/0271596 | A1 | 9/2017 | Lee |
| 2018/0366647 | A1 | 12/2018 | Jun et al. |
| 2020/0106024 | A1 | 4/2020 | Seo et al. |

FOREIGN PATENT DOCUMENTS

| | | | |
|---|---|---|---|
| CN | 107200738 | A | 9/2017 |
| CN | 109096125 | A | 12/2018 |
| CN | 110165087 | A | 8/2019 |
| JP | 5205584 | B2 | 4/2008 |
| JP | 2011-003793 | A | 1/2011 |
| JP | 5300255 | B2 | 9/2013 |
| JP | 5456554 | B2 | 4/2014 |
| KR | 10-2007-0081182 | A | 8/2007 |
| KR | 101159374 | B1 | 6/2012 |
| KR | 10-2013-0009619 | A | 1/2013 |
| KR | 10-2015-0126527 | A | 11/2015 |
| KR | 10-2016-0003362 | A | 1/2016 |
| KR | 10-2016-0147230 | A | 12/2016 |
| KR | 10-2019-0098676 | A | 8/2019 |

* cited by examiner

ORGANIC LIGHT-EMITTING DEVICE AND AN APPARATUS INCLUDING THE SAME

CROSS-REFERENCE TO RELATED APPLICATION

This application claims priority from and the benefit of Korean Patent Application No. 10-2020-0182421, filed on Dec. 23, 2020, which is hereby incorporated by reference for all purposes as if fully set forth herein.

BACKGROUND

Field

Embodiments of the invention relate generally to display devices and, more particularly to an organic light-emitting device and an electronic apparatus including the same.

Discussion of the Background

Organic light-emitting devices are self-emission devices that have wide viewing angles, high contrast ratios, short response times, and excellent characteristics in terms of luminance, driving voltage, and response speed, and produce full-color images.

An organic light-emitting device may include a first electrode located on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

The above information disclosed in this Background section is only for understanding of the background of the inventive concepts, and, therefore, it may contain information that does not constitute prior art.

SUMMARY

Organic light-emitting devices and apparatuses constructed according to principles and illustrative implementations of the invention have significant and unexpected improvement in lifespan and luminescence efficiency and/or prevent a decrease in luminescence efficiency. For example, organic light-emitting devices constructed according to the principles and embodiments of the invention may include a compound having weak hole trapping characteristics in a first emission layer in an emission region neighboring a hole transport region, and a compound having strong hole trapping characteristics in a second emission layer in an emission region neighboring an electron transport region. As a result, a recombination region may be formed at an interface between the first emission layer and the second emission layer. In this manner, the lifespan and luminescence efficiency of the device may be improved. When the recombination region is present near a neighboring hole transport region or electron transport region instead of at the interface between the first emission layer and the second emission layer, deterioration of device materials may occur, and the luminescence efficiency may be decreased due to loss of excitons. However, in the organic light-emitting devices constructed according to the principles and embodiments of the invention, even when a leakage of some charges occurs, the leaked charges will be relocated in the vicinity of the interface between the first emission layer and the second emission layer in the emission region, and thus, the decrease in the luminescence efficiency may be reduced or prevented.

Additional features of the inventive concepts will be set forth in the description which follows, and in part will be apparent from the description, or may be learned by practice of the inventive concepts.

According to one aspect of the invention, an organic light-emitting device includes: a first electrode; a second electrode; and an organic layer between the first electrode and the second electrode, wherein the organic layer includes: an emission region; a hole transport region between the first electrode and the emission region; and an electron transport region between the emission region and the second electrode, the emission region includes a first emission layer proximate to the hole transport region and a second emission layer proximate to the electron transport region, the first emission layer and the second emission layer are different from each other, and Equation 1 is satisfied:

$$VHOD\_EML1\ (\text{at } 10\ \text{mA/cm}^2)+0.5 \leq VHOD\_EML2\ (\text{at } 10\ \text{mA/cm}^2) \quad \text{Equation 1}$$

wherein, in Equation 1,

VHOD_EML1 (at 10 $mA/cm^2$) is a driving voltage value when a current density of a first hole-only device having a structure including the first electrode, the hole transport region, the first emission layer, and the second electrode is 10 $mA/cm^2$, VHOD_EML2 (at 10 $mA/cm^2$) is a driving voltage value when a current density of a second hole-only device having a structure including the first electrode, the hole transport region, the second emission layer, and the second electrode is 10 $mA/cm^2$, and the first hole-only device and the second hole-only device have substantially the same structure, except that the first emission layer and the second emission layer are respectively used in the first hole-only device and the second hole-only device.

The first electrode may include an anode, the second electrode may include a cathode, and the hole transport region may include a hole injection layer, a hole transport layer, an emission auxiliary layer, an electron blocking layer, or any combination thereof, and the electron transport region may include a hole blocking layer, a buffer layer, an electron transport layer, an electron injection layer, or any combination thereof.

The first emission layer may directly contact the second emission layer.

The first emission layer and the second emission layer may have different thicknesses from each other.

The first emission layer may have a thickness less than or equal to a thickness of the second emission layer.

The holes and electrons may be recombined at an interface between the first emission layer and the second emission layer.

The first emission layer and the second emission layer may each, independently from one another, include both a first compound including a hole transporting host, and a second compound including an electron transporting host; or a third compound including a bipolar host.

The first compound may include a donor nitrogen, and the second compound may include an acceptor nitrogen.

The third compound may include both a donor nitrogen and an acceptor nitrogen, wherein the donor nitrogen may include the structure

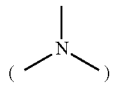

and the acceptor nitrogen may include the structure (—N=).

The first compound may be of Formula 1, as defined herein.

The second compound may be of Formula 2, as defined herein.

The third compound may be of Formula 3, as defined herein.

The first emission layer may include a first dopant, and the second emission layer may include a second dopant, and the first dopant and the second dopant may be different from each other.

The first dopant and the second dopant may each be of Formula 4, as defined herein.

The first dopant and the second dopant may be each, independently from one another, one of Formulae 4-1 and 4-2, as defined herein.

The first dopant may be of Formula 4-2, as defined herein, where $M_{31}$ is Pt, and n32 is 0 and the second dopant may be of Formula 4-1, as defined herein, where $M_{31}$ is Ir, and the sum of n31 and n32 is 3.

At least one of the variables $A_{31}$ to $A_{34}$ in the first dopant, independently from one another, may be a pyridine group.

An electronic apparatus may include the organic light-emitting device, as described above.

The electronic apparatus may further include a thin-film transistor having a source electrode and a drain electrode, and the first electrode of the organic light-emitting device may be electrically connected to at least one of the source electrode and the drain electrode of the thin-film transistor.

The electronic apparatus may further include a color filter, a color conversion layer, a touch screen layer, a polarizing layer, or any combination thereof.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
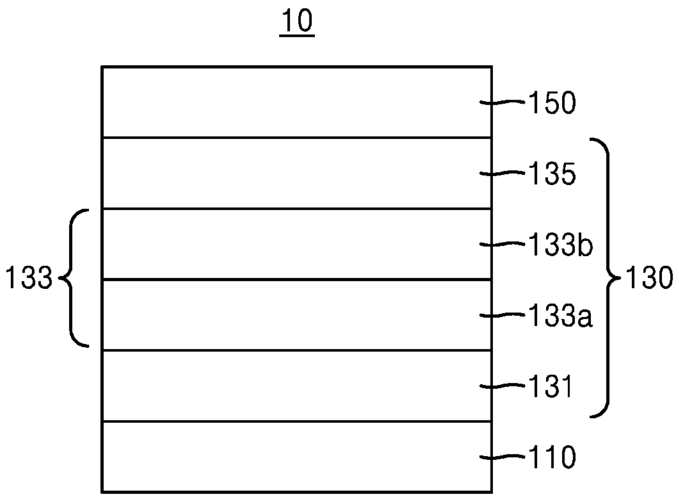
FIG. 1 is a schematic cross-sectional view of an embodiment illustrating an organic light-emitting device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements. Thus, components of one illustrated embodiment that are the same or correspond to components of another illustrated embodiment may have the same reference numeral, and redundant explanations are omitted to avoid redundancy.

When an element or a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
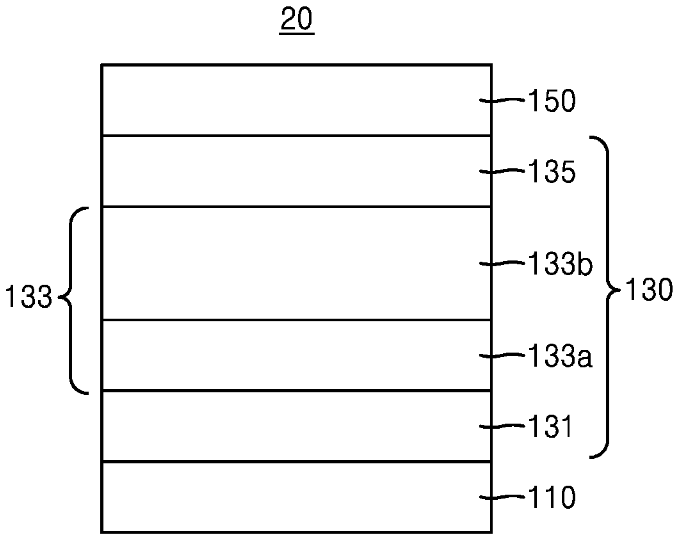
FIG. 2 is a schematic cross-sectional view of another embodiment illustrating an organic light-emitting device constructed according to the principles of the invention.

Description of FIGS. 1 and 2

FIG. 1 is a schematic cross-sectional view of an embodiment illustrating an organic light-emitting device constructed according to the principles of the invention. FIG. 2 is a schematic cross-sectional view of another embodiment illustrating an organic light-emitting device constructed according to the principles of the invention.

FIGS. 1 and 2 are each a schematic view of an embodiment of a organic light-emitting device 10 or 20. The organic light-emitting device 10 or 20 includes a first electrode 110, an organic layer 130, and a second electrode 150.

According to one or more embodiments, the organic light-emitting device 10 or 20 includes: a first electrode 110; a second electrode 150; and an organic layer 130 between the first electrode 110 and the second electrode 150, wherein the organic layer 130 includes: an emission region 133; a hole transport region 131 between the first electrode 110 and the emission region 133; and an electron transport region 135 between the emission region 133 and the second electrode 150, the emission region 133 includes a first emission layer **133*a* neighboring the hole transport region 131 and a second emission layer 133*b* neighboring the electron transport region 135, the first emission layer 133*a* and the second emission layer 133*b*** are different from each other, and Equation 1 is satisfied:

$$VHOD\_EML1 \text{ (at 10 milliamperes per centimeter (mA/cm}^2\text{))} + 0.5 \leq VHOD\_EML2 \text{ (at 10 mA/cm}^2\text{)} \qquad \text{Equation 1}$$

In Equation 1,

VHOD_EML1 (at 10 mA/cm$^2$) is the driving voltage value (V) when the current density of a first hole-only device having the structure of a first electrode/hole transport region/first emission layer/second electrode is 10 mA/cm$^2$, VHOD_EML2 (at 10 mA/cm$^2$) is the driving voltage value (V) when the current density of a second hole-only device having the structure of a first electrode/hole transport region/second emission layer/second electrode is 10 mA/cm$^2$, and the first hole-only device and the second hole-only device have the same structure, except that a first emission layer and a second emission layer are respectively used in the first hole-only device and the second hole-only device.

In an embodiment, in the first hole-only device and the second hole-only device, a first electrode may be an indium tin oxide (ITO) having a thickness of about 150 nm, a hole transport region may be prepared by stacking a compound HT3 to a thickness of about 120 nm as a hole injection layer and stacking a compound HT47 to a thickness of about 30 nm as a hole transport layer, a first emission layer or a second emission layer may each have a thickness of about 35 nm, a compound 1,4,5,8,9,12-hexaazatriphenylene-hexacarbonitrile (HAT-CN) may be stacked on the first emission layer or the second emission layer to a thickness of 10 nm as an electron blocking layer, and a second electrode may be formed by stacking Mg—Ag (weight ratio of about 5:5) to a thickness of about 80 nm.

Figure 3:
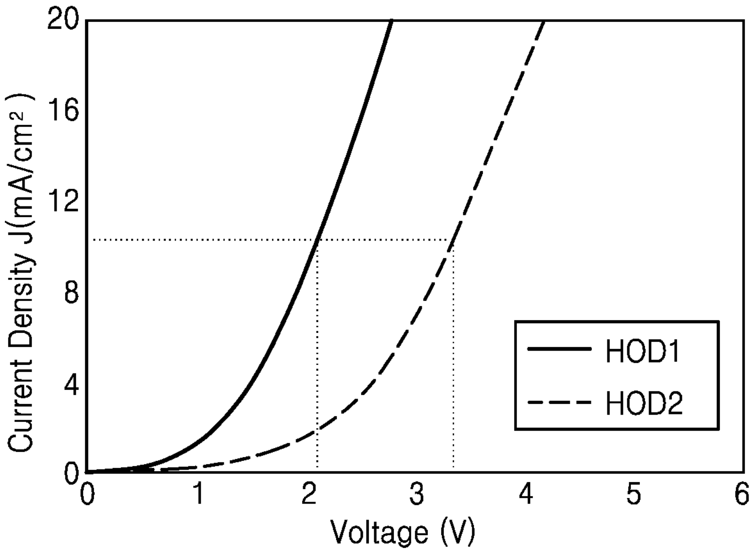
FIG. 3 is a graphical depiction of measured values of VHOD_EML1 and VHOD_EML2 of an organic light-emitting device constructed according to the principles of the invention.

FIG. 3 is a graphical depiction of measured values of VHOD_EML1 and VHOD_EML2 of an organic light-emitting device constructed according to the principles of the invention.

FIG. 3 is a graph measuring VHOD_EML1 and VHOD_EML2 of an organic light-emitting device according to an embodiment. Referring to FIG. 3, it can be seen that the difference between VHOD_EML2 and VHOD_EML1 at the current density of 10 $mA/cm^2$ is about 1.0 V or more, and thus, Equation 1 is satisfied. The driving voltage was measured by using a source-measure unit sold under the trade designation SMU 236 from Keithley Instrument by Tektronix, Inc., of Beaverton, Oregon. In detail, a required voltage section was obtained from current-voltage-luminescence (I-V-L) measurement results of an organic light-emitting device including an electron transport region, and then, when measuring the driving voltage of a hole-only device (HOD), the current for a voltage sweep of a certain section was determined and only the I-V was measured to confirm the driving voltage.

When Equation 1 is not satisfied and the difference between VHOD_EML1 (at 10 $mA/cm^2$) and VHOD_EML2 (at 10 $mA/cm^2$) is about 0.5 V or less, weak hole trapping characteristics of the second emission layer 133*b* may cause a recombination region centered on an interface between the first emission layer 133*a* and the second emission layer 133*b* to move toward the electron transport region 135, and thus, the device lifespan may be reduced, or the driving voltage may be increased.

In an embodiment, the first electrode 110 may be an anode, the second electrode 150 may be a cathode, the hole transport region 131 may include a hole injection layer, a hole transport layer, an emission auxiliary layer, an electron blocking layer, or any combination thereof, and the electron transport region 135 may include a hole blocking layer, a buffer layer, an electron transport layer, an electron injection layer, or any combination thereof.

Hereinafter, the structure of the organic light-emitting device 10 or 20 and an illustrative method of manufacturing the same will be described in connection with FIGS. 1 and 2.

First Electrode 110

In FIGS. 1 and 2, a substrate may be additionally located under the first electrode 110 or above the second electrode 150. As the substrate, a glass substrate or a plastic substrate may be used. In an embodiment, the substrate may be a flexible substrate, and may include plastics with excellent heat resistance and durability, such as a polyimide, a polyethylene terephthalate (PET), a polycarbonate, a polyethylene naphthalate, a polyarylate (PAR), a polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a transflective electrode, or a transmissive electrode. When the first electrode 110 is a transmissive electrode, a material for forming the first electrode 110 may include an ITO, an indium zinc oxide (IZO), a tin oxide ($SnO_2$), a zinc oxide (ZnO), or any combination thereof. In one or more embodiments, when the first electrode 110 is a transflective electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110. The first electrode 110 may have a single-layered structure consisting of a single layer or a multi-layered structure including a plurality of layers. For example, the first electrode 110 may have a three-layered structure of an ITO/Ag/ITO.

Organic Layer 130

The organic layer 130 may be located on the first electrode 110. The organic layer 130 may include an emission region 133. The organic layer 130 may further include a hole transport region 131 located between the first electrode 110 and the emission region 133 and an electron transport region 135 located between the emission region 133 and the second electrode 150.

The organic layer 130 may further include metal-containing compounds such as organometallic compounds, inorganic materials such as quantum dots, and the like, in addition to various organic materials. In one or more embodiments, the organic layer 130 may include, i) two or more emitting units sequentially stacked between the first electrode 110 and the second electrode 150 and ii) a charge generation layer located between the two emitting units. When the organic layer 130 includes the emitting units and the charge generation layer as described above, the light-emitting device 10 or 20 may be a tandem light-emitting device.

Emission Region 133 in Organic Layer 130

When the organic light-emitting device 10 or 20 is a full-color organic light-emitting device, the emission region 133 may be patterned into a red emission layer, a green emission layer, and/or a blue emission layer, according to a sub-pixel. In one or more embodiments, the emission region 133 may have a stacked structure of two or more layers of the red emission layer, a green emission layer, and a blue emission layer, in which the two or more layers contact each other or are separated from each other. In one or more embodiments, the emission region may include two or more materials of a red light-emitting material, a green light-emitting material, and a blue light-emitting material, in which the two or more materials are mixed with each other in a single layer to emit white light.

The thickness of the emission region 133 may be in a range of about 100 Å to about 1,000 Å, for example, about 200 Å to about 600 Å. When the thickness of the emission region 133 is within this range, excellent light-emission characteristics may be obtained without a substantial increase in driving voltage. The emission region 133 may include a first emission layer 133*a* and a second emission layer 133*b* satisfying the above condition. In an embodiment, the first emission layer 133*a* may be located to be in direct contact with the second emission layer 133*b*.

In an embodiment, the first emission layer 133*a* and the second emission layer 133*b* may have different thicknesses from each other (see FIG. 2). Referring to FIG. 2, the thickness of the first emission layer 133*a* may be less than or equal to the thickness of the second emission layer 133*b*. The thickness of the first emission layer 133*a* may be greater than or equal to the thickness of the second emission layer 133*b*. For example, the thickness of the first emission layer 133*a* may be less than the thickness of the second emission layer 133*b*. In an embodiment, each of the first emission layer 133_a_ and the second emission layer 133_b_ may include a dopant, and satisfy at least one of Equations 2 and 3:

$$VHOD\_EML1 \text{ (at 10 mA/cm}^2\text{)} \leq VHOD\_EML1' \text{ (at 10 mA/cm}^2\text{)}+1.0 \quad \text{Equation 2}$$

$$VHOD\_EML2 \text{ (at 10 mA/cm}^2\text{)} \leq VHOD\_EML2' \text{ (at 10 mA/cm}^2\text{)}+1.0 \quad \text{Equation 3}$$

In Equations 2 and 3, VHOD_EML1 (at 10 mA/cm$^2$) and VHOD_EML2 (at 10 mA/cm$^2$) are the same as described above, VHOD_EML1' (at 10 mA/cm$^2$) is, as compared with VHOD_EML1 (at 10 mA/cm$^2$), a driving voltage value (V) when a current density of a first hole-only device not including a dopant in a first emission layer is 10 mA/cm$^2$, and VHOD_EML2' (at 10 mA/cm$^2$) is, as compared with VHOD_EML2 (at 10 mA/cm$^2$), a driving voltage value (V) when a current density of a second hole-only device not including a dopant in a second emission layer is 10 mA/cm$^2$.

In an embodiment, holes and electrons may be recombined at the interface between the first emission layer 133_a_ and the second emission layer 133_b_. In an embodiment, the first emission layer 133_a_ and the second emission layer 133_b_ may each independently include both a first compound, which is a hole transporting host, and a second compound, which is an electron transporting host, or a third compound, which is a bipolar host. In an embodiment, the first compound may include a donor nitrogen, and the second compound may include an acceptor nitrogen.

In an embodiment, the third compound may include both donor nitrogen

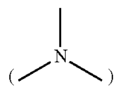

and acceptor nitrogen (–N═). In an embodiment, the first compound may be represented by Formula 1:

Formula 1

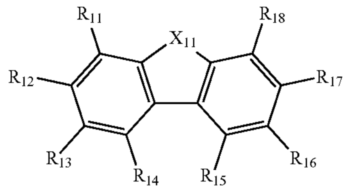

In Formula 1, $X_{11}$ may be selected from O, S, N($R_{19}$), and C($R_{19}$)($R_{20}$), $R_{11}$ to $R_{20}$ may each independently be selected from: a group represented by *-$(L_{11})_{a11}$-$A_{11}$, hydrogen, deuterium, a $C_1$-$C_{60}$ alkyl group, a π electron-deficient nitrogen-free cyclic group, —C($Q_1$)($Q_2$)($Q_3$), —Si($Q_1$)($Q_2$)($Q_3$), —B($Q_1$)($Q_2$), and —N($Q_1$)($Q_2$), wherein * indicates a binding site to a neighboring atom;

a π electron-deficient nitrogen-free cyclic group substituted with at least one selected from deuterium, a $C_1$-$C_{60}$ alkyl group, a π electron-deficient nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$); and a π electron-deficient nitrogen-free cyclic group substituted with a π electron-deficient nitrogen-free cyclic group substituted with at least one selected from deuterium, a $C_1$-$C_{60}$ alkyl group, a π electron-deficient nitrogen-free cyclic group, —C($Q_{21}$)($Q_{22}$)($Q_{23}$), —Si($Q_{21}$)($Q_{22}$)($Q_{23}$), —B($Q_{21}$)($Q_{22}$), and —N($Q_{21}$)($Q_{22}$), $L_{11}$ may be selected from: a π electron-deficient nitrogen-free cyclic group, —C($Q_1$)($Q_2$)—, —Si($Q_1$)($Q_2$)—, —B($Q_1$)—, and —N($Q_1$)—; and a π electron-deficient nitrogen-free cyclic group substituted with at least one selected from deuterium, a $C_1$-$C_{60}$ alkyl group, a π electron-deficient nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$), a11 may be selected from 1, 2, and 3, $A_{11}$ may be selected from: a π electron-deficient nitrogen-free cyclic group;

a π electron-deficient nitrogen-free cyclic group substituted with at least one selected from deuterium, a $C_1$-$C_{60}$ alkyl group, a π electron-deficient nitrogen-free cyclic group, C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$); and a π electron-deficient nitrogen-free cyclic group substituted with a π electron-deficient nitrogen-free cyclic group substituted with at least one selected from deuterium, a $C_1$-$C_{60}$ alkyl group, a π electron-deficient nitrogen-free cyclic group, —C($Q_{21}$)($Q_{22}$)($Q_{23}$), —Si($Q_{21}$)($Q_{22}$)($Q_{23}$), —B($Q_{21}$)($Q_{22}$), and —N($Q_{21}$)($Q_{22}$), and any two or more substituents among $R_{11}$ to $R_{20}$ may optionally be linked to each other to form one selected from: a π electron-deficient nitrogen-free cyclic group; and a π electron-deficient nitrogen-free cyclic group substituted with at least one selected from deuterium, a $C_1$-$C_{60}$ alkyl group, a π electron-deficient nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$), wherein $Q_1$ to $Q_3$, $Q_{21}$ to $Q_{23}$, and $Q_{31}$ to $Q_{33}$ may each independently be selected from: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

For example, at least one selected from $R_{11}$ to $R_{20}$ in Formula 1 may be a group represented by *-$(L_{11})_{a11}$-$A_{11}$.

For example, $R_{11}$ to $R_{20}$ in Formula 1 may each independently be selected from: a group represented by *-$(L_{11})_{a11}$-$A_{11}$, hydrogen, deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —C($Q_1$)($Q_2$)($Q_3$), —Si($Q_1$)($Q_2$)($Q_3$), —B($Q_1$)($Q_2$), and —N($Q_1$)($Q_2$);

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$), and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group that are each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —C($Q_{21}$)($Q_{22}$)($Q_{23}$), —Si($Q_{21}$)($Q_{22}$)($Q_{23}$), —B($Q_{21}$)($Q_{22}$), and —N($Q_{21}$)($Q_{22}$).

For example, $L_{11}$ in Formula 1 may be selected from: a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, a dibenzothiophene group, —C($Q_1$)($Q_2$)—, and —Si($Q_1$)($Q_2$)—; and a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —C($Q_{31}$)($Q_{32}$)($Q_{33}$), and —Si($Q_{31}$)($Q_{32}$)($Q_{33}$).

In an embodiment, $L_{11}$ in Formula 1 may be selected from: a benzene group, a fluorene group, a carbazole group, a dibenzofuran group, and a dibenzothiophene group, —C($Q_1$)($Q_2$)—, and —Si($Q_1$)($Q_2$)—; and a benzene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —C($Q_{31}$)($Q_{32}$)($Q_{33}$), and —Si($Q_{31}$)($Q_{32}$)($Q_{33}$).

For example, all in Formula 1 may be 1 or 2.

For example, $A_{11}$ in Formula 1 may be selected from: a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$); and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group that are each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$, wherein $Q_1$ to $Q_3$ and $Q_{31}$ to $Q_{33}$ may each independently be selected from: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $A_{11}$ in Formula 1 may be selected from: a phenyl group, a biphenyl group, a terphenyl group, a fluorenyl group, a carbazolyl group, a dibenzofuranyl group, and a dibenzothiophenyl group;

a phenyl group, a biphenyl group, a terphenyl group, a fluorenyl group, a carbazolyl group, a dibenzofuranyl group, and a dibenzothiophenyl group, each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$; and a phenyl group, a biphenyl group, a terphenyl group, a fluorenyl group, a carbazolyl group, a dibenzofuranyl group, and a dibenzothiophenyl group, each substituted with at least one selected from a phenyl group, a biphenyl group, a terphenyl group, a fluorenyl group, a carbazolyl group, a dibenzofuranyl group, and a dibenzothiophenyl group that are each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —$C(Q_{21})(Q_{22})(Q_{23})$, and —$Si(Q_{21})(Q_{22})(Q_{23})$.

In one or more embodiments, $A_{11}$ in Formula 1 may be represented by one of Formulae 8-1 to 8-5:

8-1

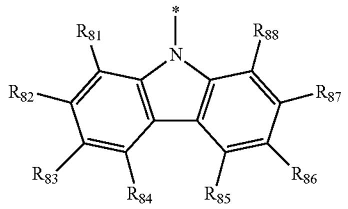

8-2

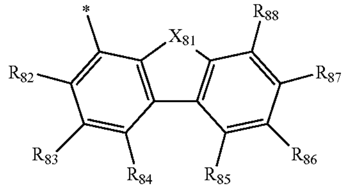

-continued 8-3

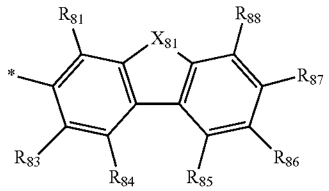

8-4

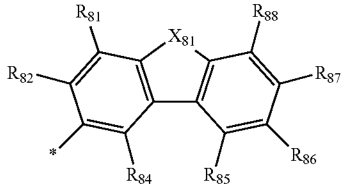

8-5

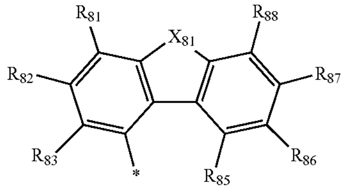

In Formulae 8-1 to 8-5, $X_{81}$ may be selected from O, S, $N(R_{89})$, and $C(R_{89})(R_{90})$, $R_{81}$ to $R_{90}$ may each independently be selected from hydrogen, deuterium, a $C_1$-$C_{20}$ alkyl group, a phenyl group, a biphenyl group, a terphenyl group, a fluorenyl group, a carbazolyl group, a dibenzofuranyl group, and a dibenzothiophenyl group, and

* indicates a binding site to a neighboring atom.

In an embodiment, the first compound may be represented by one of Formulae 1-1 to 1-15:

1-1

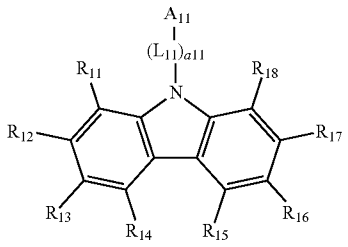

1-2

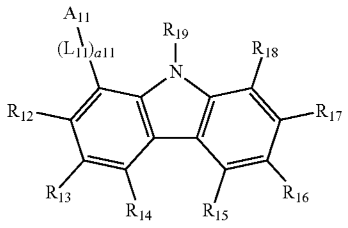

1-3

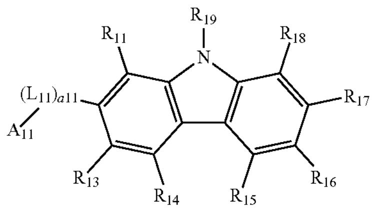

-continued
1-4
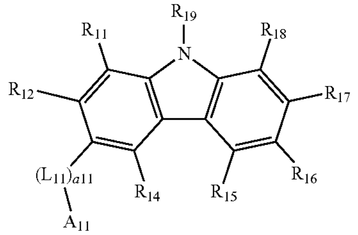
1-5
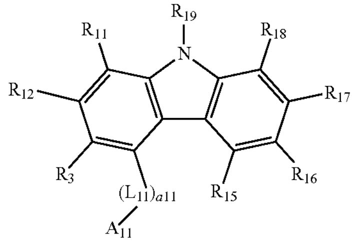
1-6
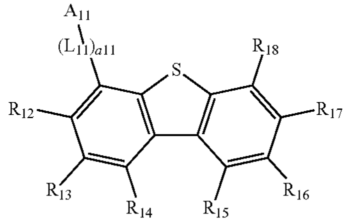
1-7
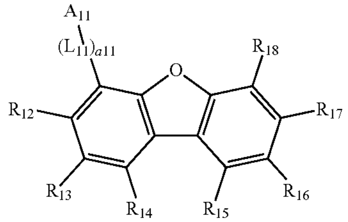
1-8
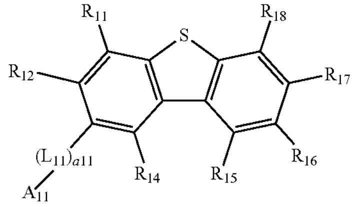
1-9
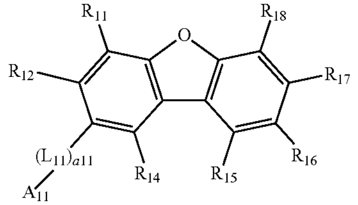
1-10
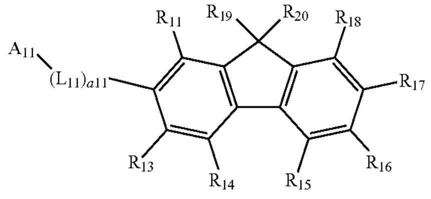
-continued
1-11
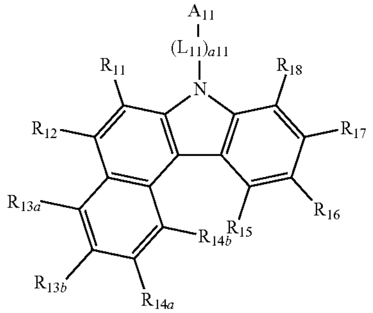
1-12
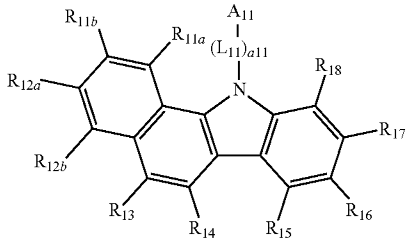
1-13
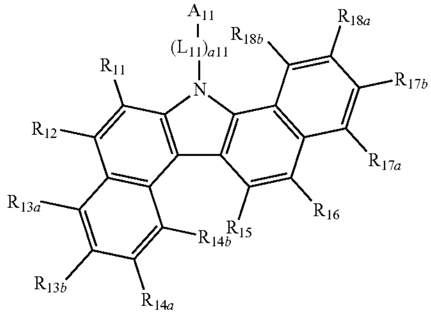
1-14
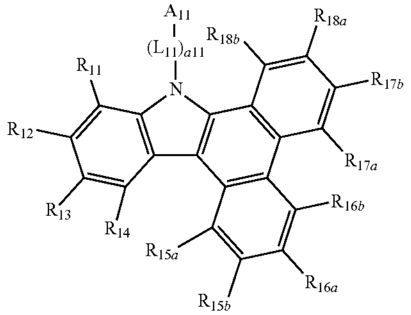
1-15
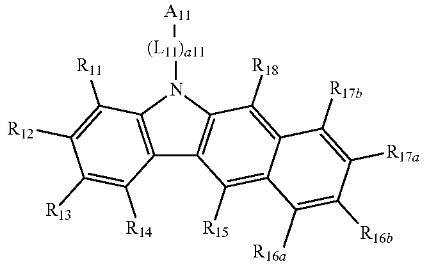
In Formulae 1-1 to 1-15,
$L_{11}$, a11, $A_{11}$, and $R_{11}$ to $R_{20}$ are each the same as defined in Formula 1, and
$R_{11a}R_{11b}$, $R_{12a}$, $R_{12b}$, $R_{13a}$, $R_{13b}$, $R_{14a}$, $R_{14b}$, $R_{15a}$, $R_{15b}$, $R_{16a}$, $R_{16b}$, $R_{17a}$, $R_{17b}$, $R_{18a}$, and $R_{18b}$ are the same as defined in connection with $R_{11}$ to $R_{20}$ in Formula 1.

In an embodiment, the second compound may be represented by Formula 2:

Formula 2

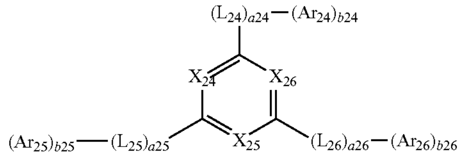

In Formula 2, $X_{24}$ may be $C(R_{24})$ or N, $X_{25}$ may be $C(R_{25})$ or N, and $X_{26}$ may be $C(R_{26})$ or N, at least one selected from $X_{24}$ to $X_{26}$ may be N, $R_{24}$ to $R_{26}$, independently from one another, may be selected from $-(L_{27})_{a27}-(Ar_{27})_{b27}$, hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, $L_{24}$ to $L_{27}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Ar_{24}$ to $Ar_{27}$ may each independently be selected from a group represented by Formula 2, a $C_3$-$C_{60}$ carbocyclic group unsubstituted or substituted with at least one $R_{10a}$, and a $C_1$-$C_{60}$ heterocyclic group unsubstituted or substituted with at least one $R_{10a}$, a24 to a27 may each independently be an integer from 0 to 3, b24 to b27 may each independently be an integer from 1 to 8, two or more neighboring groups of $Ar_{24}$ to $Ar_{27}$ and $R_{24}$ to $R_{26}$ may optionally be linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,

* indicates a binding site to a neighboring atom, and $Q_1$ to $Q_3$ may each independently be selected from: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the third compound may be represented by Formula 3:

Formula 3

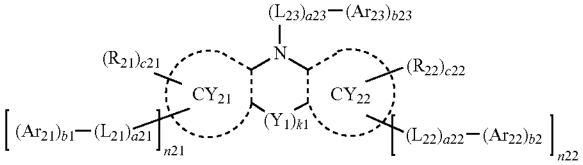

Formula 3A

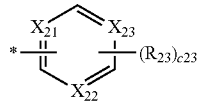

In Formula 3, $Y_1$ may be selected from a single bond, —O—, —S—, $—C(R_{27})(R_{28})—$, $—N(R_{27})—$, $Si(R_{27})(R_{28})—$, $—C(=O)—$, $—S(=O)_2—$, $—B(R_{27})—$, $—P(R_{27})—$, and $—P(=O)(R_{27})(R_{28})—$, k1 may be 0 or 1, $CY_{21}$ and $CY_{22}$ may each independently be a $C_3$-$C_{60}$ carbocyclic group or a $C_1$-$C_{60}$ heterocyclic group, $L_{21}$ to $L_{23}$ and $L_{28}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Ar_{21}$ to $Ar_{23}$ and $Ar_{28}$ may each independently be selected from a group represented by Formula 3A, a $C_3$-$C_{60}$ carbocyclic group unsubstituted or substituted with at least one $R_{10a}$, and a $C_1$-$C_{60}$ heterocyclic group unsubstituted or substituted with at least one $R_{10a}$, at least one of $Ar_{21}$ to $Ar_{23}$ may be a group represented by Formula 3A, a21 to a23 and a28 may each independently be an integer from 0 to 3, b21 to b23 and b28 may each independently be an integer from 1 to 8, c21 and c22 may each independently be an integer from 1 to 20, c23 is an integer from 0 to 5, n21 and n22 may each independently be an integer from 1 to 8, $X_{21}$ to $X_{23}$ may each independently be C or N, when each of $X_{21}$ to $X_{23}$ is C, at least one selected from $R_{21}$ to $R_{23}$ may be: —F; a cyano group; or a $C_1$-$C_{60}$ alkyl group substituted with at least one selected from —F and a cyano group, $R_{21}$ to $R_{23}$, $R_{27}$ and $R_{28}$ may each independently be selected from $-(L_{28})_{a28}-(Ar_{28})_{b28}$, hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, $—P(=O)(Q_1)(Q_2)$, two or more neighboring groups of $Ar_{21}$ to $Ar_{23}$, $Ar_{28}$, $R_{21}$ to $R_{23}$, and $R_{28}$ may optionally be linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,

* indicates a binding site to a neighboring atom, and $Q_1$ to $Q_3$ may each independently be selected from: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $CY_{21}$ and $CY_{22}$ in Formula 3 may each independently be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an benzoisothiazole group, a benzoxazole group, an benzoisoxazole group, a triazole group, a tetrazole group, an oxadiazole group, a triazine group, a thiadiazole group, an imidazopyridine group, an imidazopyrimidine group, an azafluorene group, and an azacarbazole group.

In an embodiment, $CY_{21}$ and $CY_{22}$ in Formula 3 may each independently be selected from a benzene group, a naphthalene group, a fluorene group, a carbazole group, a pyridine group, a phenanthroline group, an azafluorene group, and an azacarbazole group.

In an embodiment, $L_{21}$ to $L_{28}$ in Formulae 2 and 3 may each independently be selected from: a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an benzoisothiazolylene group, a benzoxazolylene group, an benzoisoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an benzoisothiazolylene group, a benzoxazolylene group, an benzoisoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, an azacarbazolyl group, —$Si(Q_{31})(Q_{32})(Q_{33})$, —$N(Q_{31})(Q_{32})$, —$B(Q_{31})(Q_{32})$, —$C({=}O)(Q_{31})$, —$S({=}O)_2(Q_{31})$, and —$P({=}O)(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a phenyl group substituted with a $C_1$-$C_{10}$ alkyl group, a biphenyl group, a terphenyl group, and a naphthyl group.

In an embodiment, $Ar_{21}$ to $Ar_{28}$ in Formulae 2 and 3 may each independently be a group represented by one selected from Formulae 5-1 to 5-26 and 6-1 to 6-55, and wherein at least one selected from $Ar_{21}$ to $Ar_{23}$ may be a group represented by one selected from Formulae 6-1 to 6-55:

5-1

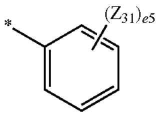

5-2

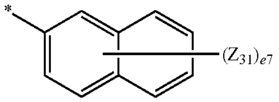

5-3

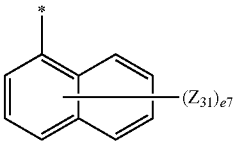

5-4

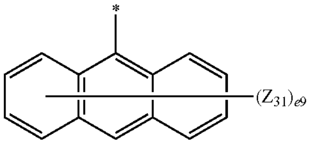

5-5

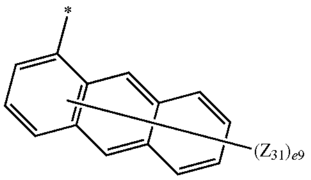

5-6

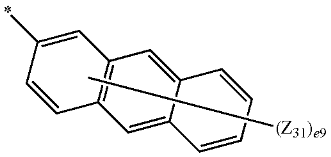

5-7

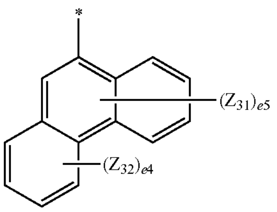

-continued 5-8

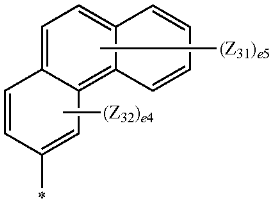

5-9

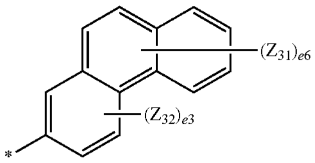

5-10

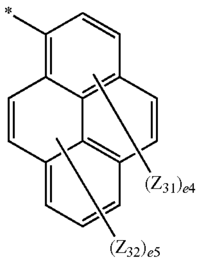

5-11

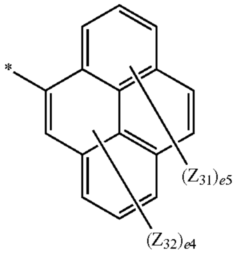

5-12

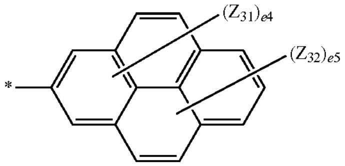

5-13

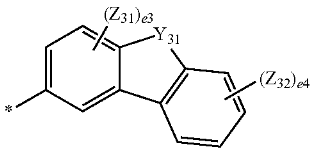

5-14

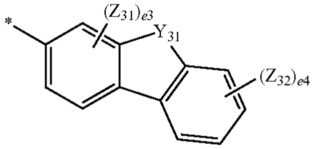

5-15

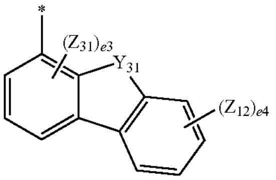

-continued
5-16
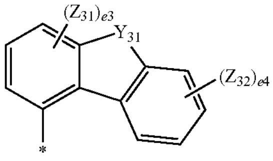
5-17
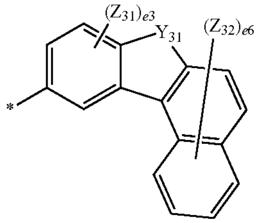
5-18
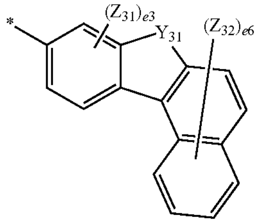
5-19
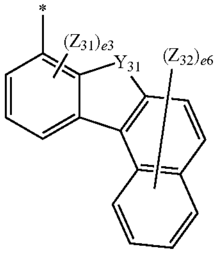
5-20
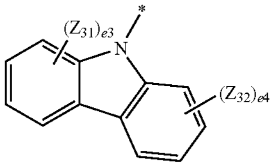
5-21
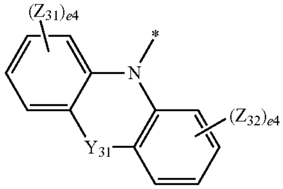
5-22
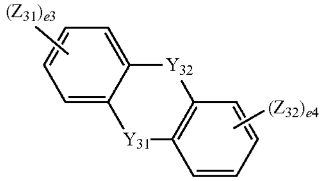
-continued
5-23
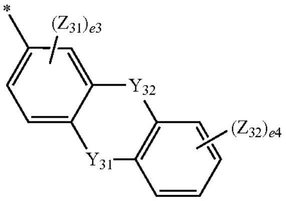
5-24
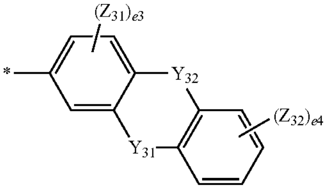
5-25
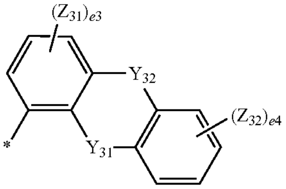
5-26
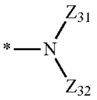
6-1
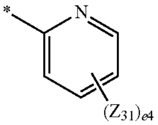
6-2
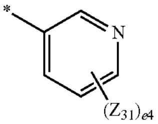
6-3
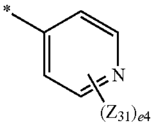
6-4
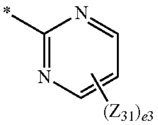
6-5
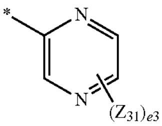
6-6
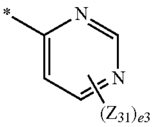

-continued
6-7
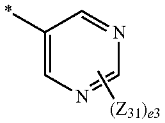
6-8
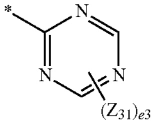
6-9
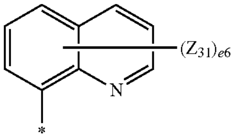
6-10
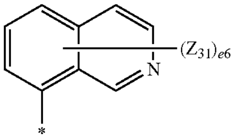
6-11
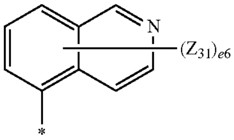
6-12
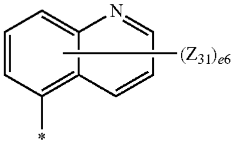
6-13
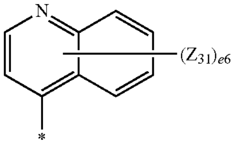
6-14
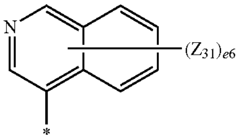
6-15
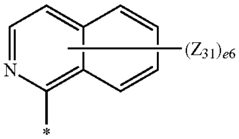
6-16
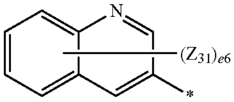
6-17
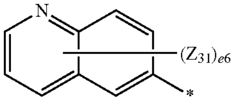
-continued
6-18
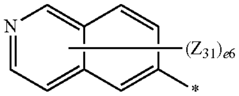
6-19
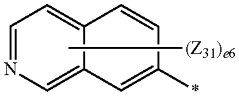
6-20
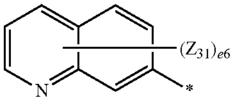
6-21
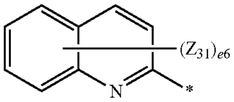
6-22
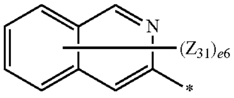
6-23
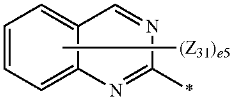
6-24
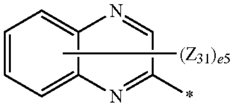
6-25
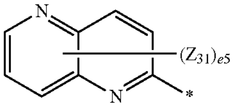
6-26
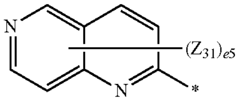
6-27
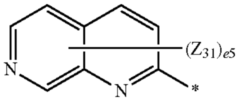
6-28
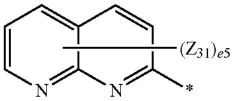
6-29
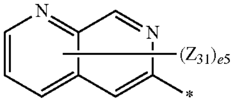
6-30
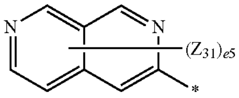
6-31
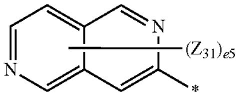

-continued
6-32
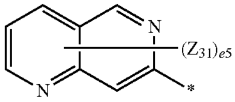
6-33
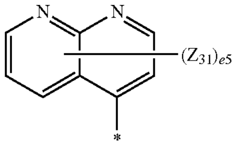
6-34
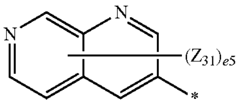
6-35
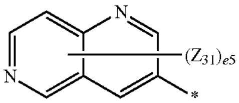
6-36
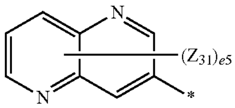
6-37
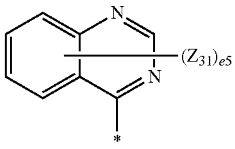
6-38
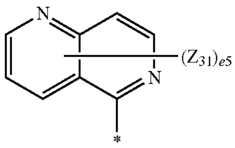
6-39
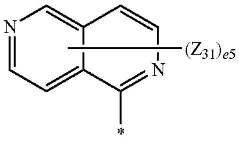
6-40
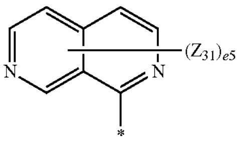
6-41
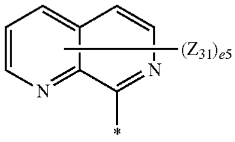
6-42
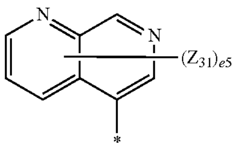
-continued
6-43
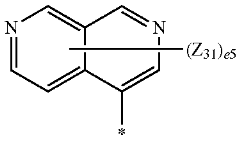
6-44
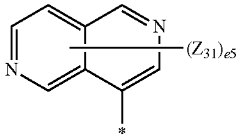
6-45
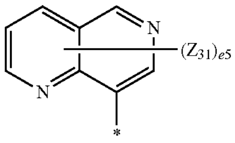
6-46
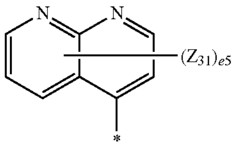
6-47
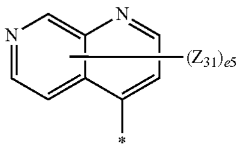
6-48
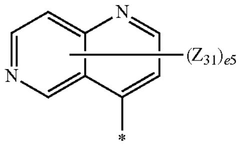
6-49
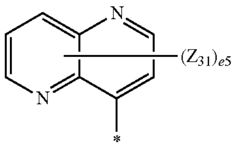
6-50
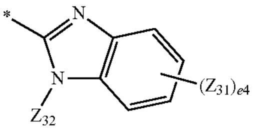
6-51
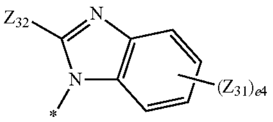
6-52
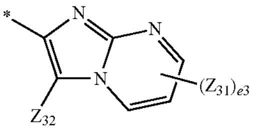
6-53
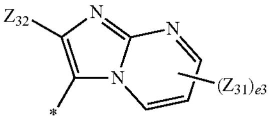

-continued

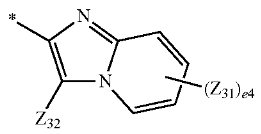

6-54

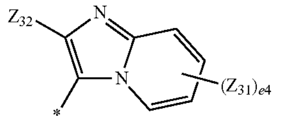

6-55

In Formulae 5-1 to 5-26 and 6-1 to 6-55, $Y_{31}$ and $Y_{32}$ may each independently be O, S, $C(Z_{34})(Z_{35})$, $N(Z_{34})$, or $Si(Z_{34})(Z_{35})$, $Z_{31}$, $Z_{32}$, $Z_{34}$ and $Z_{35}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkenyl group, a $C_1$-$C_{20}$ alkynyl group, a $C_1$-$C_{20}$ alkoxy group, a phenyl group, a biphenyl group, a terphenyl group, a naphthyl group, a fluorenyl group, a spiro-bifluorenyl group, a phenanthrenyl group, an anthracenyl group, a triperylenyl group, a pyridinyl group, a pyrimidinyl group, a carbazolyl group, and a triazinyl group, e2 may be 1 or 2, e3 may be an integer from 1 to 3, e4 may be an integer from 1 to 4, e5 may be an integer from 1 to 5, e6 may be an integer from 1 to 6, e7 may be an integer from 1 to 7, e9 may be an integer from 1 to 9, and

* indicates a binding site to a neighboring atom.

In an embodiment, $R_{21}$ to $R_{28}$ in Formulae 2 and 3 may each independently be selected from: $*-(L_{27})_{a27}-(Ar_{27})_{b27}$, hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, and a terphenyl group; and a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, and a terphenyl group, each substituted with at least one selected from deuterium, —F, —Cl, —Br, —I, a hydroxyl group, a cyano group, a nitro group, an amidino group, a hydrazino group, a hydrazono group, a $C_1$-Calkyl group, a $C_1$-$C_{20}$ alkoxy group, a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, and a terphenyl group.

In an embodiment, the first emission layer 133*a* may include a first dopant, the second emission layer 133*b* may include a second dopant, and the first dopant and the second dopant may be different from each other.

In an embodiment, the first dopant and the second dopant may be represented by Formula 4:

$$M_{31}(L_{31})_{n31}(L_{32})_{n32}$$ Formula 4

Formula 4A

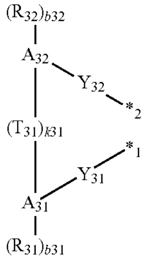

Formula 4B

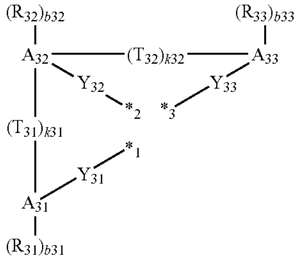

Formula 4C

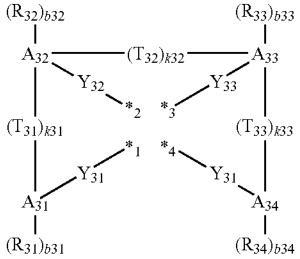

Formula 4D

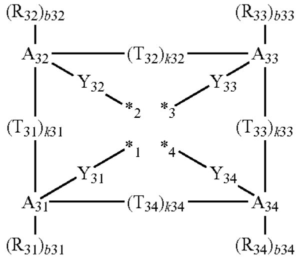

In Formulae 4 and 4A to 4D, $M_{31}$ may be selected from a first-row transition metal of the Periodic Table of Elements, a second-row transition metal of the Periodic Table of Elements, and a third-row transition metal of the Periodic Table of Elements, $L_{31}$ may be a ligand represented by one of Formulae 4A to 4D, $L_{32}$ may be selected from a monodentate ligand, a bidentate ligand, and a tridentate ligand, n31 may be selected from 1 and 2, n32 may be selected from 0, 1, 2, 3, and 4, $A_{31}$ to $A_{34}$ may each independently be selected from a $C_5$-$C_{30}$ carbocyclic group and a $C_1$-$C_{30}$ heterocyclic group, $T_{31}$ to $T_{34}$ may each independently be selected from a single bond, a double bond, *—O—*', *—S—*', *—C(=O)—*', *—S(=O)—*', *—C($R_{35}$)($R_{36}$)—*', *—C($R_{35}$)=C($R_{36}$)—*', *—C($R_{35}$)=*', *—Si($R_{35}$)($R_{36}$)—*', *—B($R_{35}$)—*', *—N($R_{35}$)—*', and *—P($R_{35}$)—*', k31 to k34 may each independently be selected from 1, 2, and 3, $Y_{31}$ to $Y_{34}$ may each independently be selected from a single bond, *—O—*', *—S—*', *—C($R_{37}$)($R_{38}$)—*', *—Si($R_{37}$)($R_{38}$)—*', *—B($R_{37}$)—*', *—N($R_{37}$)—*', and *—P($R_{37}$)—*', and *' each indicate a binding site to a neighboring atom; 1, *2, *3, and *4 each indicate a binding site to $M_{31}$, $R_{31}$ to $R_{38}$ may each independently be selected from hydrogen, deuterium, —F, —Cl, —Br, —I, a hydroxyl group, a cyano group, a nitro group, an amino group, an amidino group, a hydrazino group, a hydrazono groups carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), and $R_{31}$ to $R_{38}$ may optionally be linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, b31 to b34 may each independently be an integer from 0 to 10, and $Q_1$ to $Q_3$ may each independently be selected from: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $M_{31}$ in Formula 4 may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm). In one or more embodiments, $M_{31}$ in Formula 4 may be selected from Pt and Ir.

In an embodiment, $A_{31}$ to $A_{34}$ in Formulae 4A to 4D may each independently be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other, wherein the first ring may be selected from a cyclopentane group, a cyclopentene group, a cyclopentadiene group, a furan group, a thiophene group, a pyrrole group, a borole group, a phosphole group, a silole group, a germole group, a selenophene group, an oxazole group, a dihydroxazole group, an isoxazole group, a dihydroisoxazole group, an oxadiazole group, a dihydroxaddiazole group, an isozadiazole group, a dihydroisozadiazole group, an oxatriazole group, a dihydroxatriazole group, an isoxatriazole group, a dihydroisoxatriazole group, a thiazole group, a dihydrothiazole group, an isothiazole group, a dihydroisothiazole group, a thiadiazole group, a dihydrothiadiazole group, an isothiadiazole group, a dihydroisothiadiazole group, a thiatriazole group, a dihydrothiatriazole group, an isothiatriazole group, a dihydroisothiatriazole group, a pyrazole group, a dihydropyrazole group, an imidazole group, a dihydroimidazole group, a triazole group, a dihydrotriazole group, a tetrazole group, a dihydrotetrazole group, an azasilole group, a diazasilole group, and a triazasilole group, and the second ring may be selected from a cyclohexane group, a cyclohexene group, a cyclohexadiene group, an admantane group, a norbornane group, a norbornene group, a benzene group, a pyridine group, a dihydropyridine group, a tetrahydropyridine group, a pyrimidine group, a dihydropyrimidine group, a tetrahydropyrimidine group, a pyrazine group, a dihydropyrazine group, a tetrahydropyrazine group, a pyridazine group, a dihydropyridazine group, a tetrahydropyridazine group, and a triazine group.

In one or more embodiments, $A_{31}$ to $A_{34}$ in Formulae 4A to 4D may each independently be selected from a benzene group, a naphthalene group, an anthracene group, a phenanthrene group, a triphenylene group, a pyrene group, a chrysene group, a furan group, a thiophene group, a silole group, an indene group, a fluorene group, a benzofuran group, a dibenzofuran group, a benzothiophene group, a dibenzothiophene group, a benzosilole group, a dibenzosilole group, an indole group, a carbazole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a pyridine group, a pyrimidine group, a pyrazine group, a pyridazine group, a triazine group, a quinoline group, an isoquinoline group, a quinoxaline group, a quinazoline group, a cinnoline group, a phthalazine group, a phenanthroline group, a pyrrole group, a pyrazole group, an imidazole group, a dihydroimidazole group, a triazole group, a dihydrotriazole group, an oxazole group, a dihydroxazole group, an isoxazole group, a thiazole group, a dihydrothiazole group, an isothiazole group, an oxadiazole group, a dihydroxaddiazole group, a thiadiazole group, a dihydrothiadiazole group, a benzopyrazole group, a benzimidazole group, a dihydrobenzimidazole group, an imidazopyridine group, an imidazopyrimidine group, an imidazopyrazine group, a benzoxazole group, a dihydrobenzoxazole group, a benzothiazole group, a dihydrobenzothiazole group, a benzoxadiazole group, a dihydrobenzoxadiazole group, a benzothiadiazole group, and a dihydrobenzothiadiazole group.

In an embodiment, $T_{31}$ to $T_{34}$ in Formulae 4A to 4D may each independently be selected from a single bond, a double bond, *—O—*', *—S—*', *—C($R_{35}$)($R_{36}$)—*', and *—N($R_{35}$)—*'.

In an embodiment, $Y_{31}$ to $Y_{34}$ in Formulae 4A to 4D may each independently be selected from a single bond, *—O—*', and *—S—*'.

In an embodiment, $R_{31}$ to $R_{38}$ in Formulae 4A to 4D may each independently be selected from: hydrogen, deuterium, —F, —Cl, —Br, —I, a cyano group, a $C_1$-$C_{20}$ alkyl group, and a $C_1$-$C_{20}$ alkoxy group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, —F, —Cl, —Br, —I, a cyano group, a $C_1$-$C_{20}$ alkyl group, a $C_1$-$C_{20}$ alkoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group; and —$B(Q_1)(Q_2)$ and —$N(Q_1)(Q_2)$, and $Q_1$ and $Q_2$ may each independently be selected from: hydrogen, deuterium, and a $C_1$-$C_{20}$ alkyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

In one or more embodiments, $R_{31}$ to $R_{38}$ in Formulae 4A to 4D may each independently be selected from: hydrogen, deuterium, —F, —Cl, —Br, —I, a cyano group, a methyl group, an ethyl group, an n-propyl group, an isopropyl group, an n-butyl group, an isobutyl group, a sec-butyl group, a tert-butyl group, a methoxy group, an ethoxy group, a propoxy group, and butoxy group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group, each substituted with at least one selected from deuterium, —F, —Cl, —Br, —I, a cyano group, a methyl group, an ethyl group, an n-propyl group, an isopropyl group, an n-butyl group, an isobutyl group, a sec-butyl group, a tert-butyl group, a methoxy group, an ethoxy group, a propoxy group, a butoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group; and —$B(Q_1)(Q_2)$ and —$N(Q_1)(Q_2)$, and $Q_1$ and $Q_2$ may each independently be selected from: hydrogen, deuterium, a methyl group, an ethyl group, an n-propyl group, an isopropyl group, an n-butyl group, an isobutyl group, a sec-butyl group, and a tert-butyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group, each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group.

In an embodiment, the first dopant and the second dopant may each independently be represented by one of Formulae 4-1 and 4-2:

Formula 4-1

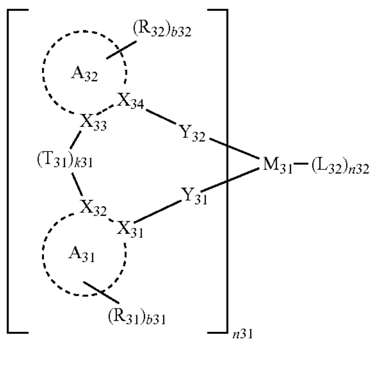

-continued

Formula 4-2

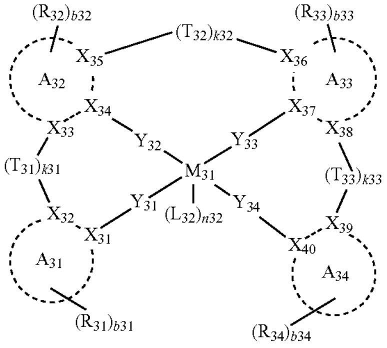

In Formulae 4-1 and 4-2, $X_{31}$ to $X_{40}$ may each independently be selected from N and C, and $M_{31}$, $L_{32}$, n31, n32, $A_{31}$ to $A_{34}$, $T_{31}$ to $T_{33}$, k31 to k33, $Y_{31}$ to $Y_{34}$, $R_{31}$ to $R_{38}$, and b31 to b34 are the same as described above.

In Formulae 4-1 and 4-2, $X_{31}$ and $X_{32}$ may each independently be a ring member of $A_{31}$, and $X_{33}$ to $X_{40}$ may be also understood by referring to descriptions provided in connection with Formulae 4-1 and 4-2, $X_{31}$, and $X_{32}$.

In an embodiment, the first dopant may be represented by Formula 4-2, $M_{31}$ may be Pt, and n32 may be 0, and the second dopant may be represented by Formula 4-1, $M_{31}$ may be Ir, and the sum of n31 and n32 may be 3.

In an embodiment, in the first dopant, at least one of $A_{31}$ to $A_{34}$ may be a pyridine group. In an embodiment, the first compound may be selected from compounds of Group I, the second compound and the third compound may each be selected from compounds of from Group II, the first dopant may be selected from compounds of Group III, and the second dopant may be selected from compounds of Group IV:

Group I

A-1

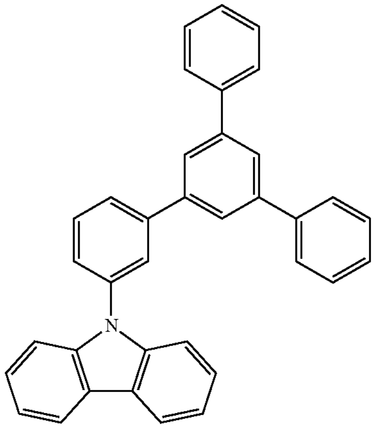

-continued

A-2

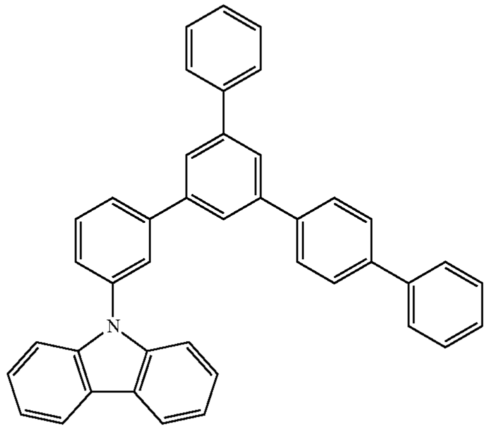

A-3

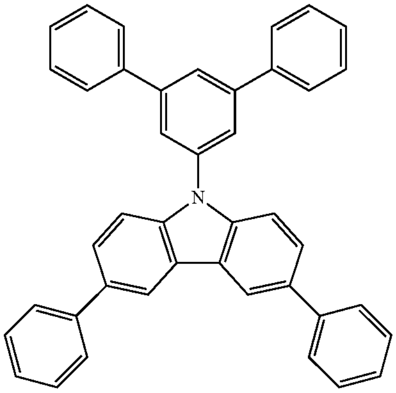

A-4

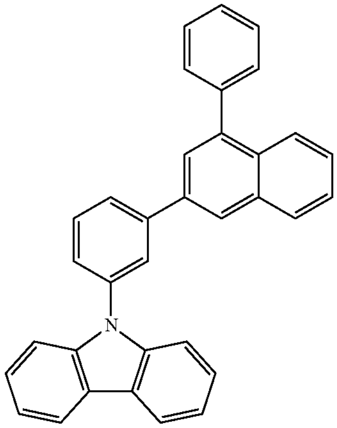

-continued
A-5
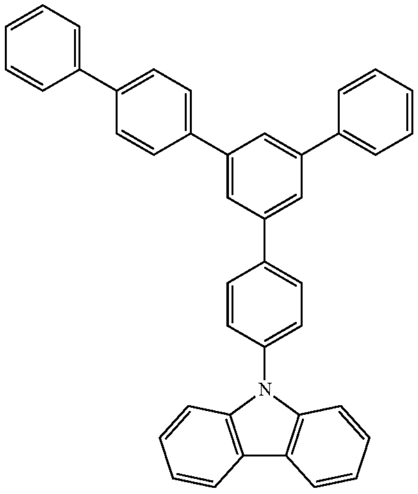
A-6
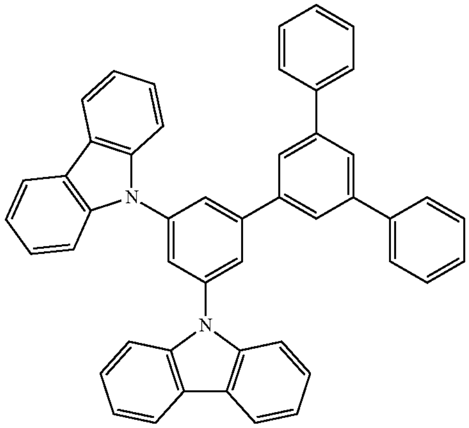
A-7
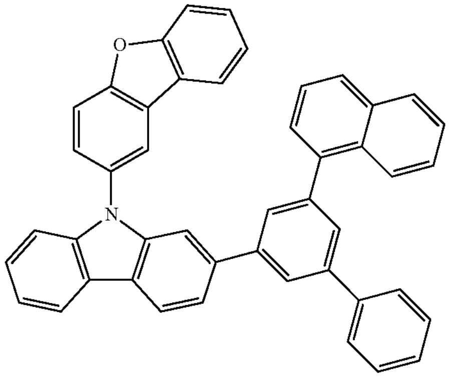
-continued
A-8
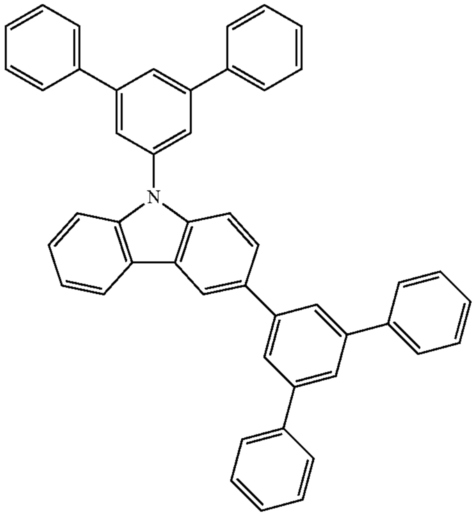
A-9
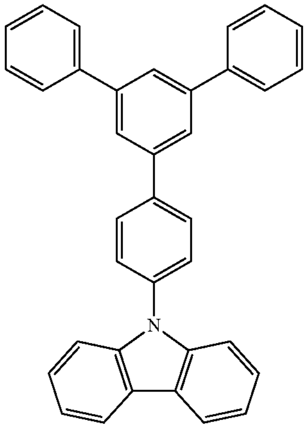
A-10
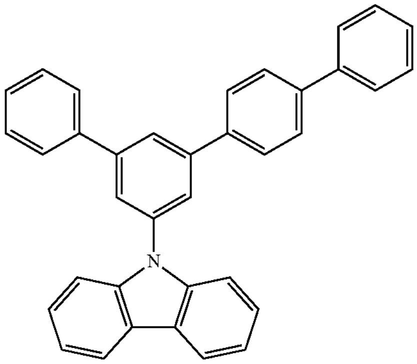

-continued
A-11
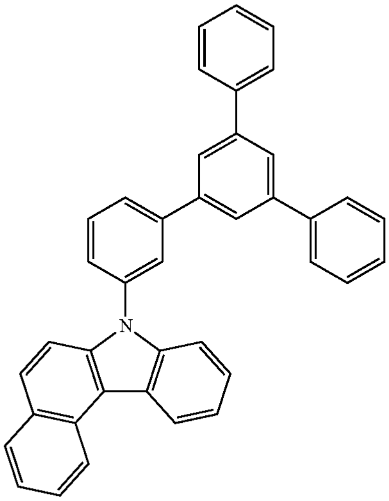
A-12
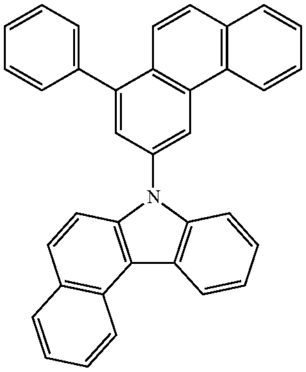
A-13
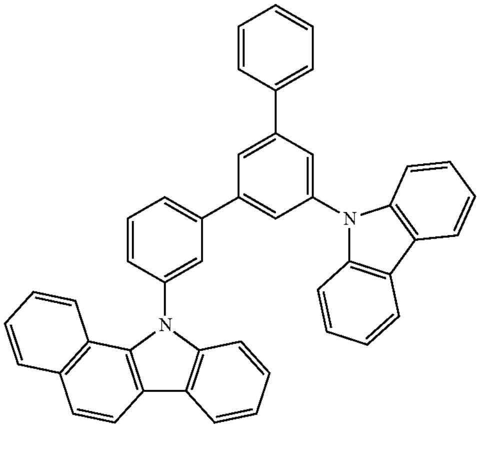
-continued
A-14
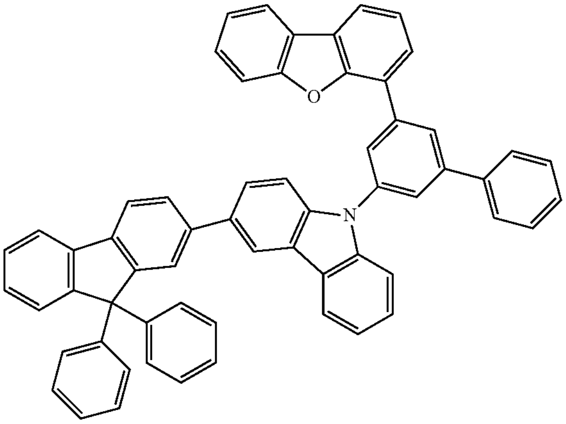
A-15
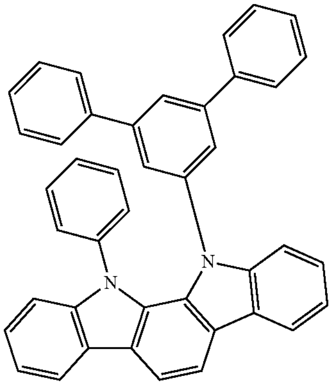
A-16
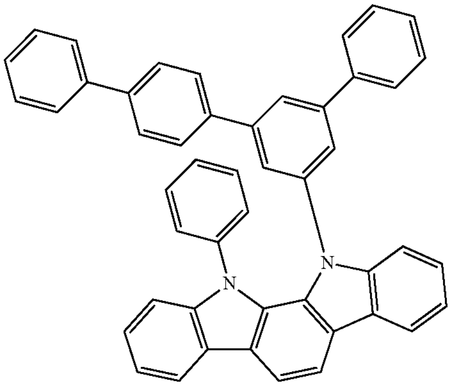
A-17
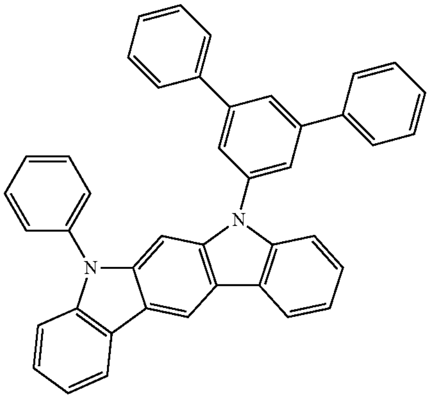

-continued
A-18
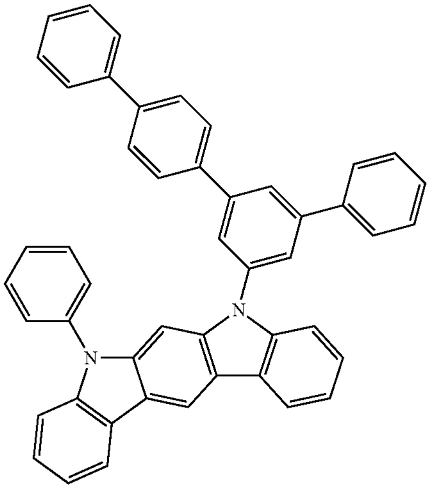
A-19
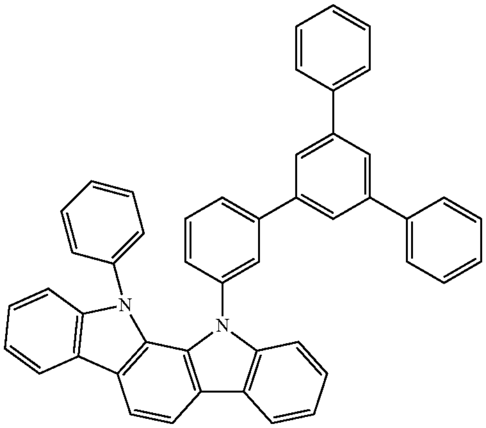
A-20
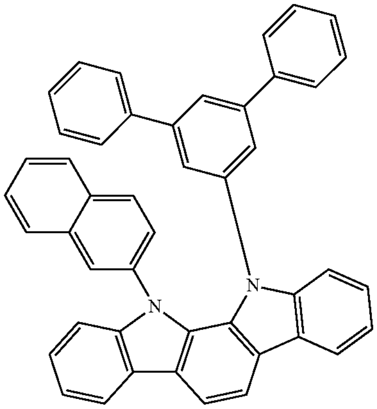
-continued
A-21
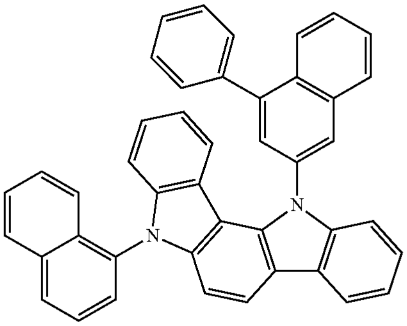
A-22
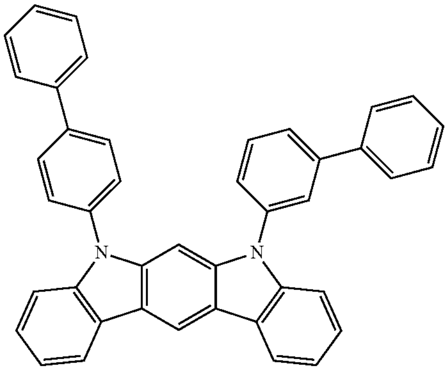
A-23
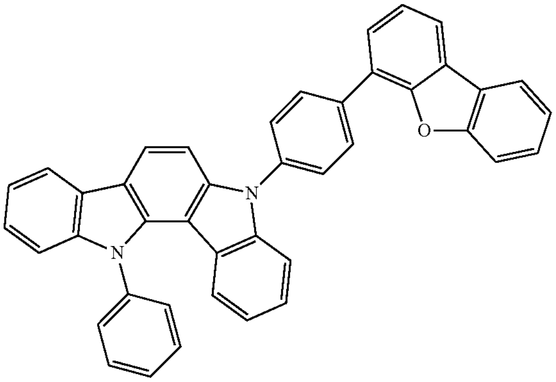
A-24
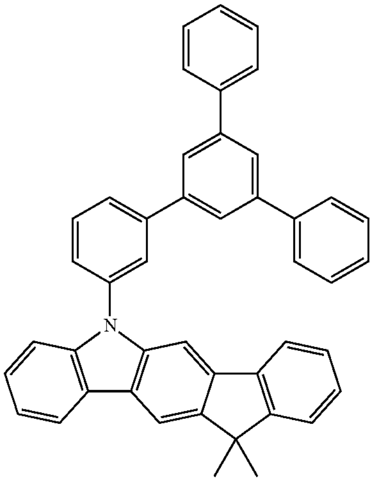

A-25
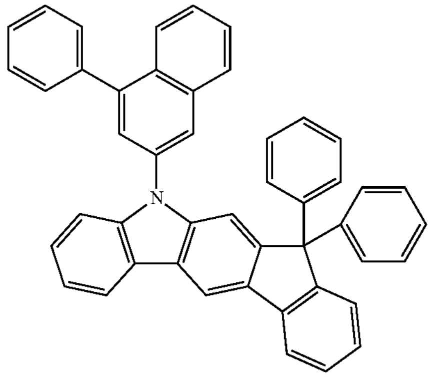
A-26
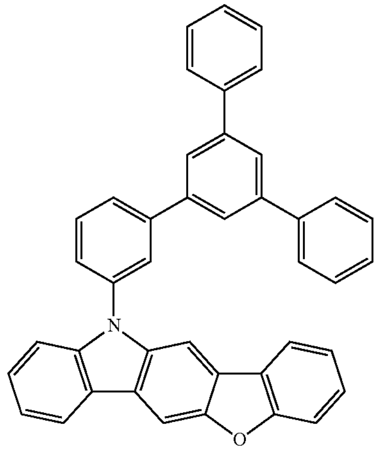
A-27
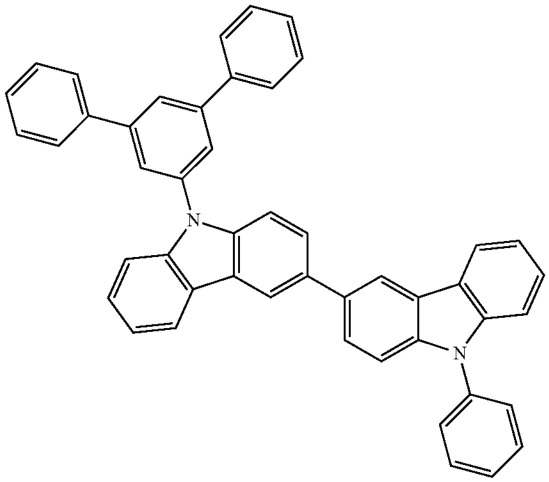
A-28
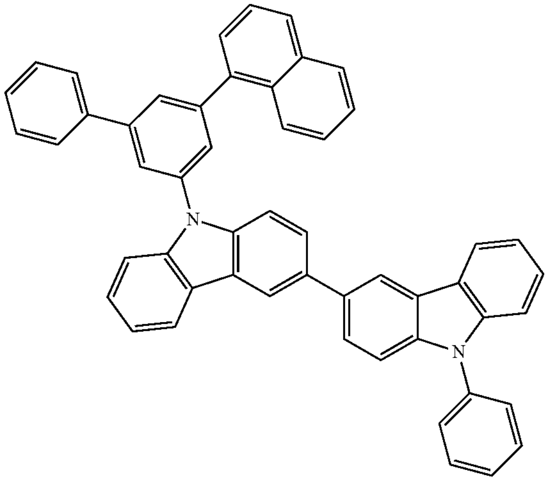
A-29
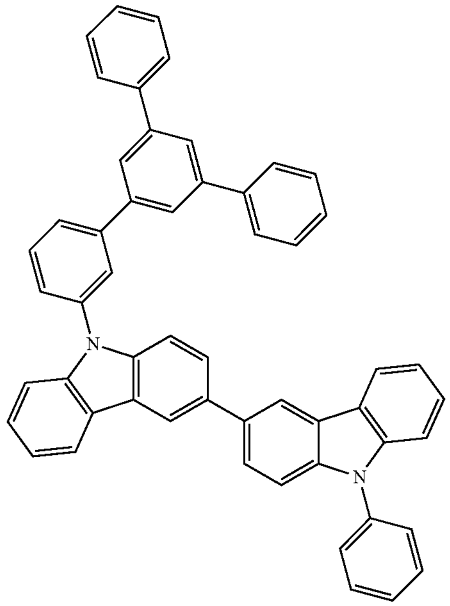
A-30
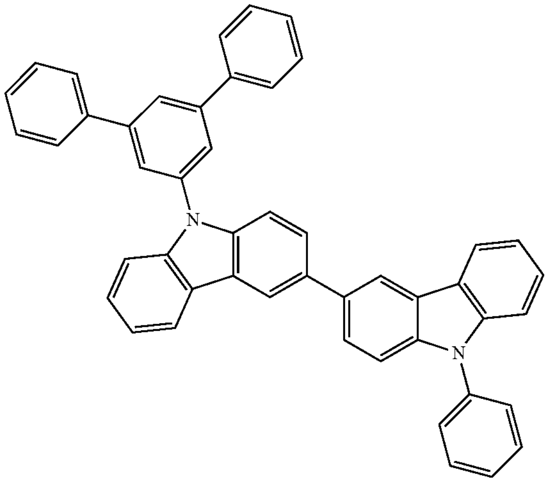

-continued
A-31
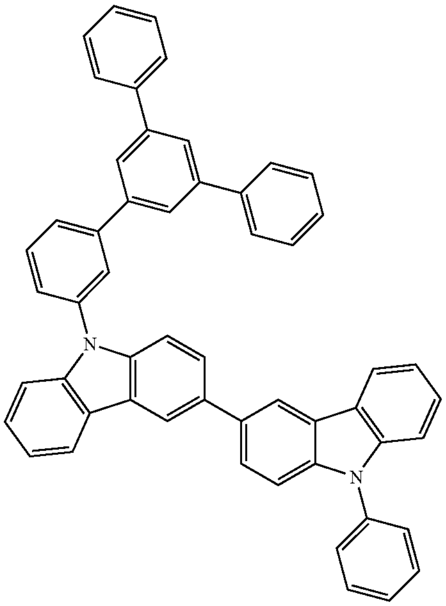
A-32
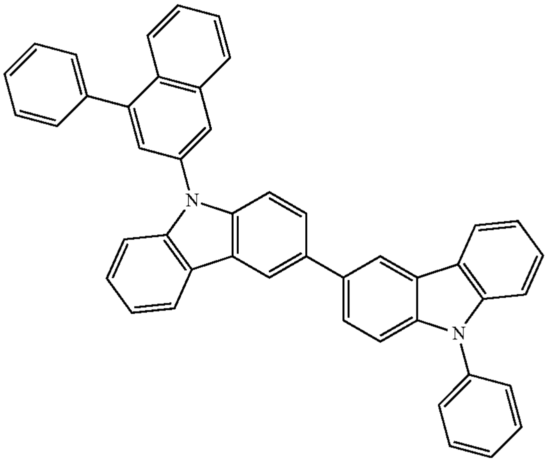
A-33
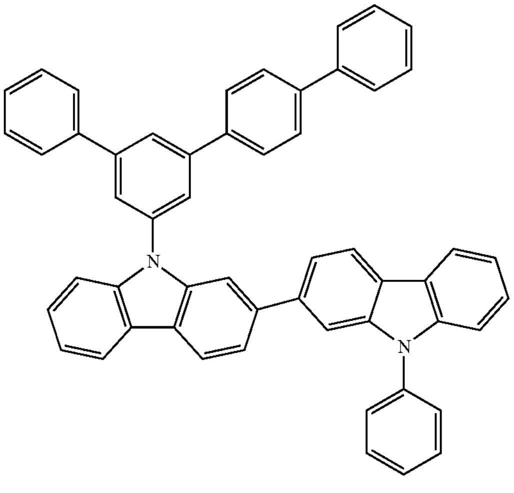
-continued
A-34
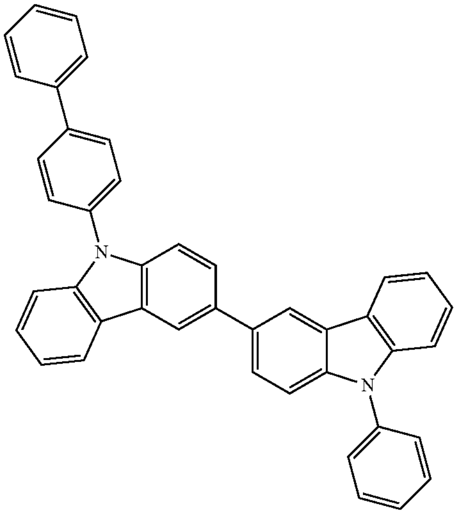
A-35
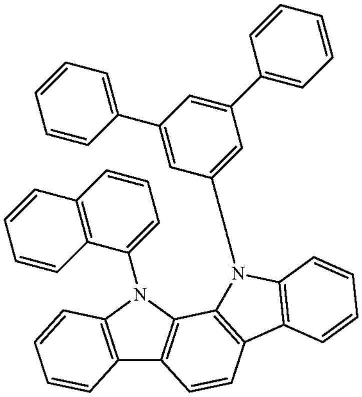
Group II
C-1
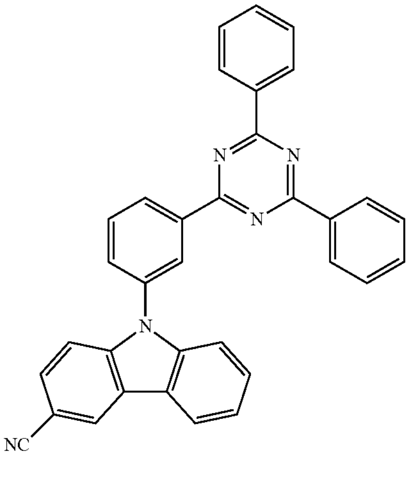

-continued
C-2
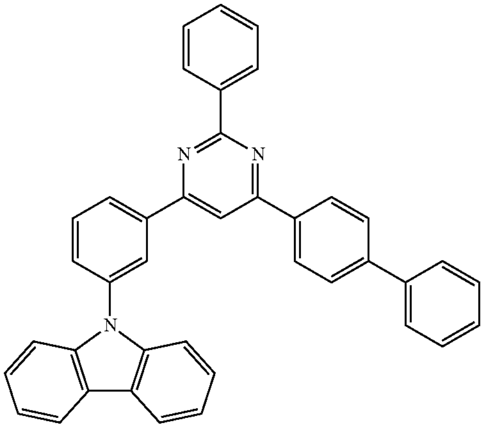
C-3
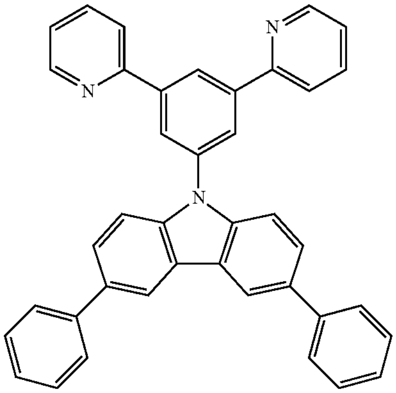
C-4
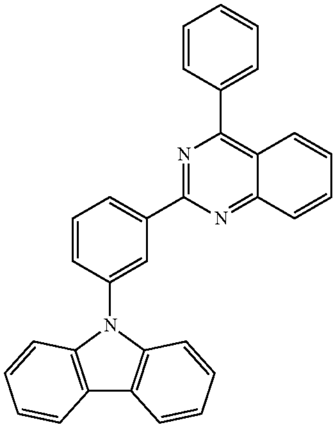
-continued
C-5
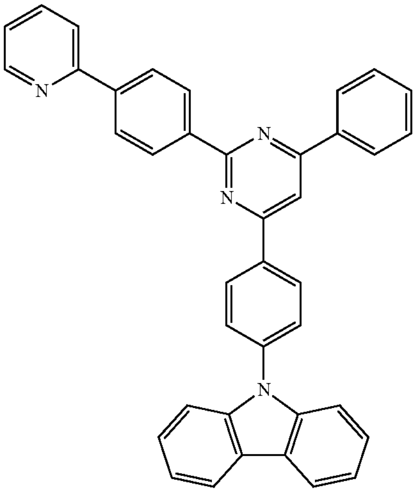
C-6
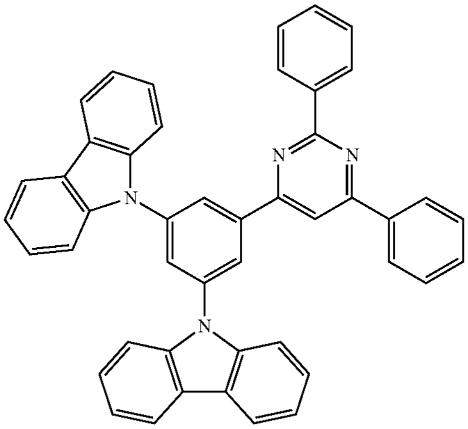
C-7
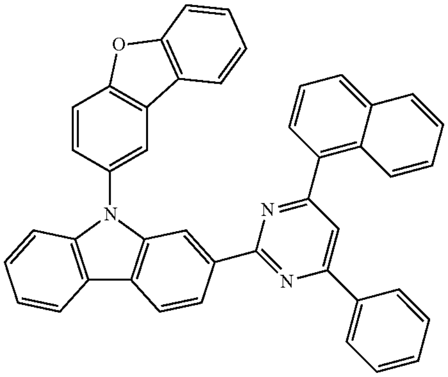

-continued
C-8
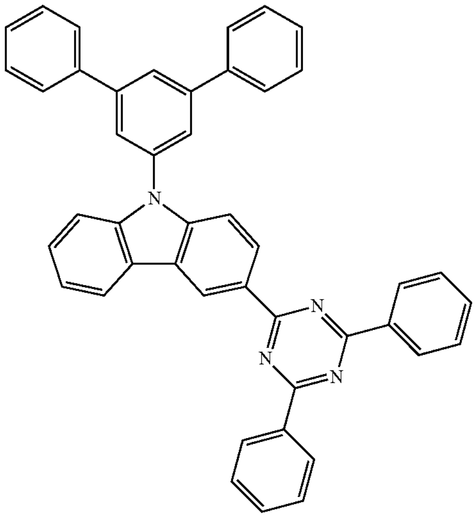
C-9
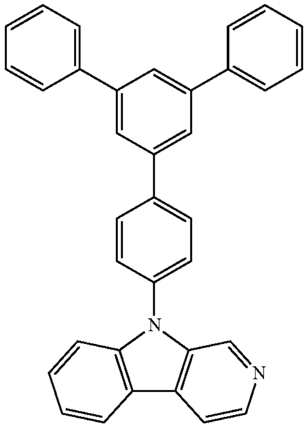
C-10
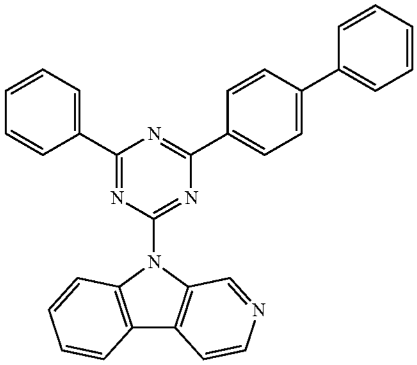
-continued
C-11
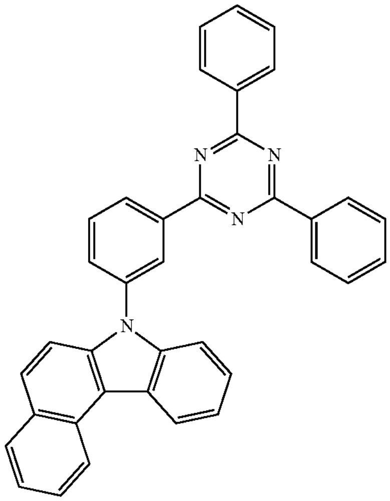
C-12
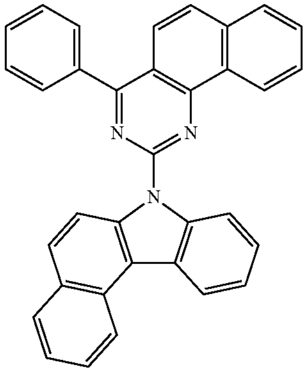
C-13
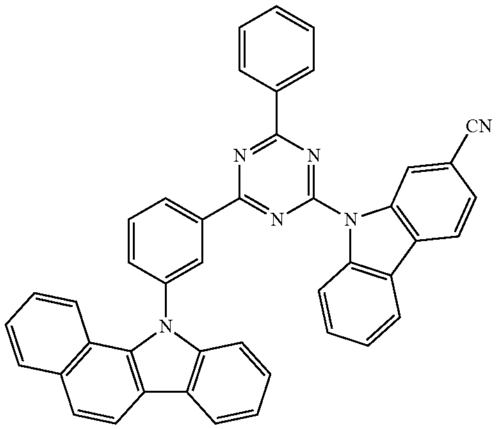

-continued
C-14
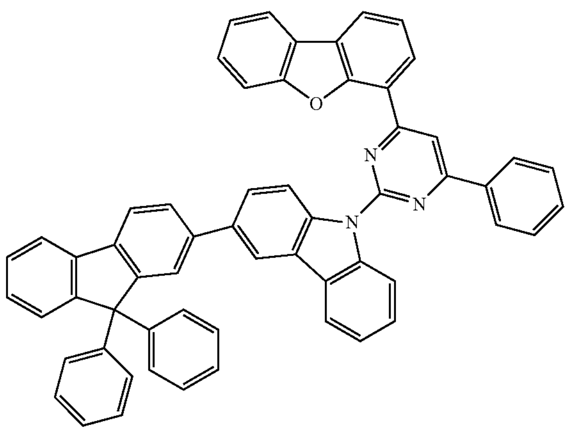
C-15
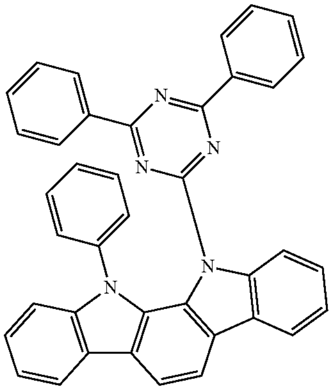
C-16
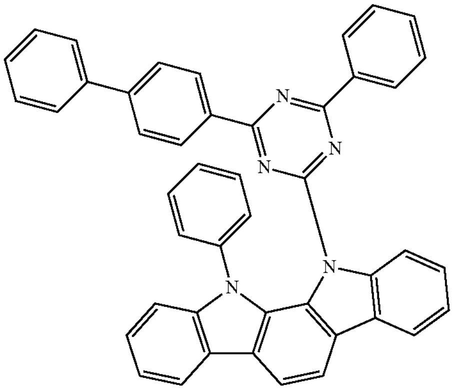
C-17
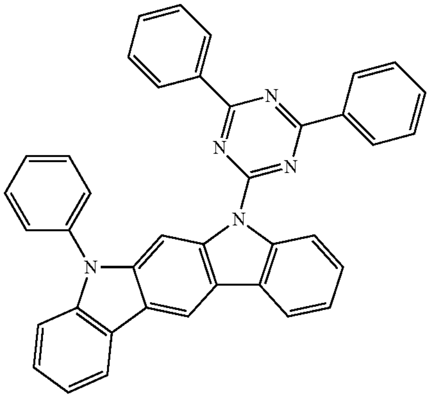
-continued
C-18
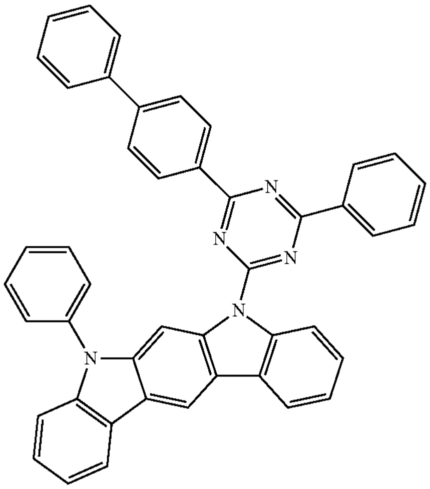
C-19
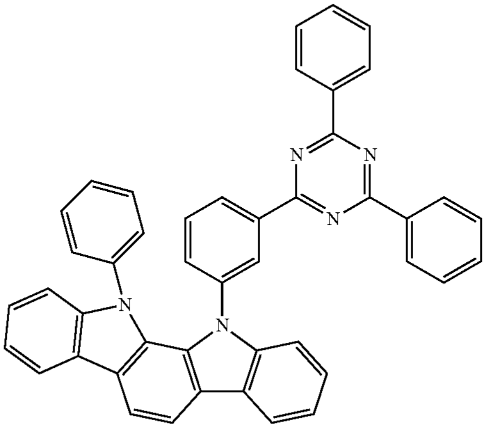
C-20
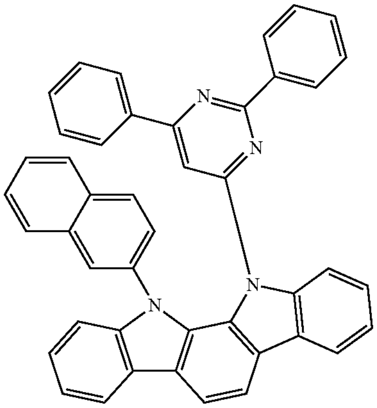

-continued
C-21
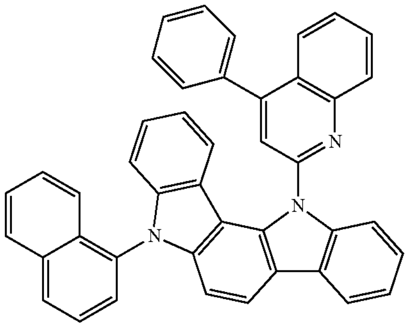
C-22
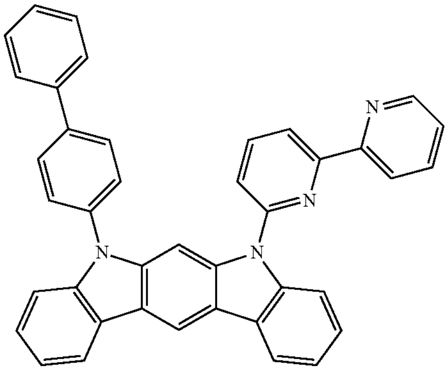
C-23
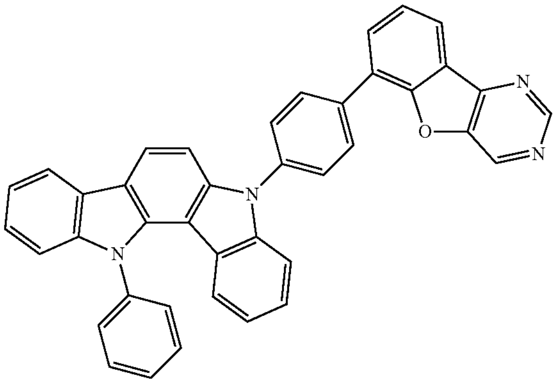
C-24
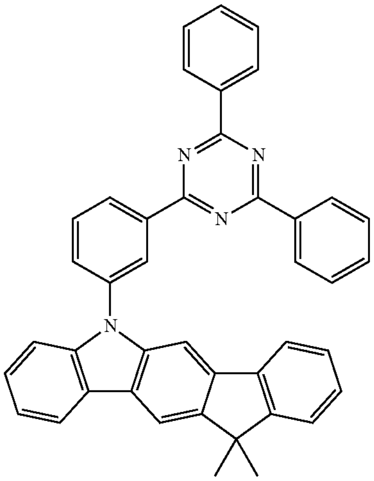
-continued
C-25
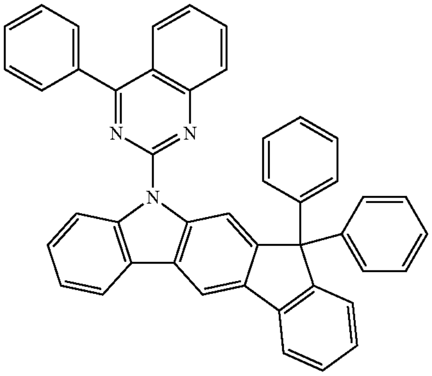
C-26
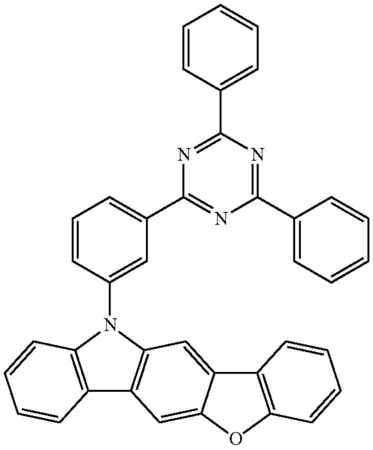
C-27
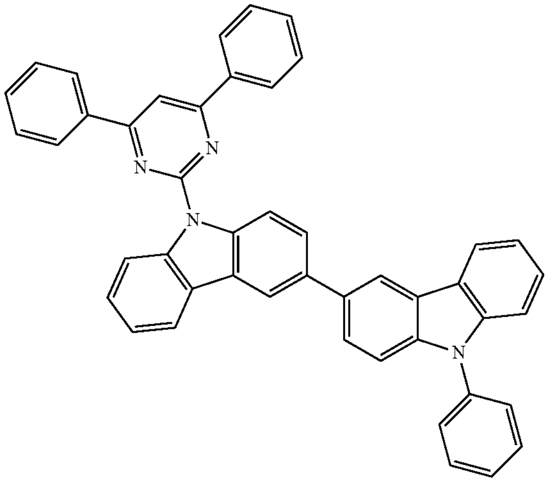

-continued
C-28
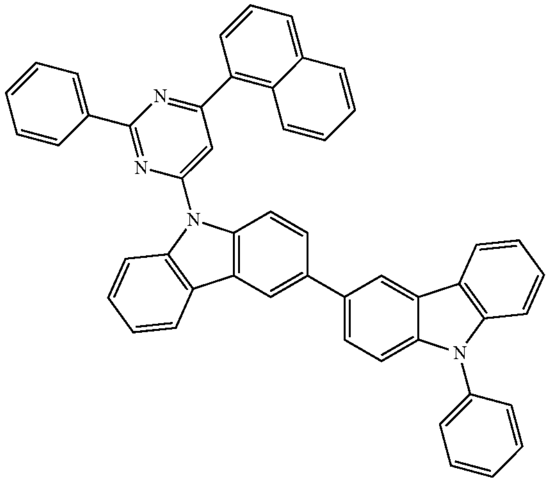
C-29
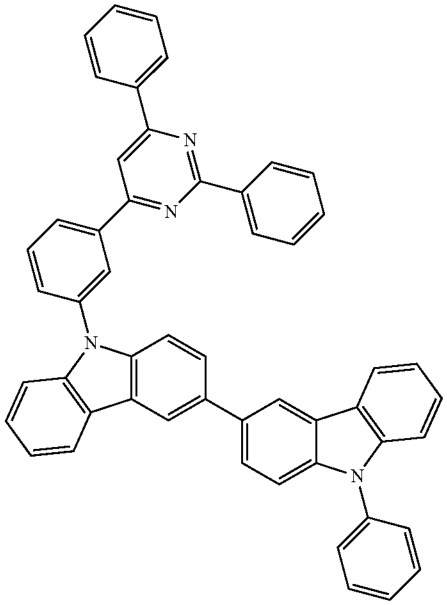
C-30
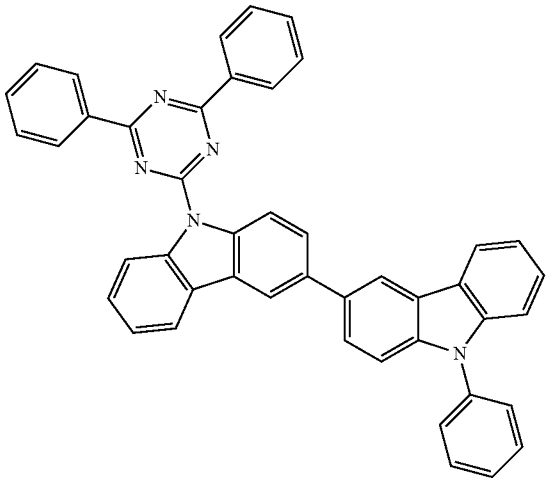
-continued
C-31
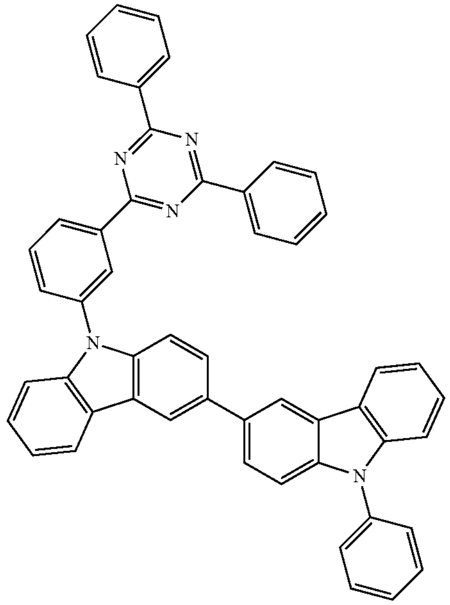
C-32
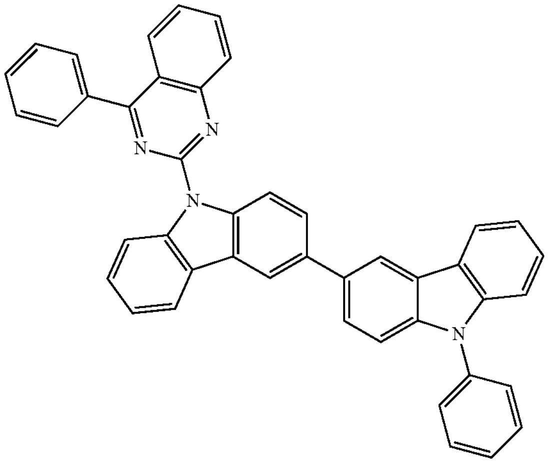
C-33
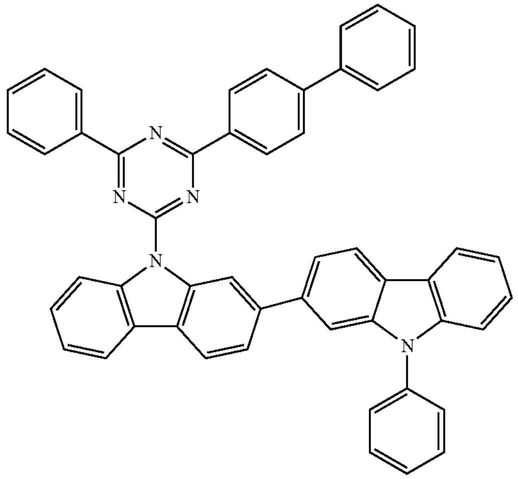

-continued
C-34
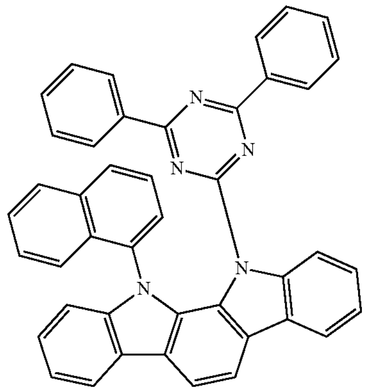
Group III
PD1
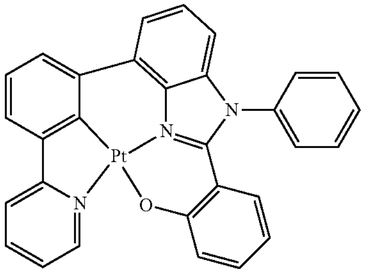
PD2
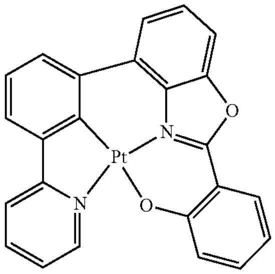
PD3
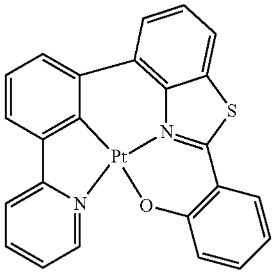
PD4
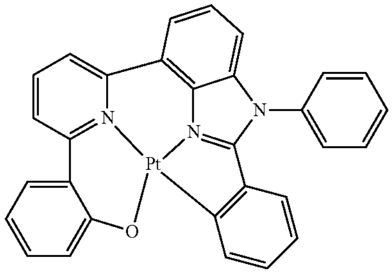
-continued
PD5
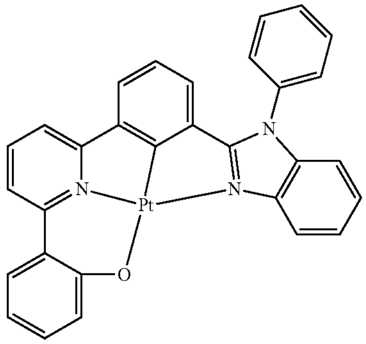
PD6
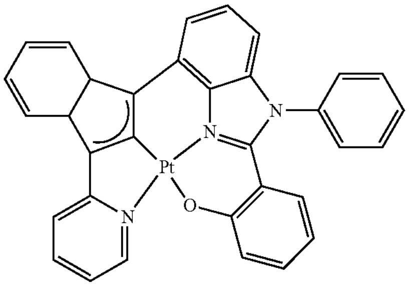
PD7
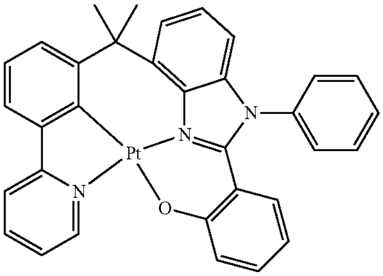
PD8
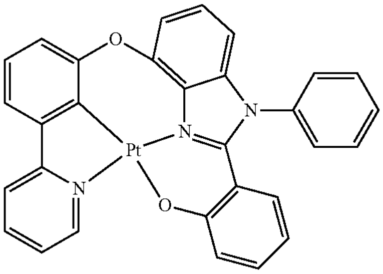
PD9
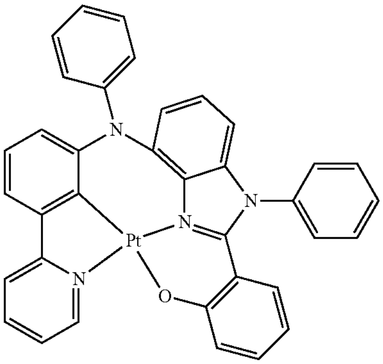

-continued
PD10
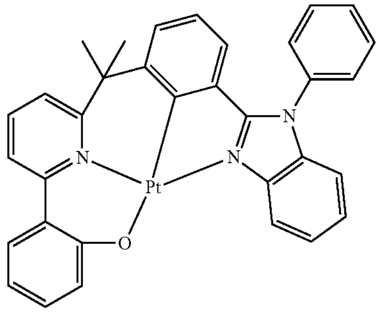
PD11
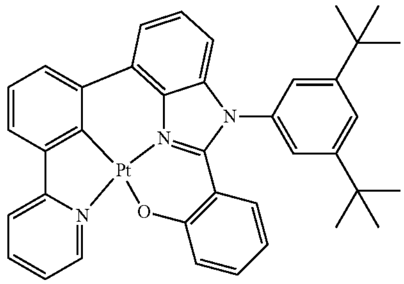
PD12
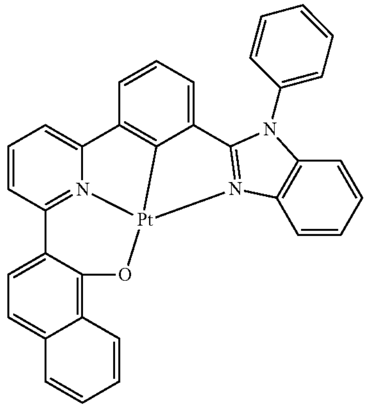
PD13
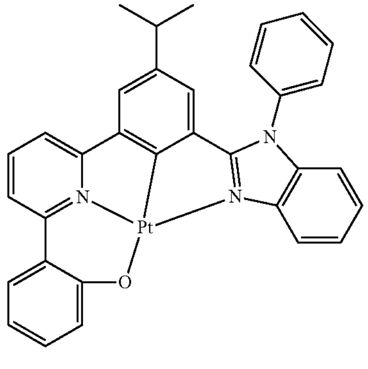
PD14
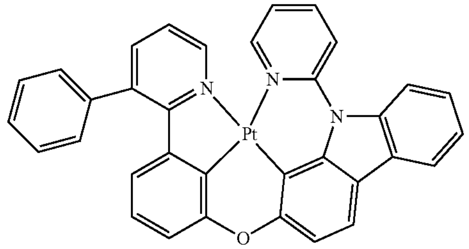
-continued
PD15
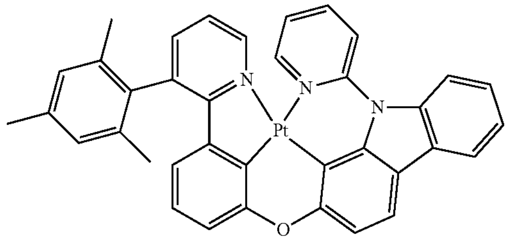
PD16
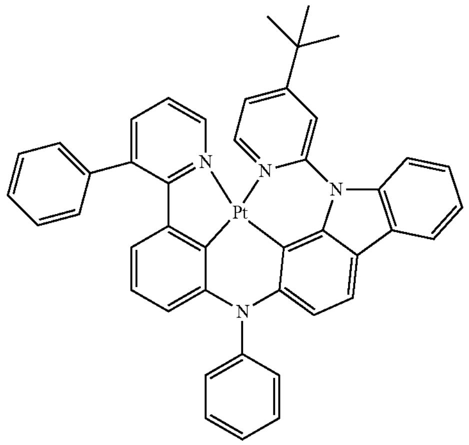
PD17
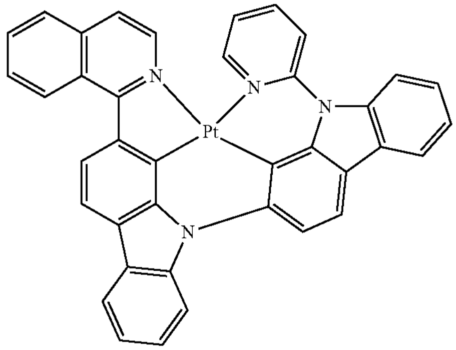
Group IV
ID1
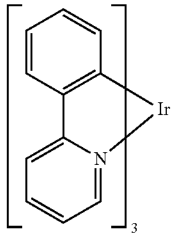

ID2
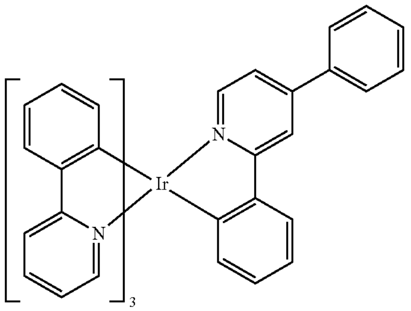
ID3
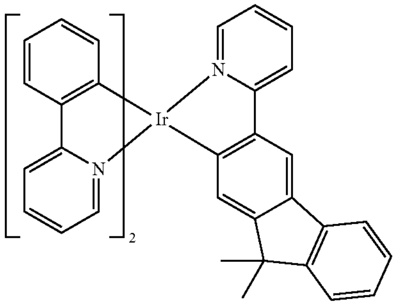
ID4
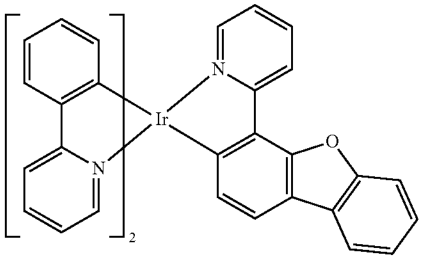
ID5
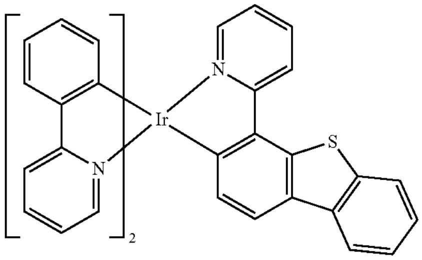
ID6
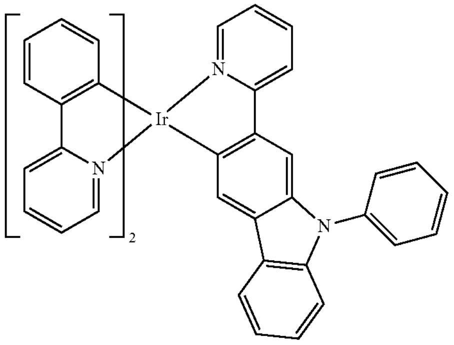
ID7
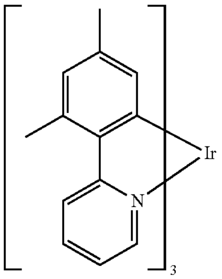
ID8
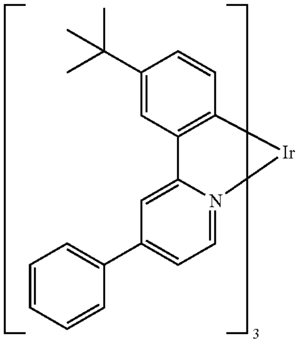
ID9
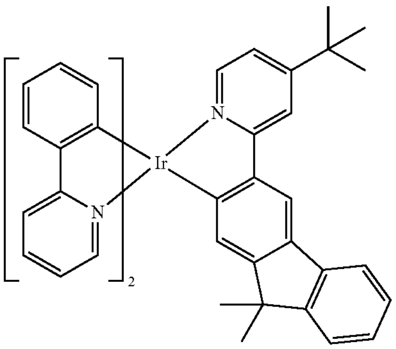
ID10
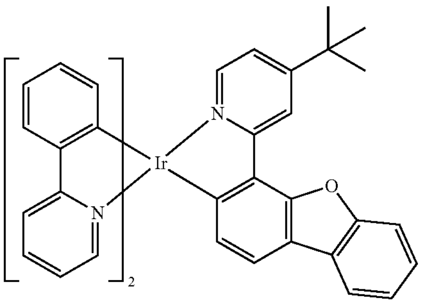
ID11
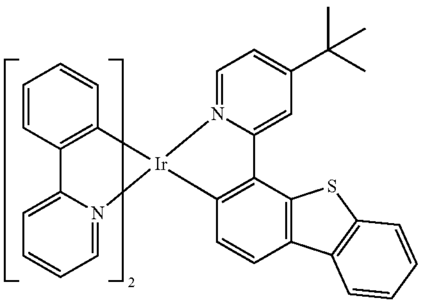

-continued

ID12

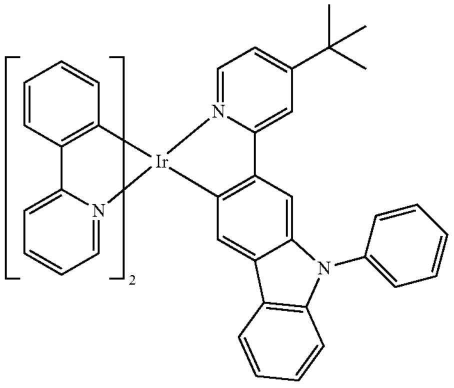

ID13

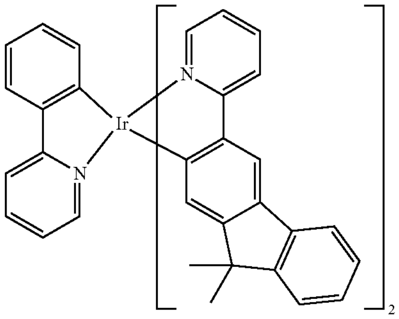

ID14

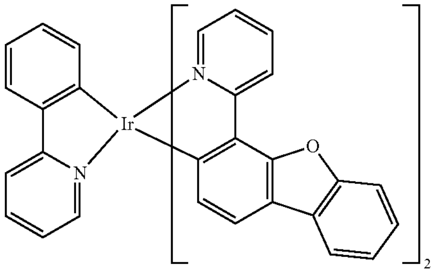

ID15

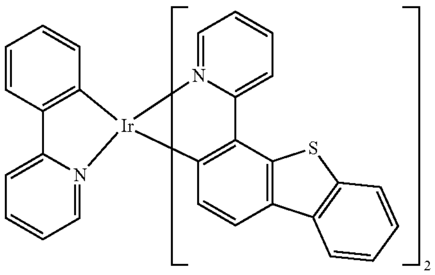

ID16

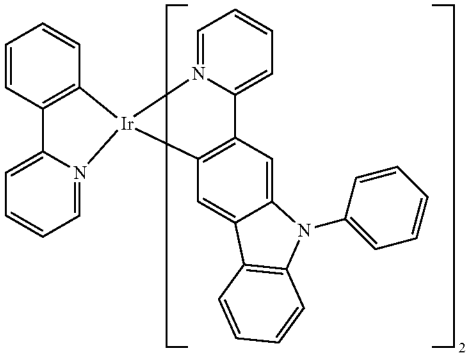

-continued

ID17

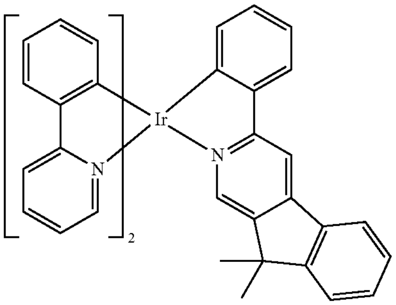

ID18

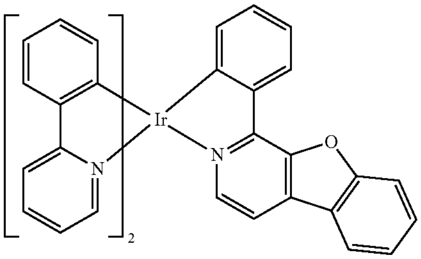

ID19

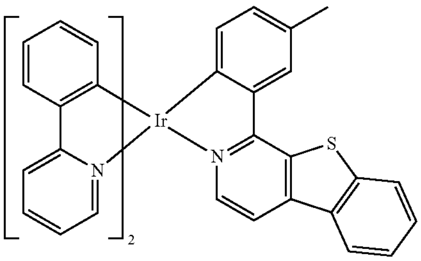

ID20

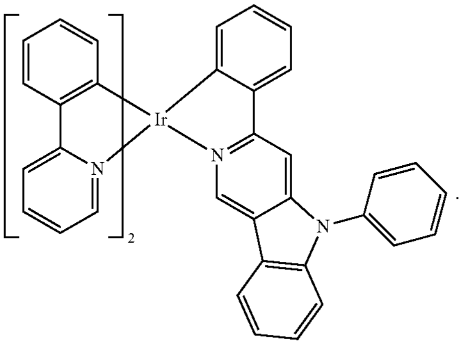

The amount of the first compound in the first emission layer 133*a* may be in a range of about 50 wt % to about 99 wt % based on the total weight of the first emission layer 133*a*. The sum of amounts of the second compound and the third compound in the first emission layer 133*a* may be in a range of about 50 wt % to about 99 wt % based on the total weight of the first emission layer 133*a*. For example, the amount of the second compound in the first emission layer 133*a* may be in a range of about 9 wt % to about 90 wt % based on the total weight of the first emission layer 133*a*, and the amount of the third compound may be in a range of about 9 wt % to about 90 wt % based on the total weight of the first emission layer 133*a*.

The amount of the first dopant in the first emission layer 133*a* may be less than or equal to the amount of the first compound or the sum of the amounts of the second compound and the third compound. The amount of the first compound in the second emission layer **133*b* may be in a range of about 50 wt % to about 90 wt % based on the total weight of the second emission layer 133*b***.

The sum of amounts of the second compound and the third compound in the second emission layer **133*b* may be in a range of about 50 wt % to about 99 wt % based on the total weight of the second emission layer 133*b*. For example, the amount of the second compound in the second emission layer 133*b* may be in a range of about 9 wt % to about 90 wt % based on the total weight of the second emission layer 133*b*, and the amount of the third compound may be in a range of about 9 wt % to about 90 wt % based on the total weight of the second emission layer 133*b*. The amount of the second dopant in the second emission layer 133*b*** may be less than or equal to the amount of the first compound or the sum of the amounts of the second compound and the third compound.

Because the organic light-emitting device 10 or 20 includes the first emission layer **133*a* and the second emission layer 133*b* which are different from each other, the charge balance for each color in the organic light-emitting device 10 or 20** and the device performance may be improved, as compared with a case in which the single-layered emission layer is included.

In addition, since the organic light-emitting device 10 or 20 has a structure in which the first emission layer **133*a* in the emission region 133 neighboring the hole transport region 131 has a curves of hole (HOD) voltage that is lower by about 0.5 V or more than the HOD voltage of the second emission layer 133*b* in the emission region 133 neighboring the electron transport region 135, a recombination region may be formed at the interface between the first emission layer 133*a* and the second emission layer 133*b***. In this manner, the lifespan and luminescence efficiency of the device may be improved.

When the recombination region is present near the neighboring hole transport region 131 or electron transport region 135 instead of at the interface between the first emission layer **133*a* and the second emission layer 133*b*, device materials may deteriorate and luminescence efficiency may be decreased due to loss of excitons. However, in the case of the organic light-emitting device 10 or 20, even when a leakage of some charges occurs, the leaked charges belong to the vicinity of the interface between the first emission layer 133*a* and the second emission layer 133*b* in the emission region 133**, and thus, the decrease in the luminescence efficiency may be prevented.

Furthermore, since the organic light-emitting device 20 has a configuration in which the first emission layer **133*a* and the second emission layer 133*b*** have different thicknesses from each other, the location of a light-emitting zone may be controlled according to the principle of trap balance between holes/electrons in an emission layer.

In addition, when the thickness of the first emission layer **133*a* is less than or equal to the thickness of the second emission layer 133*b*, holes may be sufficiently provided into the second emission layer 133*b* by a weak hole trap of the first emission layer 133*a*, and the light-emitting zone may be induced into the second emission layer 133*b* from the interface between the first emission layer 133*a* and the second emission layer 133*b* by a strong hole trap of the second emission layer 133*b*. As a result, the leakage of charges at the interface between the first emission layer 133*a* and the second emission layer 133*b*** may be suppressed, thereby improving deterioration of the device between interfaces.

In addition, the organic light-emitting device 10 or 20 may optionally employ a cohost including a hole transporting host and an electron transporting host or a bipolar host, and as a result, low-voltage driving, excellent charge balance, and improved luminescence efficiency due to improved roll-off may be achieved according to the principle of exciplex formation between hosts.

Hole Transport Region 131 in Organic Layer 130

The hole transport region 131 may have: i) a single-layered structure consisting of a single layer consisting of a single material, ii) a single-layered structure consisting of a single layer consisting of a plurality of different materials, or iii) a multi-layered structure including a plurality of layers including different materials. The hole transport region 131 may include a hole injection layer, a hole transport layer, an emission auxiliary layer, an electron blocking layer, or any combination thereof.

For example, the hole transport region 131 may have a multi-layered structure including a hole injection layer/hole-transporting layer structure, a hole injection layer/hole-transporting layer/emission auxiliary layer structure, a hole injection layer/emission auxiliary layer structure, a hole-transporting layer/emission auxiliary layer structure, or a hole injection layer/hole-transporting layer/electron-blocking layer structure, wherein, in each structure, layers are stacked sequentially from the first electrode 110.

The hole transport region 131 may include a compound represented by Formula 201, a compound represented by Formula 202, or any combination thereof:

Formula 201

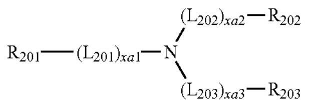

Formula 202

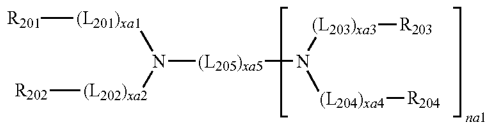

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, each of Formulae 201 and 202 may include at least one of groups represented by Formulae CY201 to CY217:

CY201

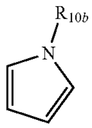

CY202

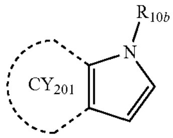

CY203

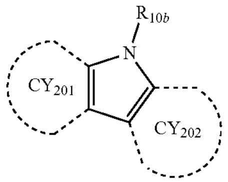

CY204

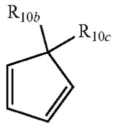

CY205

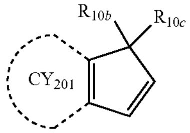

CY206

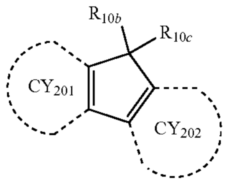

CY207

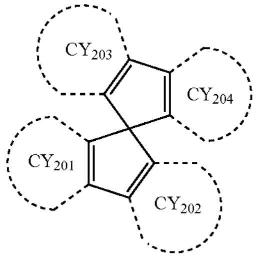

-continued

CY208

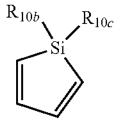

CY209

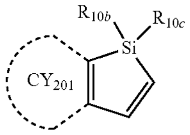

CY210

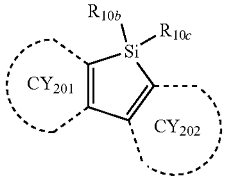

CY211

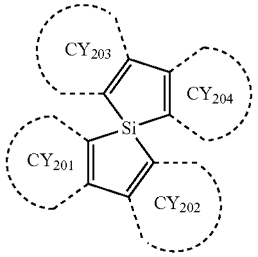

CY212

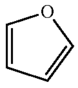

CY213

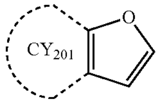

CY214

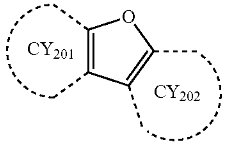

CY215

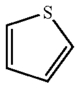

CY216

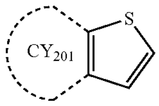

CY217

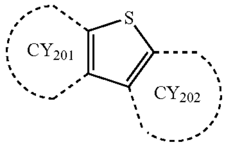

The variables $R_{10b}$ and $R_{10c}$ and k in Formulae CY201 to CY217 are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$. In an embodiment, ring $CY_{201}$ to ring $CY_{204}$ in Formulae CY201 to CY217 may each independently be a benzene group, a naphthalene group, a phenanthrene group, or an anthracene group. In one or more embodiments, each of Formulae 201 and 202 may include at least one of groups represented by Formulae CY201 to CY203.

In one or more embodiments, Formula 201 may include at least one of groups represented by Formulae CY201 to CY203 and at least one of groups represented by Formulae CY204 to CY217. In one or more embodiments, xa1 in Formula 201 is 1, $R_{201}$ is a group represented by one of Formulae CY201 to CY203, xa2 may be 0, and $R_{202}$ may be a group represented by one of Formulae CY204 to CY207. In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203, and may include at least one of groups represented by Formulae CY204 to CY217. In an embodiment, each of Formulae 201 and 202 may not include a group represented by one of Formulae CY201 to CY217.

In an embodiment, the hole transport region 131 may include one of Compounds HT1 to HT47, 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino]triphenylamine (2-TNATA), bis(naphthalen-1-yl)-N,N'-bis(phenyl)benzidine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (spiro-TPD), N2,N7-di-1-naphthalenyl-N2,N7-diphenyl-9,9'-spirobi[9H-fluorene]-2,7-diamine (spiro-NPB), N,N'-di(1-naphthyl)-N,N-diphenyl-2,2'-dimethyl-(1,1'-biphenyl)-4,4'-diamine (methylated NPB), 4,4'-cyclohexylidenebis[N,N-bis(4-methylphenyl)benzenamine] (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

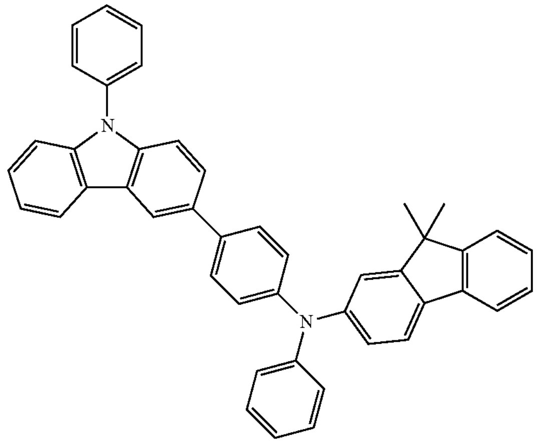

HT2

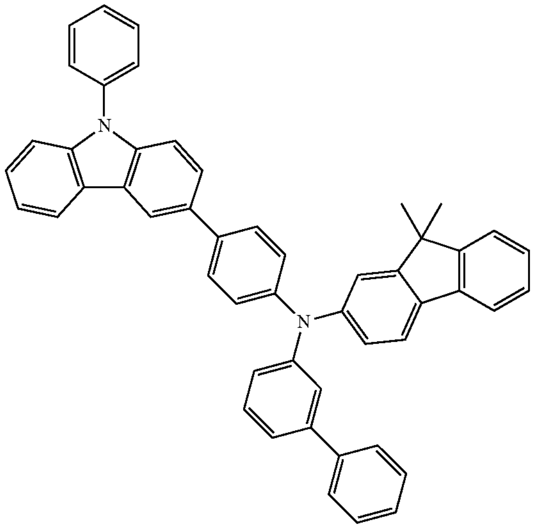

-continued
HT3
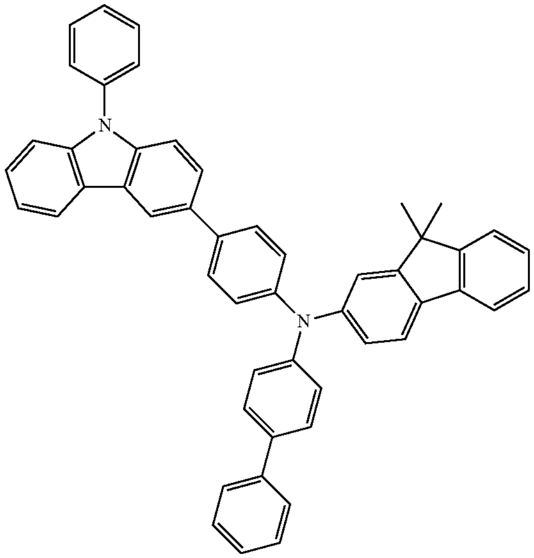
HT4
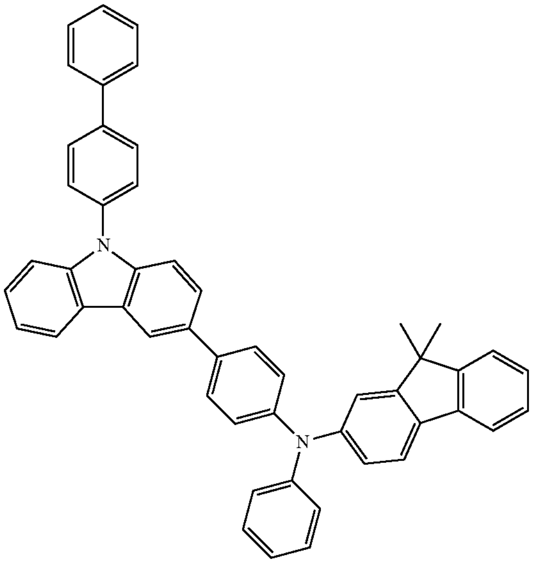
HT5
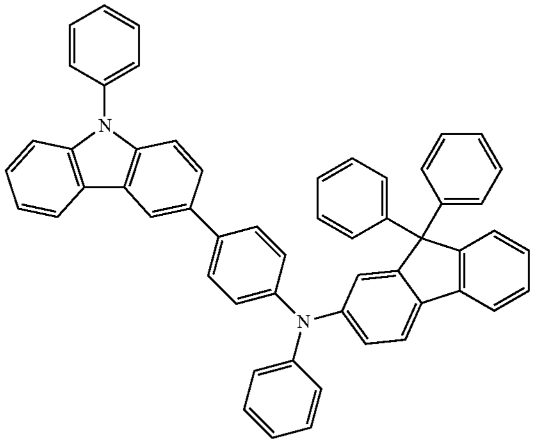
HT6
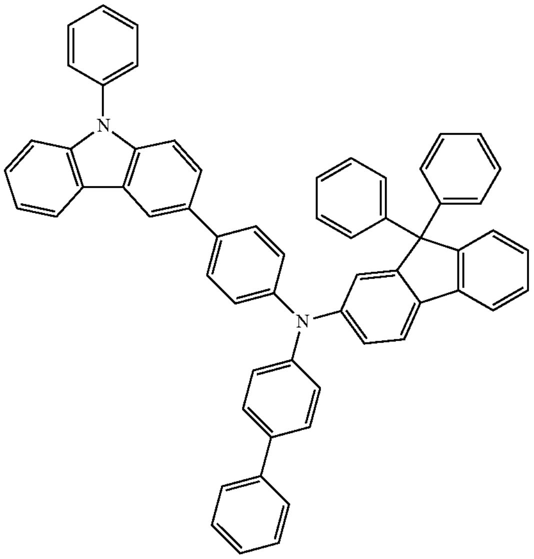

-continued
HT7
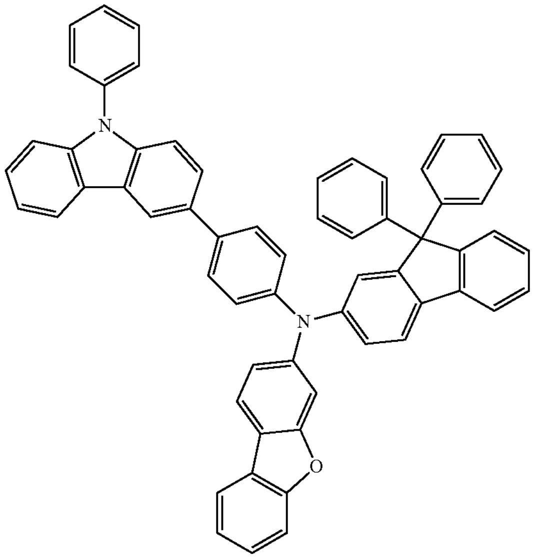
HT8
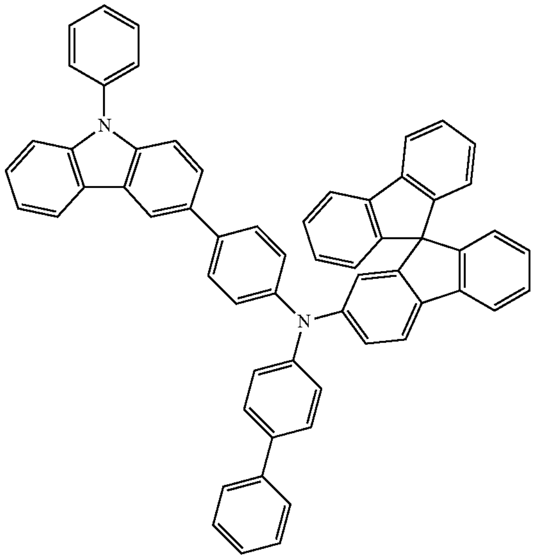
HT9
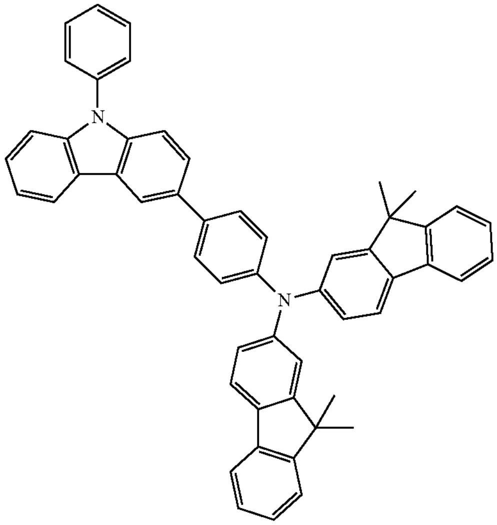
HT10
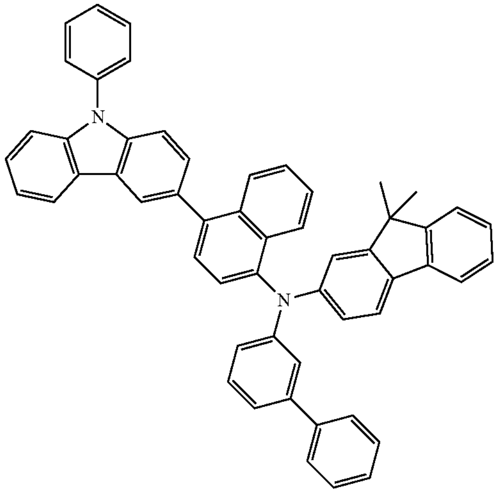
HT11
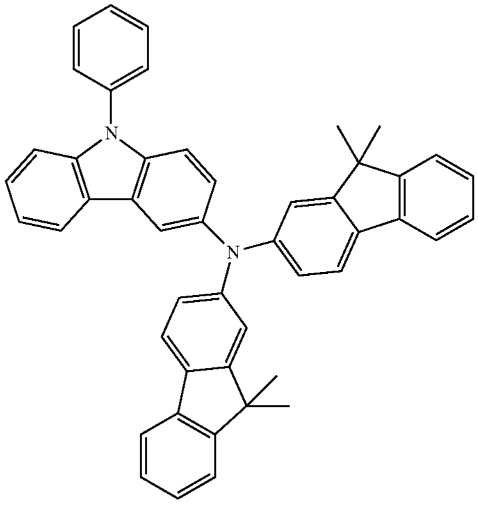
HT12
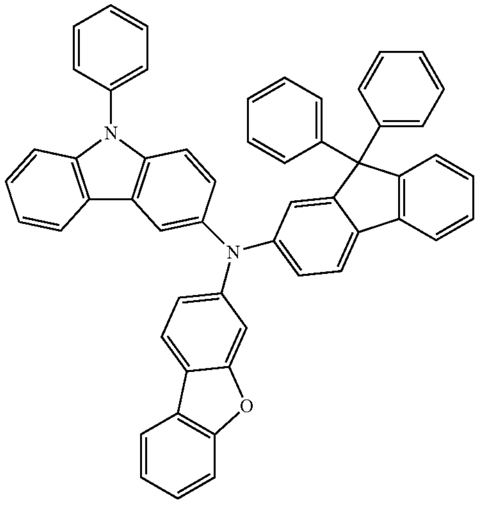

-continued
HT13
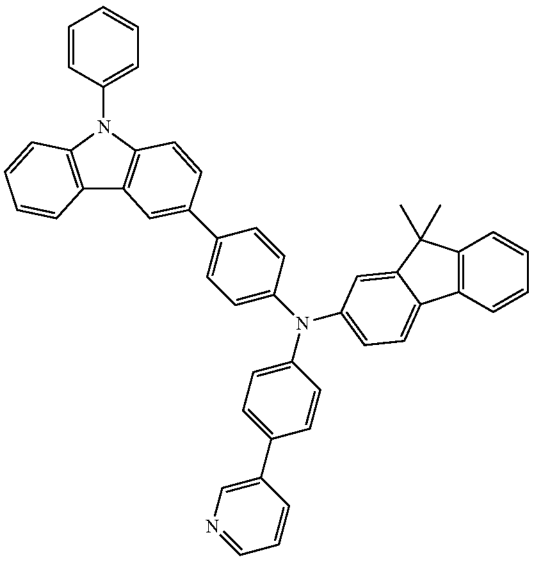
HT14
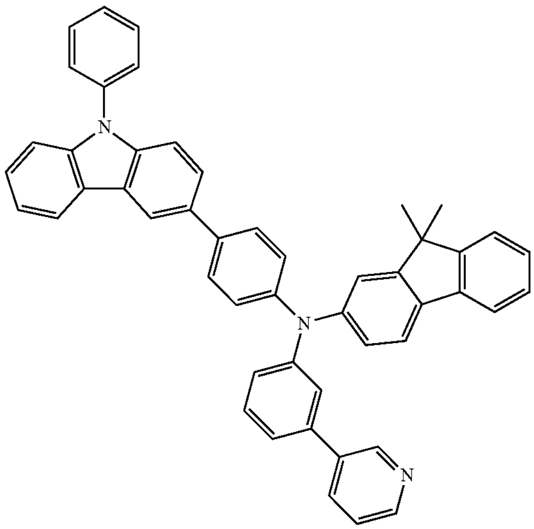
HT15
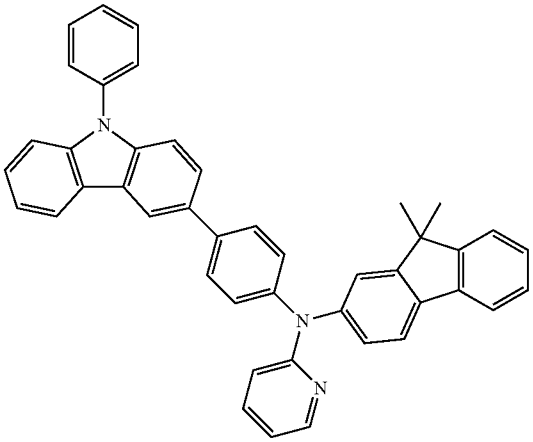
HT16
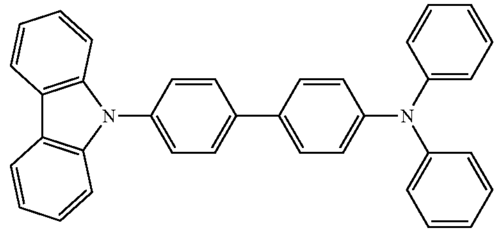
HT17
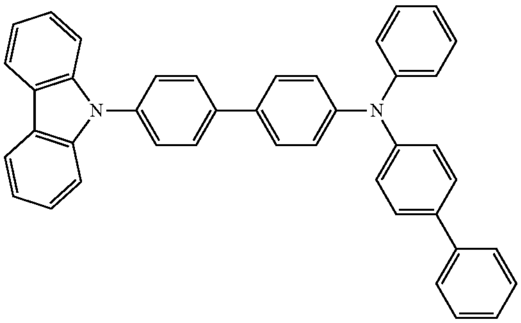
HT18
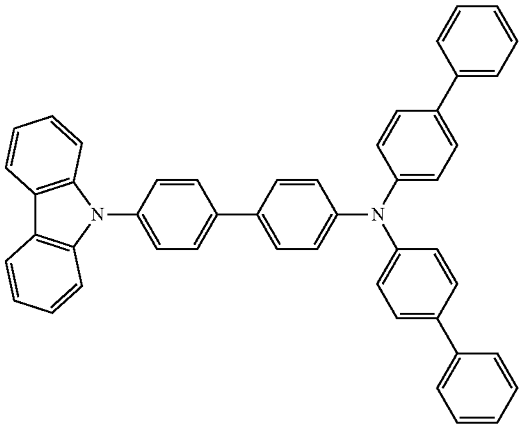

-continued
HT19
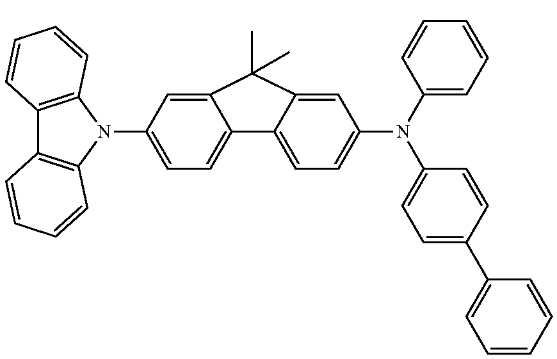
HT20
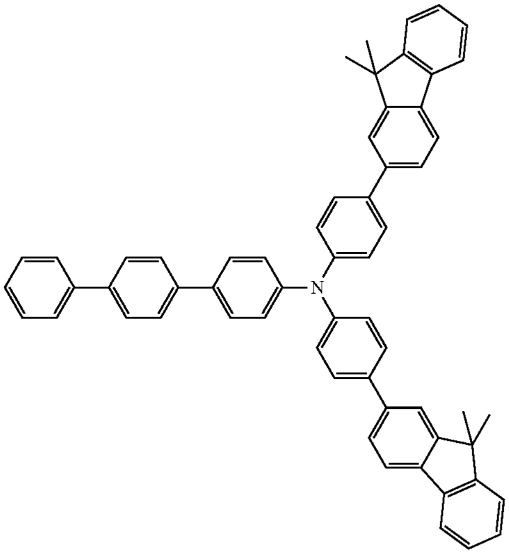
HT21
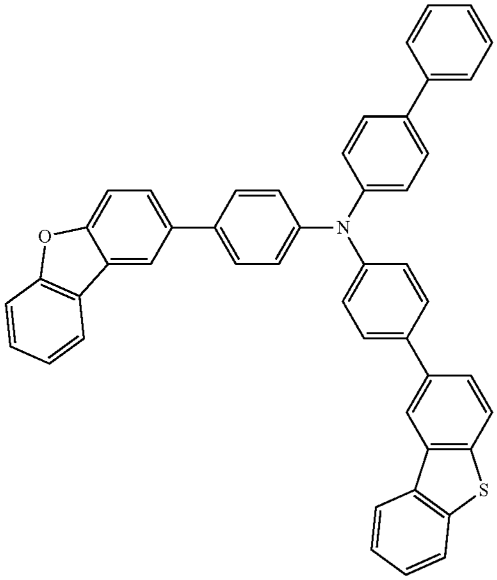
HT22
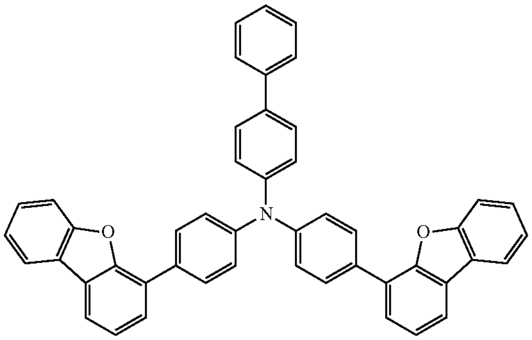
HT23
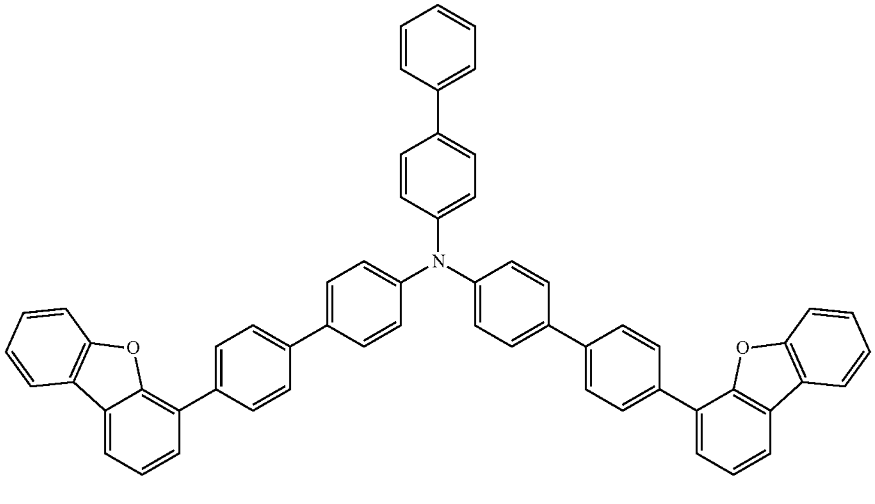

-continued
HT24
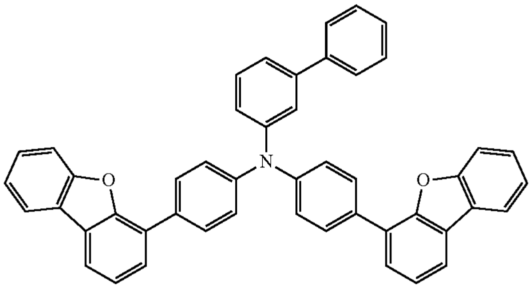
HT25
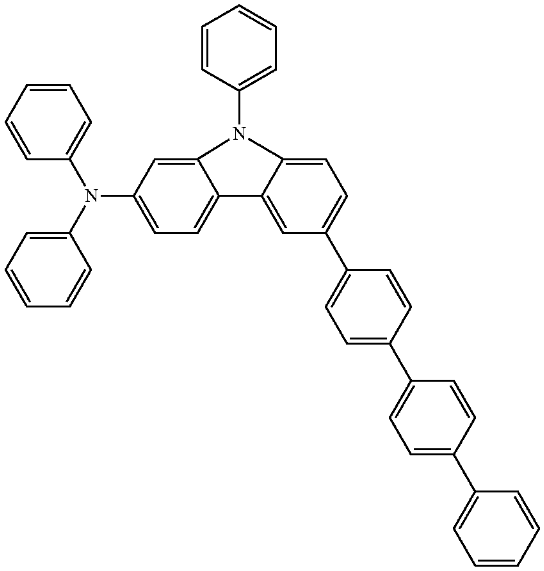
HT26
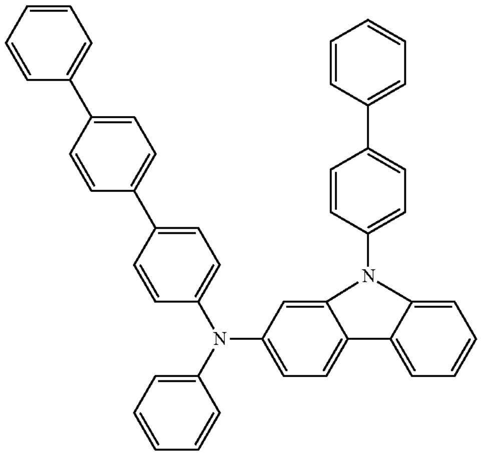
HT27
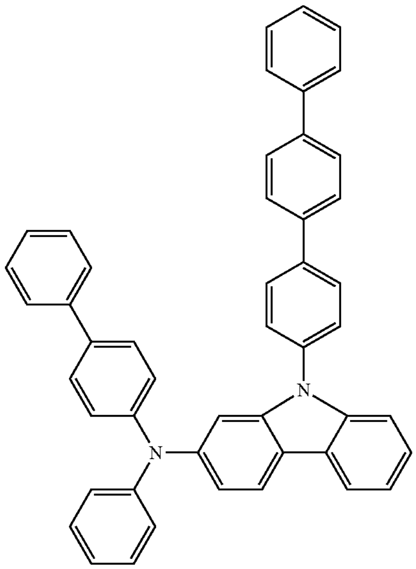
HT28
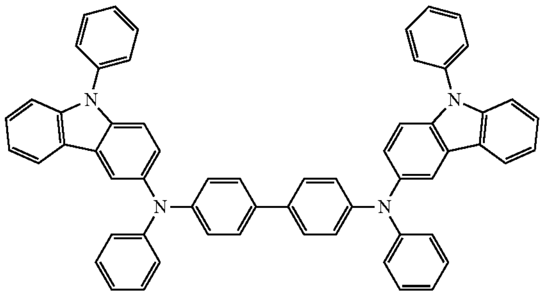
HT29
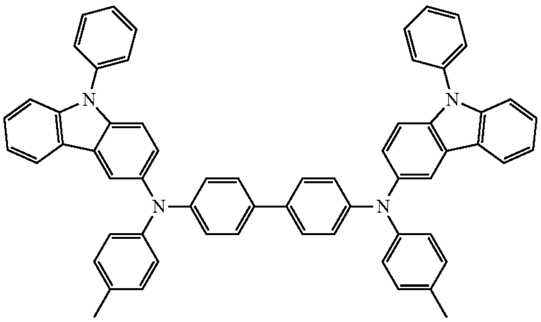

-continued
HT30
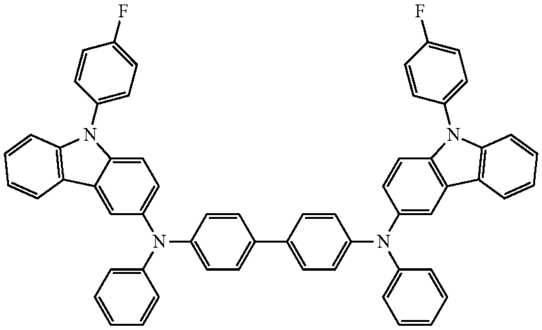
HT31
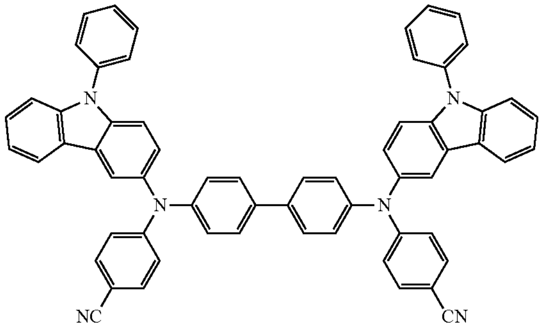
HT32
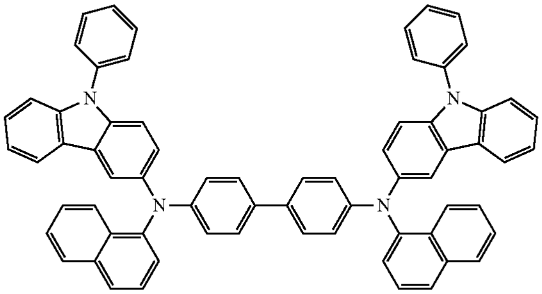
HT33
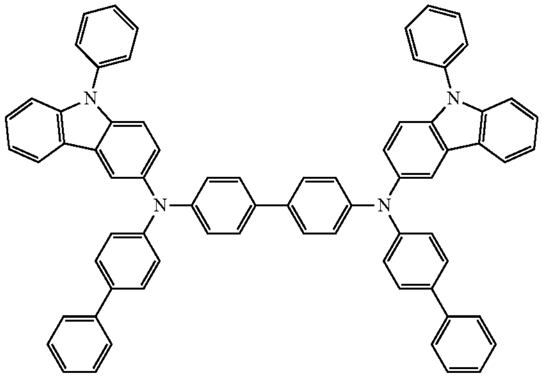
HT34
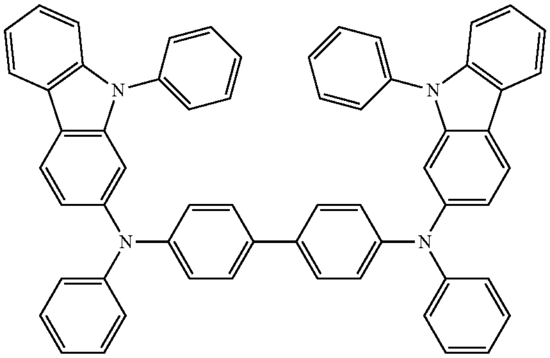
HT35
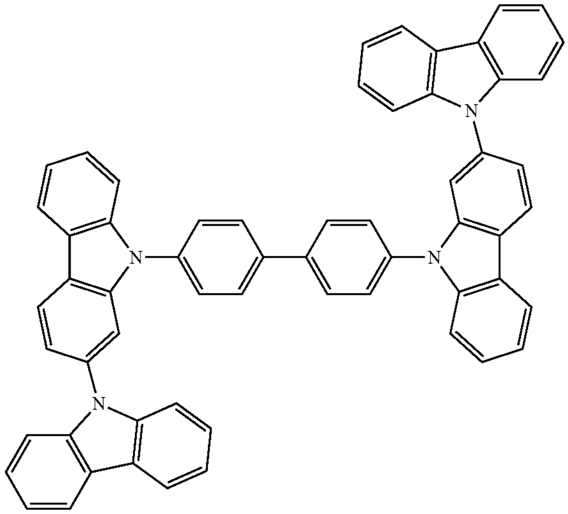

-continued
HT36
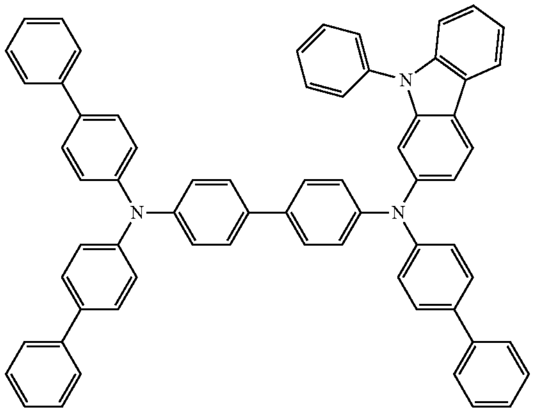
HT37
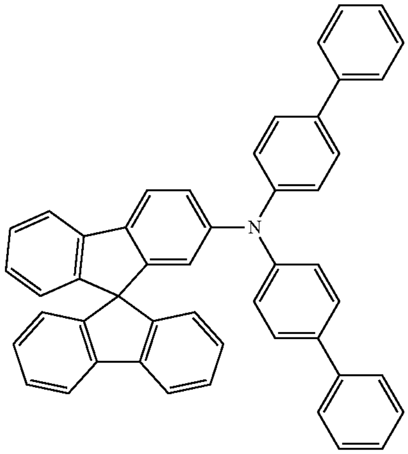
HT38
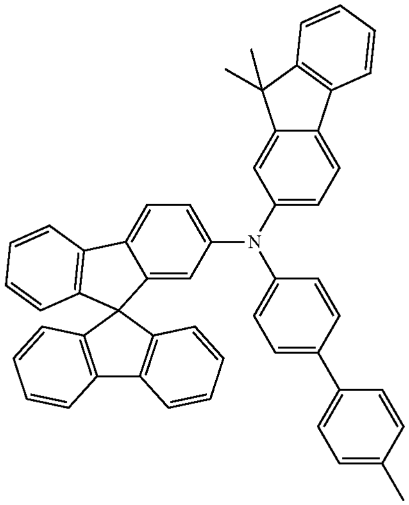
HT39
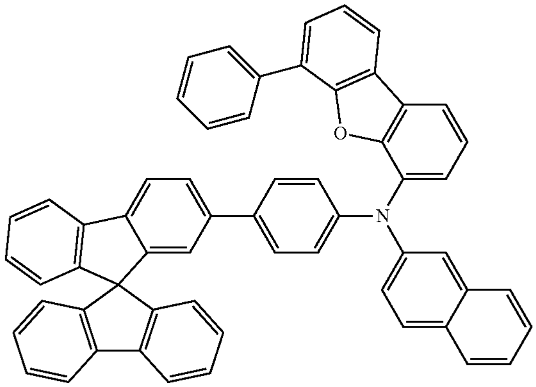
HT40
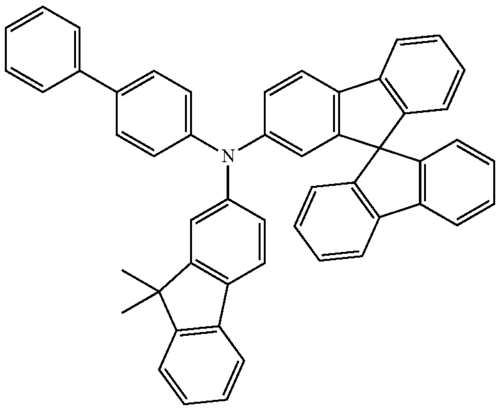
HT41
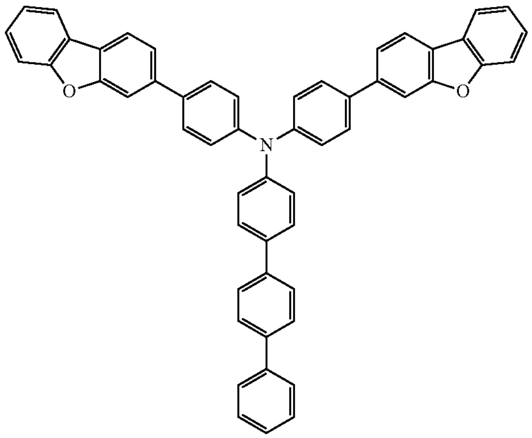

-continued
HT42
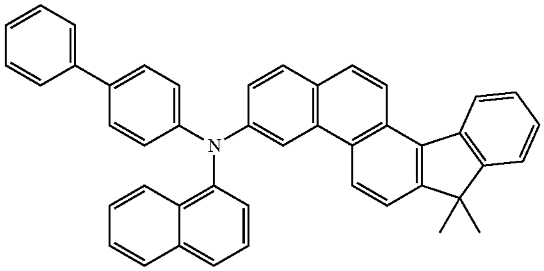
HT43
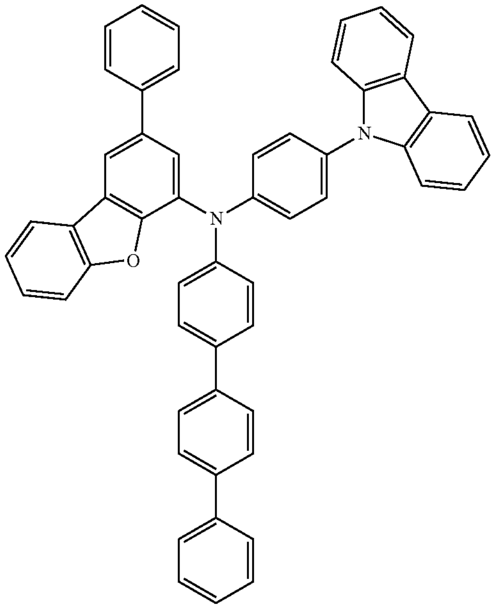
HT44
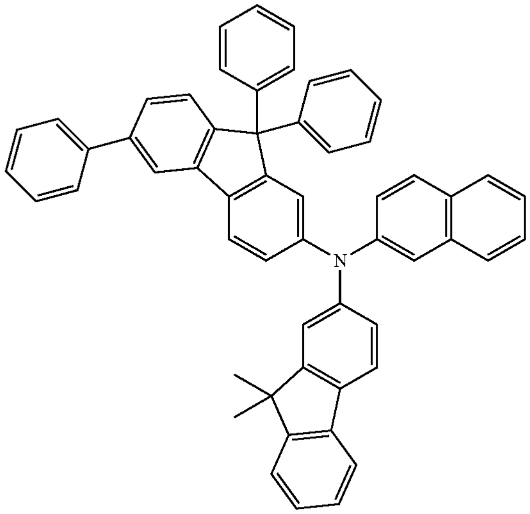
HT45
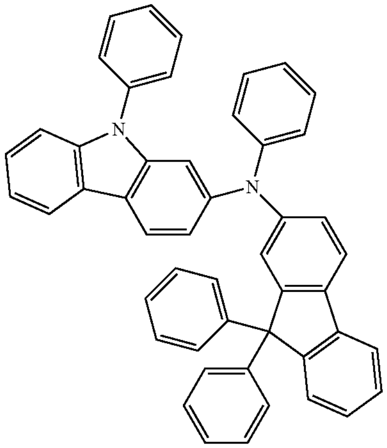
HT46
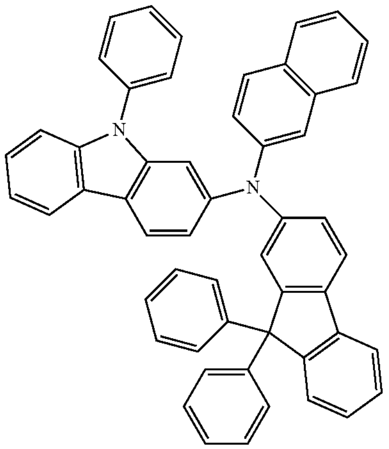
HT47
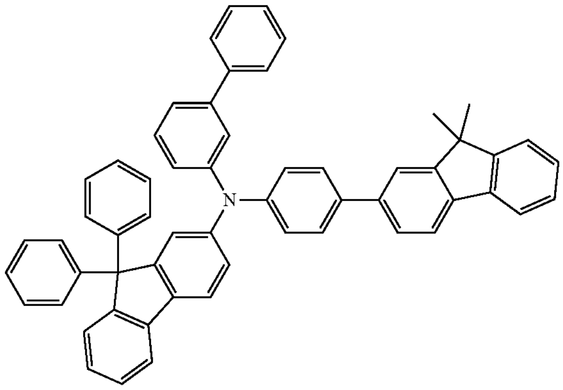

-continued
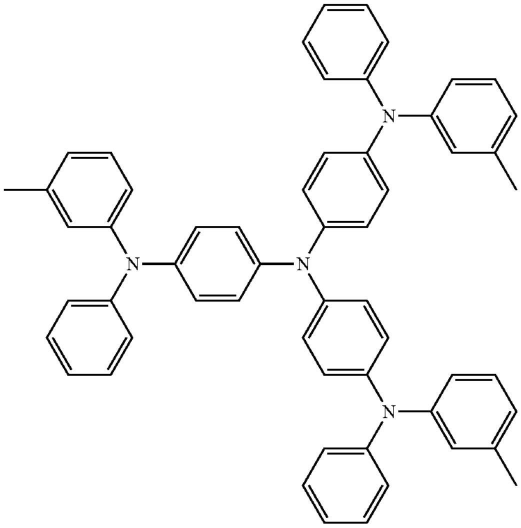
m-MTDATA
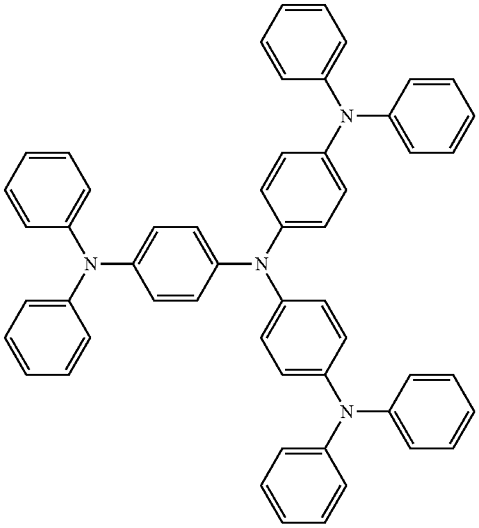
TDATA
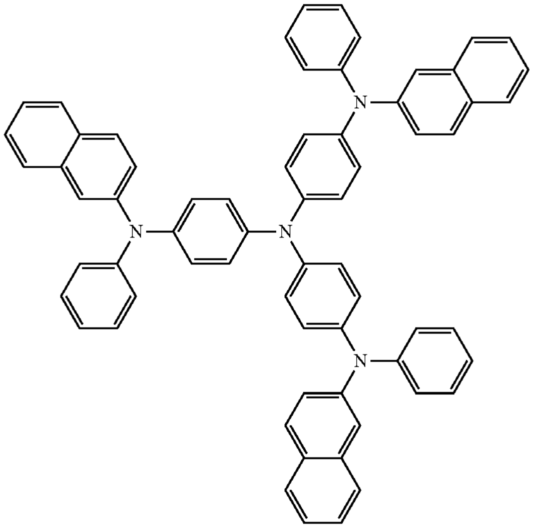
2-TNATA
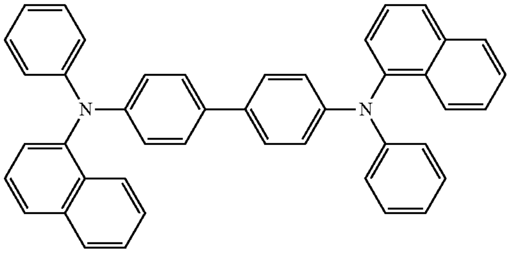
NPB
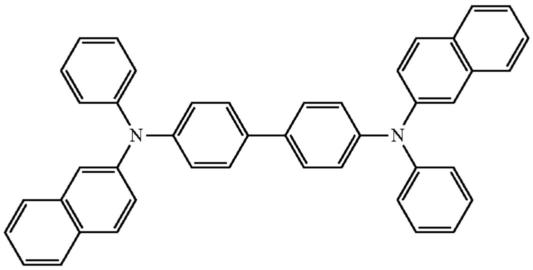
β-NPB
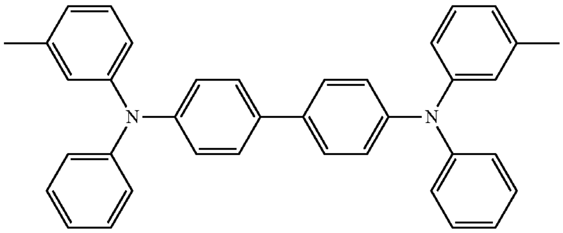
TPD -continued

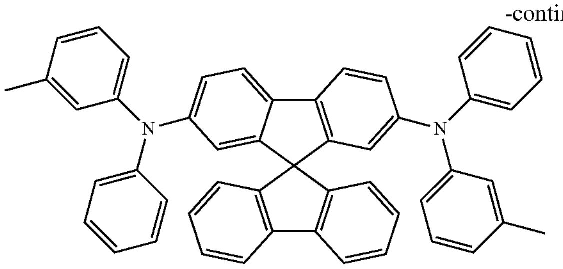

Spiro-TPD

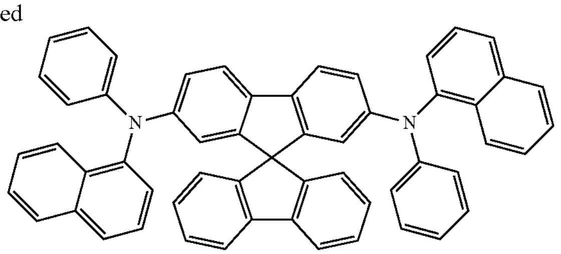

Spiro-NPB

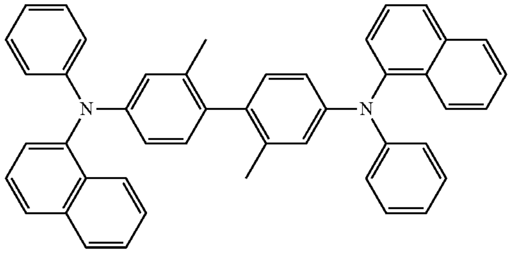

methylated-NPB

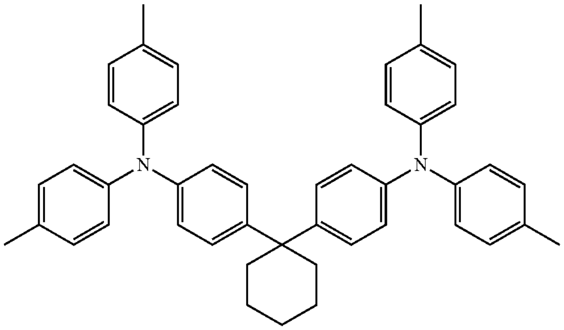

TAPC

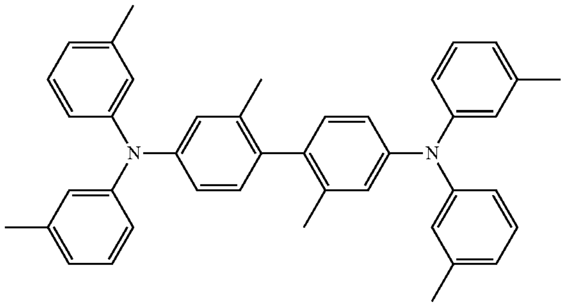

HMTPD

The thickness of the hole transport region 131 may be in a range of about 50 Angstroms (Å) to about 10,000 Å, for example, about 100 Å to about 4,000 Å. When the hole transport region 131 includes the hole injection layer, the hole transport layer, or any combination thereof, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region 131, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by the emission region 133, and the electron blocking layer may block the flow of electrons from the electron transport region 135. The emission auxiliary layer and the electron blocking layer may include the materials as described above.

p-Dopant

The hole transport region 131 may further include, in addition to these materials, a charge-generation material for the improvement of conductive properties. The charge-generation material may be uniformly or non-uniformly dispersed in the hole transport region 131 (for example, in the form of a single layer consisting of a charge-generation material). The charge-generation material may be, for example, a p-dopant. In an embodiment, the lowest unoccupied molecular orbital (LUMO) energy level of the p-dopant may be about −3.5 eV or less.

In an embodiment, the p-dopant may include a quinone derivative, a cyano group-containing compound, a compound containing element EL1 and element EL2, or any combination thereof. Examples of the quinone derivative are tetracyanoquinodimethane (TCNQ), 2,3,5,6-tetrafluoro-7,7',8,8'-tetracyanoquinodimethane (F4-TCNQ), etc. Examples of the cyano group-containing compound are HAT-CN, and a compound represented by Formula 221 below.

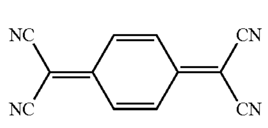

TCNQ

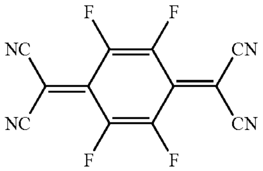

F4-TCNQ

-continued

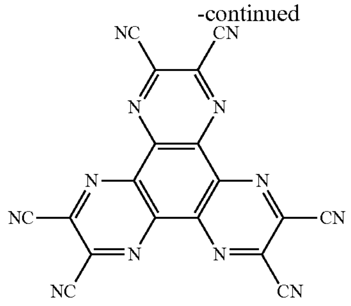

HAT-CN

Formula 221

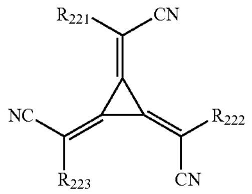

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof. In the compound containing element EL1 and element EL2, element EL1 may be a metal, a metalloid, or a combination thereof, and element EL2 may be a non-metal, a metalloid, or a combination thereof.

Examples of the metal are an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid are silicon (Si), antimony (Sb), and tellurium (Te). Examples of the non-metal are oxygen (0) and a halogen (for example, F, Cl, Br, I, etc.). In an embodiment, examples of the compound containing element EL1 and element EL2 are a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide are a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), and a rhenium oxide (for example, $ReO_3$, etc.).

Examples of the metal halide are an alkali metal halide, an alkaline earth metal halide, a transition metal halide, a post-transition metal halide, and a lanthanide metal halide. Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI. Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide are a zinc halide (for example, $ZnF_2$, $ZnCl_2$, ZnBrz, $ZnI_2$, etc.), an indium halide (for example, $InI_3$, etc.), and a tin halide (for example, $SnI_2$, etc.). Examples of the lanthanide metal halide are YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$. An example of the metalloid halide is an antimony halide (for example, $SbCl_5$, etc.).

Examples of the metal telluride are an alkali metal telluride (for example, $Li_2Te$, a $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Electron Transport Region 135 in Organic Layer 130

The electron transport region 135 may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region 135 may include a buffer layer, a hole blocking layer, an electron control layer, an electron transport layer, an electron injection layer, or any combination thereof. In an embodiment, the electron transport region 135 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from the emission region 133.

In an embodiment, the electron transport region 135 (for example, the buffer layer, the hole blocking layer, the electron control layer, or the electron transport layer in the electron transport region 135) may include a metal-free compound including at least one π electron-deficient nitrogen-containing $C_1$-$C_{60}$ cyclic group.

In an embodiment, the electron transport region 135 may include a compound represented by Formula 601.

$$[Ar_{601}]_{xe11}\text{-}[(L_{601})_{xe1}\text{-}R_{601}]_{xe21}$$ Formula 601

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ are the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond. In an embodiment, $Ar_{601}$ in Formula 601 may be a substituted or unsubstituted anthracene group.

In an embodiment, the electron transport region 135 may include a compound represented by Formula 601-1:

Formula 601-1

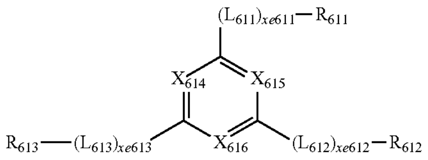

In Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ are the same as described in connection with $L_{601}$, xe611 to xe613 are the same as described in connection with xe1, $R_{611}$ to $R_{613}$ are the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region 135 may include one of Compounds ET1 to ET47, 2,9-dimethyl-4,7-diphenyl-1,10-phenanthroline (BCP), 4,7-diphenyl-1,10-phenanthroline (Bphen), tris-(8-hydroxyquinoline)aluminum ($Alq_3$), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), diphenyl(4-(triphenylsilyl)phenyl)-phosphine oxide (TSPO1), or any combination thereof:

ET1

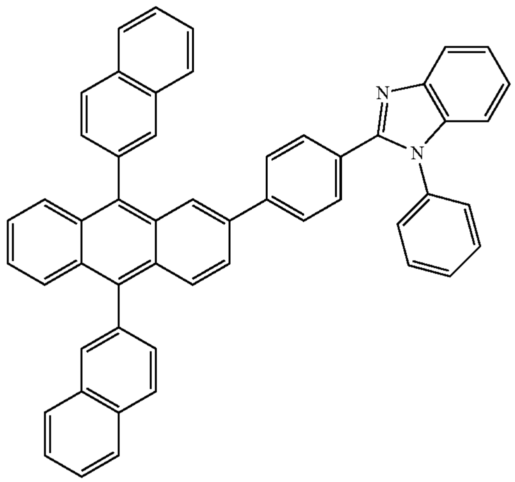

-continued
ET2
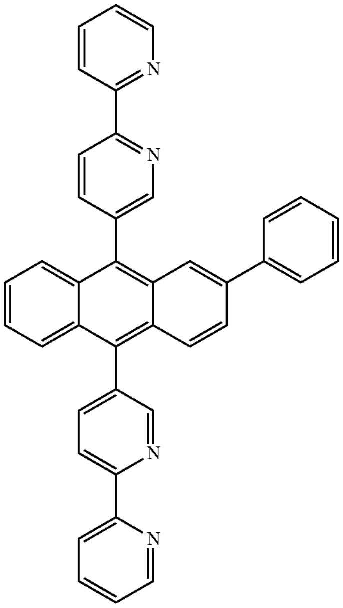
ET3
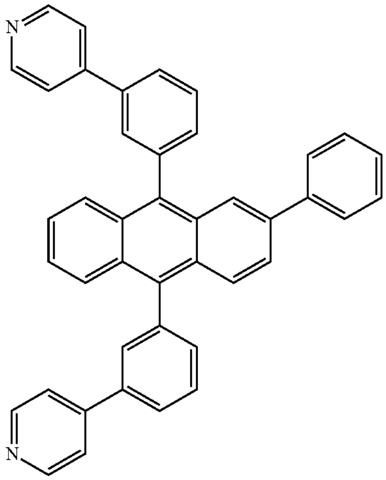
ET4
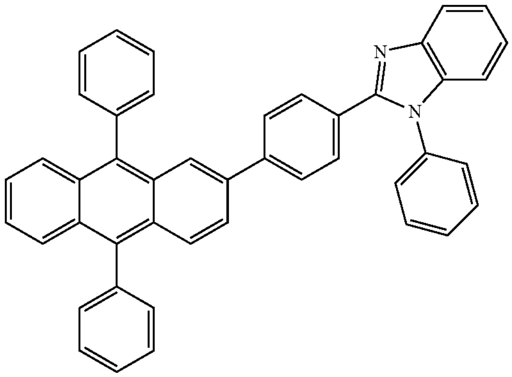
-continued
ET5
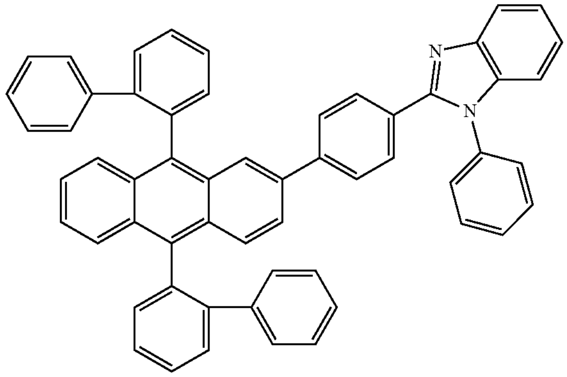
ET6
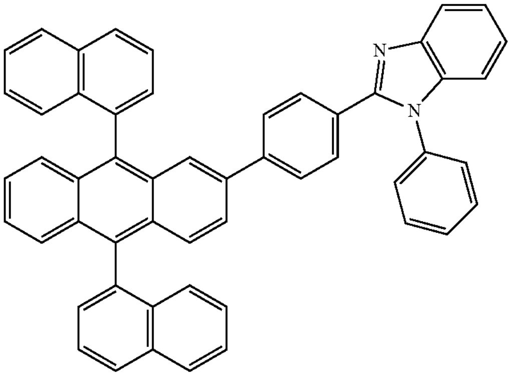
ET7
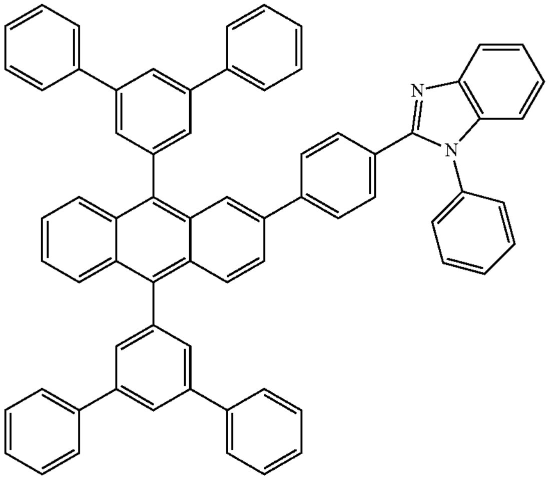

-continued
ET8
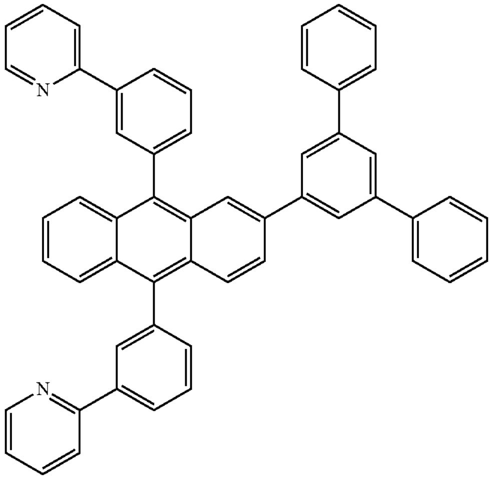
ET9
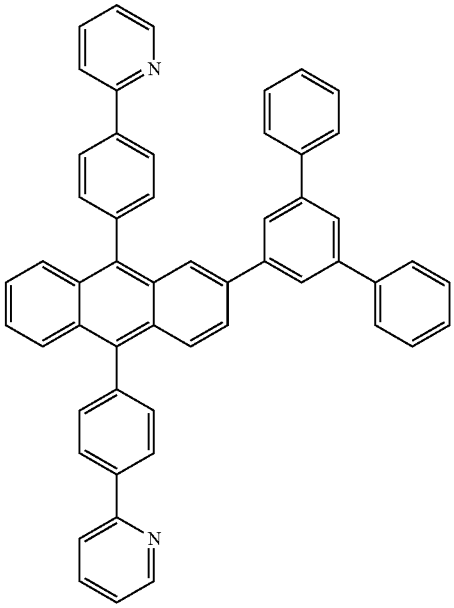
-continued
ET10
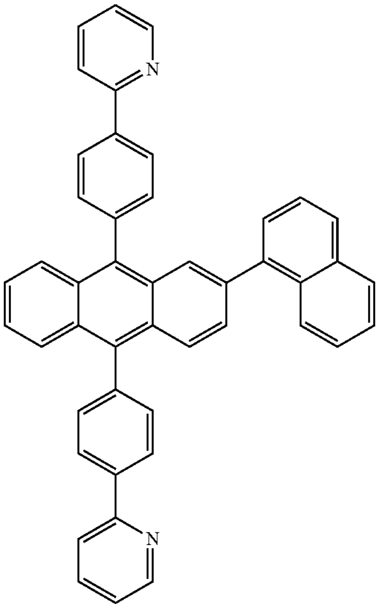
ET11
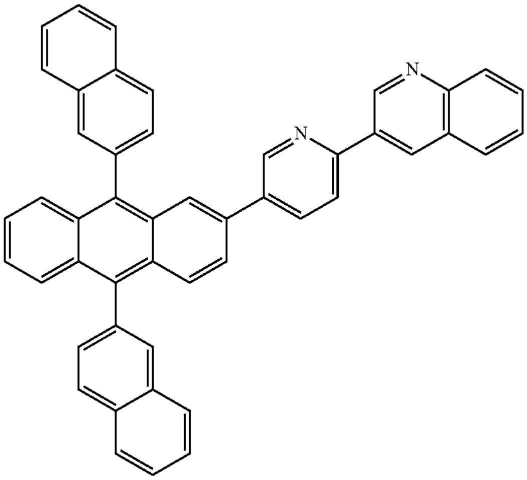
ET12
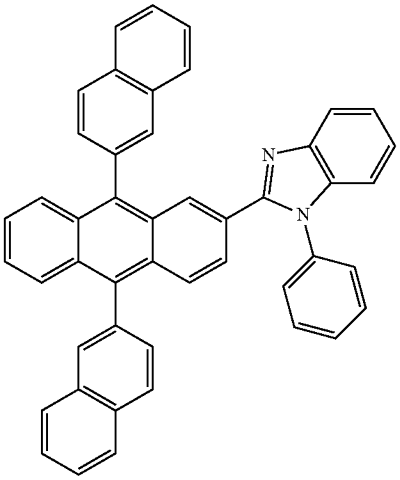

-continued
ET13
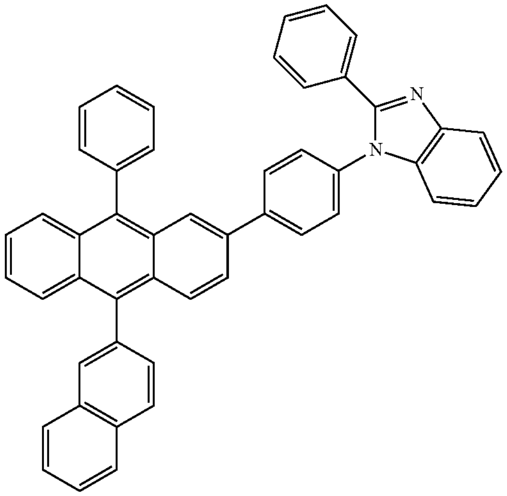
ET14
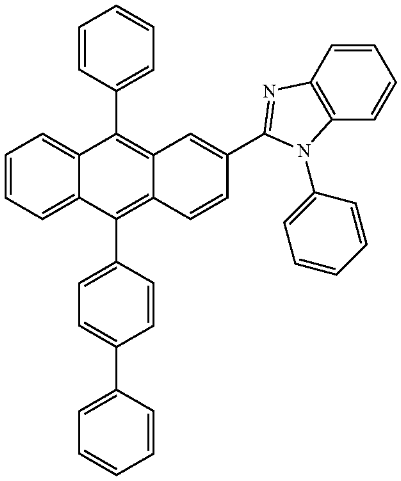
ET15
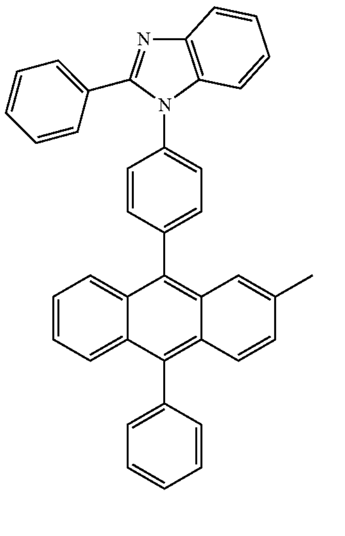
-continued
ET16
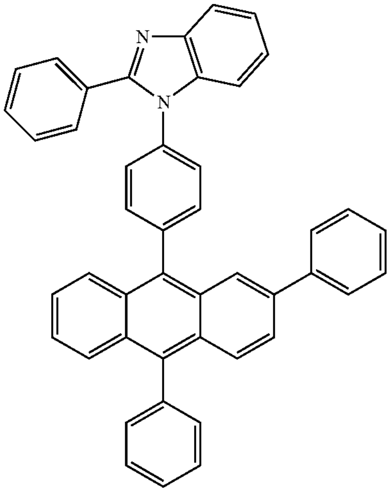
ET17
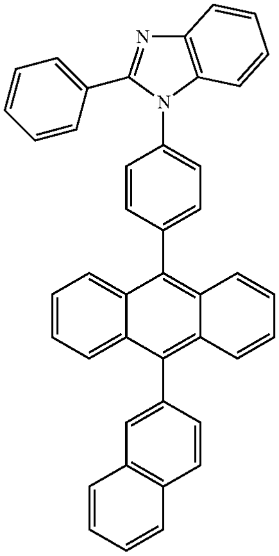
ET18
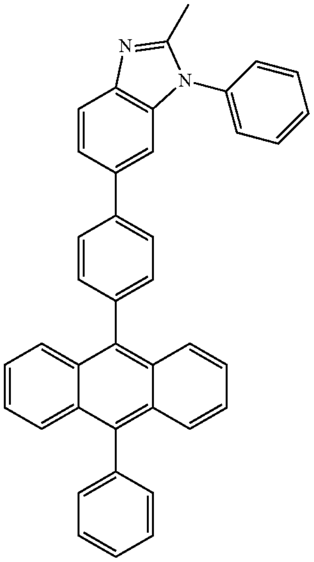

-continued
ET19
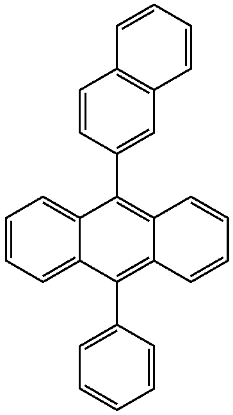
ET20
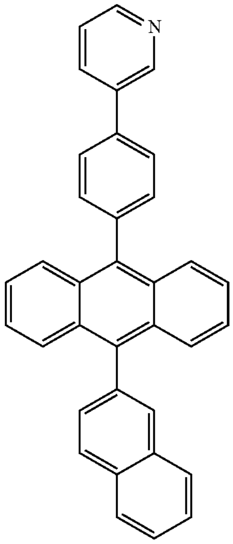
ET21
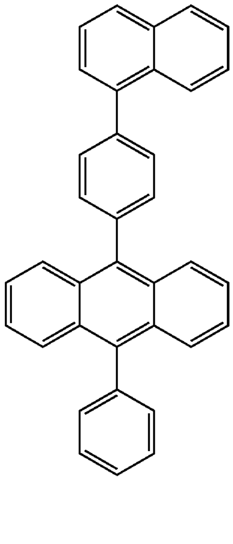
-continued
ET22
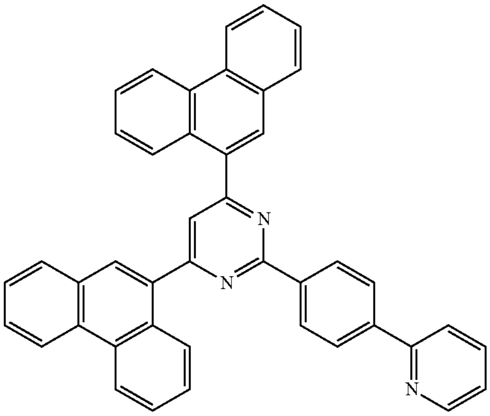
ET23
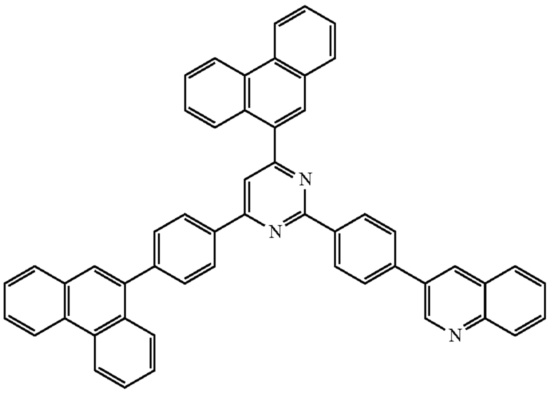
ET24
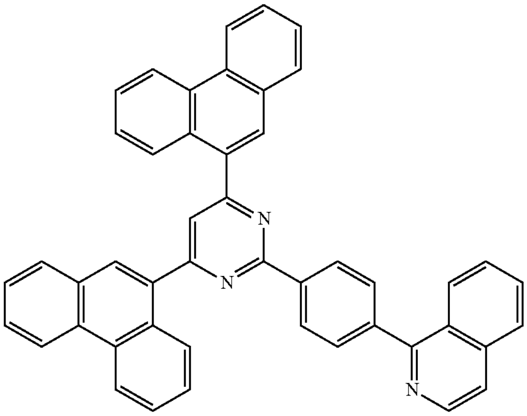

-continued
ET25
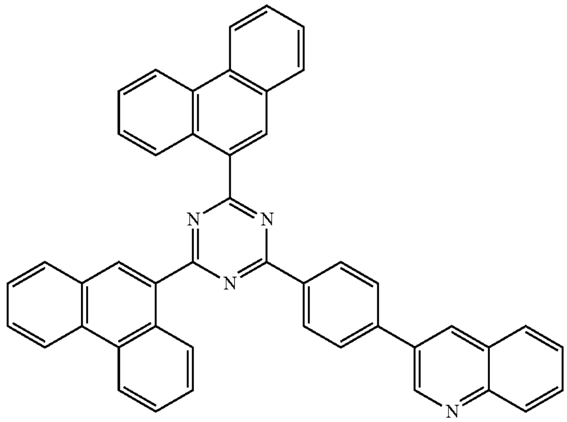
ET26
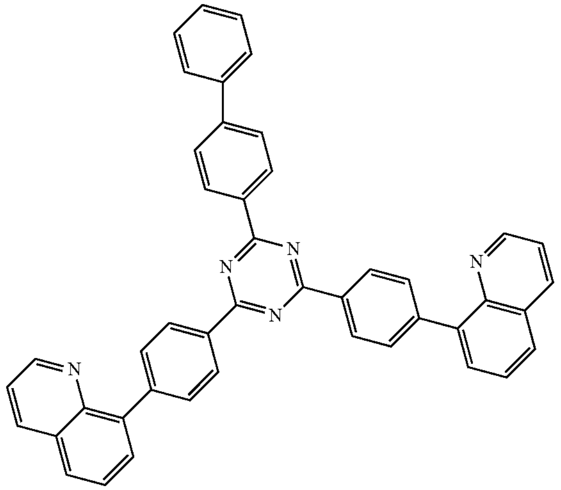
ET27
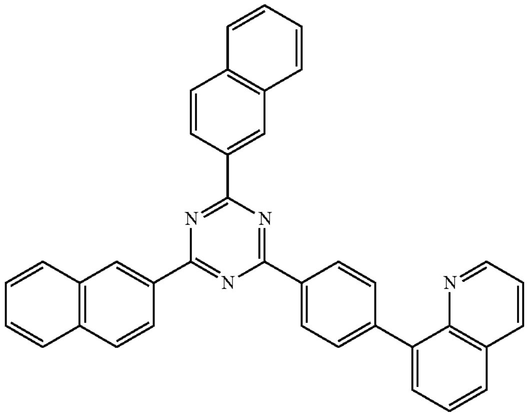
-continued
ET28
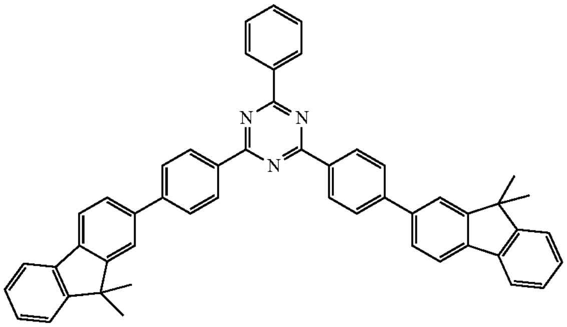
ET29
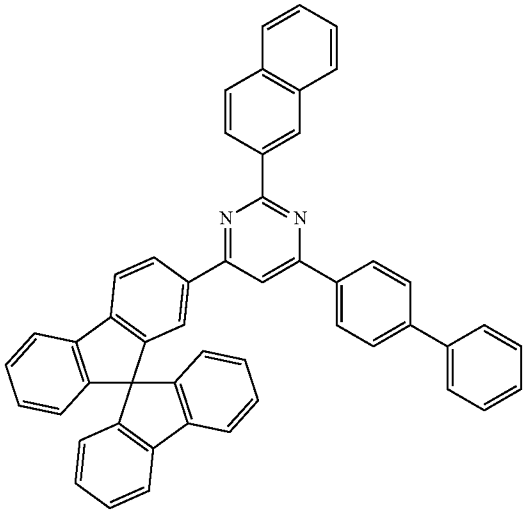
ET30
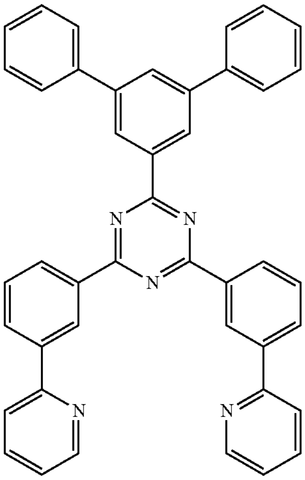

-continued
ET31
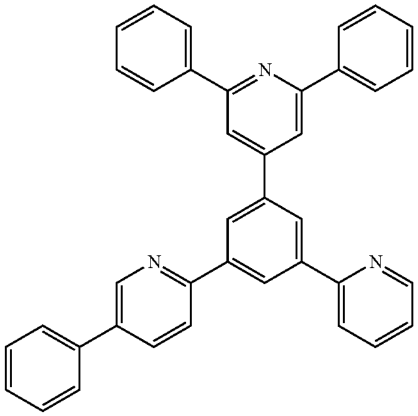
ET32
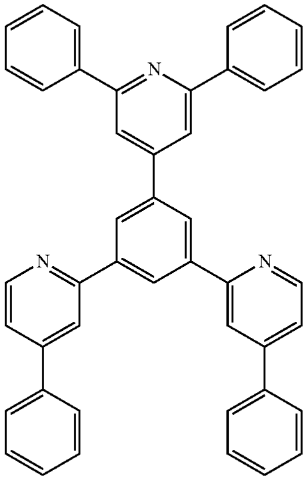
ET33
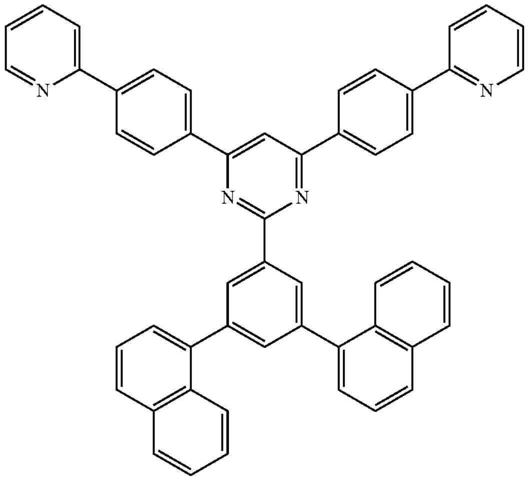
-continued
ET34
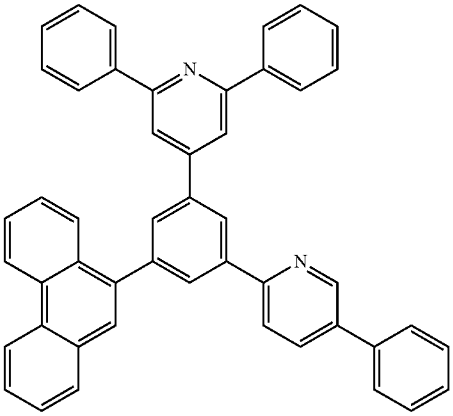
ET35
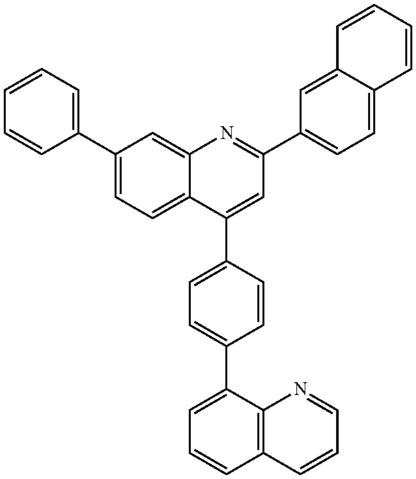
ET36
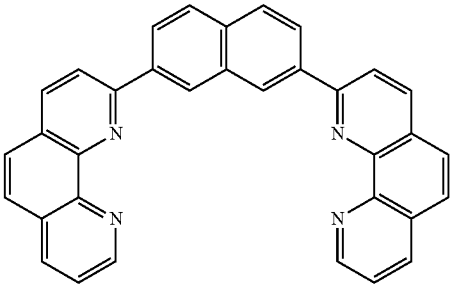
ET37
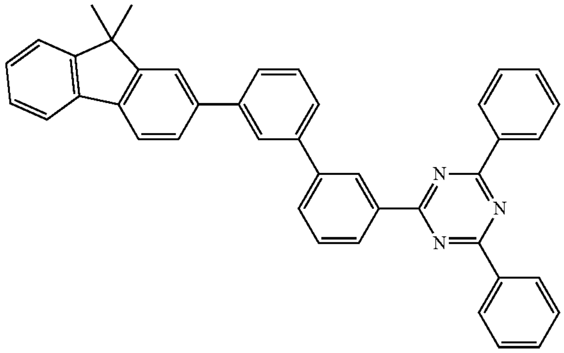

-continued
ET38
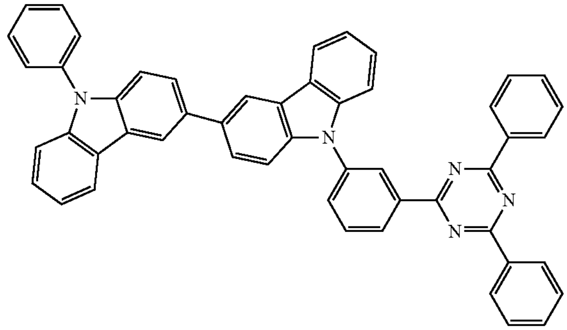
ET39
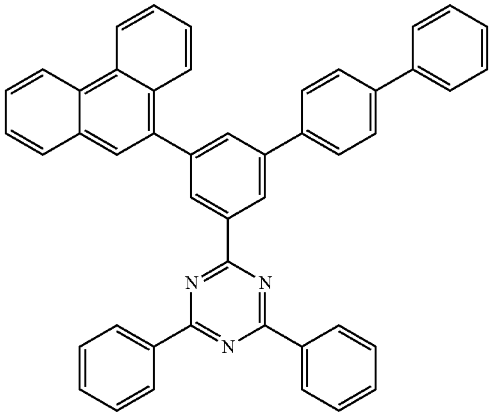
ET40
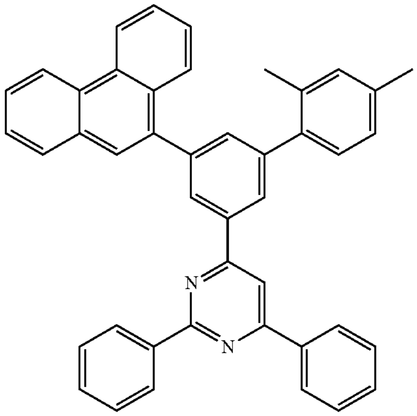
-continued
ET41
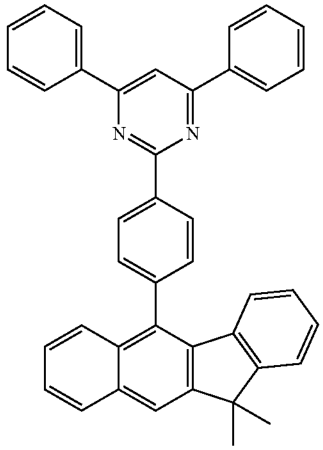
ET42
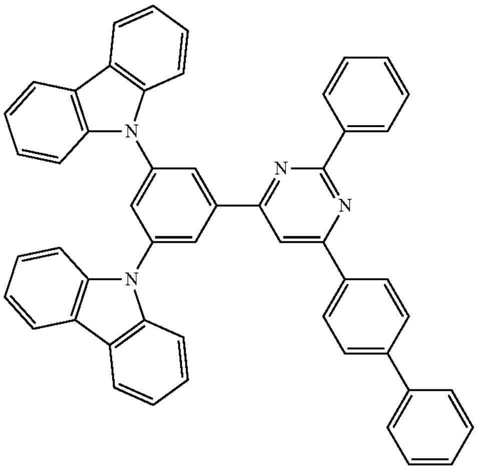
ET43
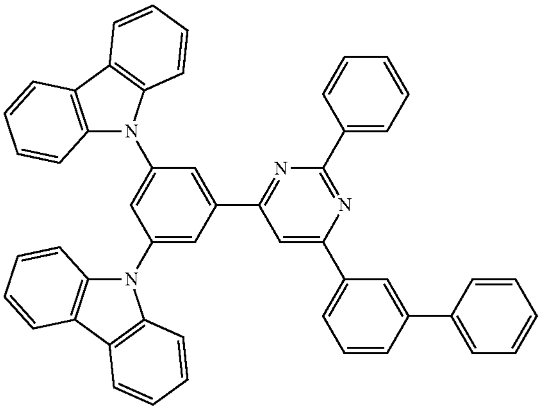

-continued

ET44

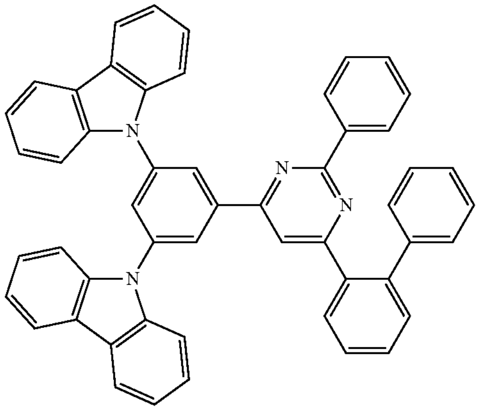

ET45

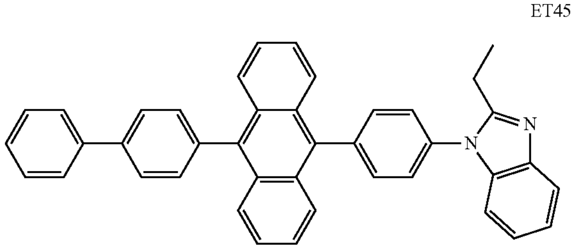

ET46

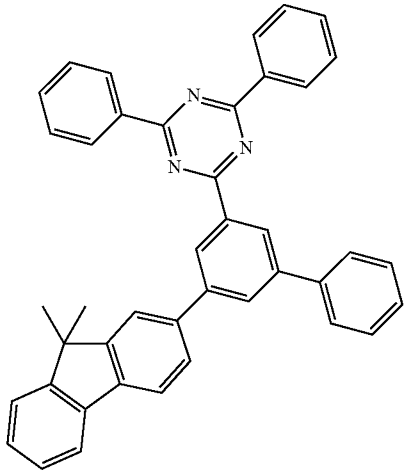

ET47

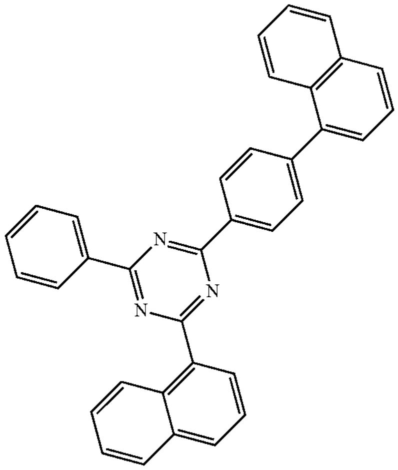

-continued

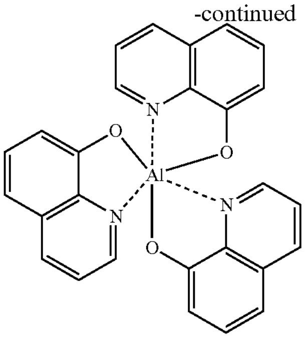

Alq3

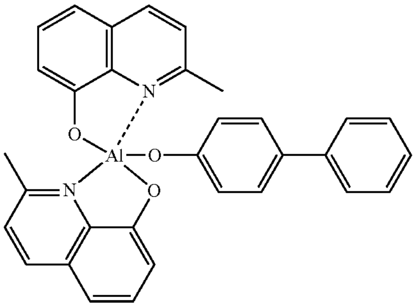

BAlq

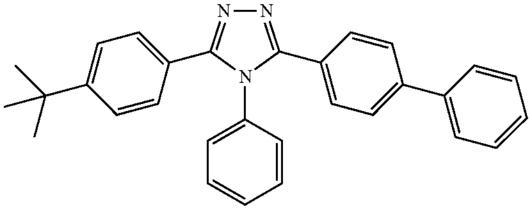

TAZ

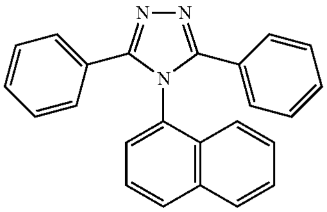

NTAZ

The thickness of the electron transport region 135 may be from about 160 Å to about 5,000 Å, for example, about 100 Å to about 4,000 Å. When the electron transport region 135 includes the buffer layer, the hole blocking layer, the electron control layer, the electron transport layer, or any combination thereof, a thickness of the buffer layer, the hole blocking layer, or the electron control layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thicknesses of the buffer layer, the hole blocking layer, the electron control layer, the electron transport layer and/or the electron transport region are within these ranges, satisfactory electron transporting characteristics may be obtained without a substantial increase in driving voltage.

The electron transport region 135 (for example, the electron transport layer in the electron transport region 135) may further include, in addition to the materials described above, a metal-containing material. The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (lithium quinolate, LiQ) or ET-D2:

ET-D1

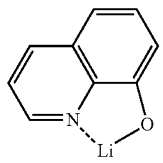

ET-D2

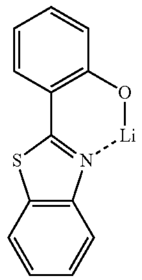

The electron transport region 135 may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof. The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof. The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, or the like.

When the electron injection layer further includes an organic material, alkali metal, alkaline earth metal, rare earth metal, an alkali metal-containing compound, an alkaline earth metal-containing compound, a rare earth metal-containing compound, alkali metal complex, alkaline earth-metal complex, rare earth metal complex, or any combination thereof may be homogeneously or non-homogeneously dispersed in a matrix including the organic material.

The thickness of the electron injection layer may be in a range of about 1 Å to about 100 Å, and about 3 Å to about 90 Å. When the thickness of the electron injection layer is within the range described above, the electron injection layer may have satisfactory electron injection characteristics without a substantial increase in driving voltage.

Second Electrode 150

The second electrode 150 may be located on the organic layer 130 having such a structure. The second electrode 150 may be a cathode, which is an electron injection electrode, and the material for the second electrode 150 can be a metal, an alloy, an electrically conductive compound, or any combination thereof, each having a low work function, may be used.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), an ITO, an IZO, or a combination thereof. The second electrode 150 may be a transmissive electrode, a transflective electrode, or a reflective electrode. The second electrode 150 may have a single-layered structure or a multi-layered structure including two or more layers.

Capping Layer

A first capping layer may be located outside the first electrode 110, and/or a second capping layer may be located outside the second electrode 150. In detail, the organic light-emitting device 10 or 20 may have a structure in which the first capping layer, the first electrode 110, the organic layer 130, and the second electrode 150 are sequentially stacked in this stated order, a structure in which the first electrode 110, the organic layer 130, the second electrode 150, and the second capping layer are sequentially stacked in this stated order, or a structure in which the first capping layer, the first electrode 110, the organic layer 130, the second electrode 150, and the second capping layer are sequentially stacked in this stated order.

Light generated in the emission region 133 of the organic layer 130 of the organic light-emitting device 10 or 20 may be extracted toward the outside through the first electrode 110, which is a transflective electrode or a transmissive electrode, and the first capping layer, and light generated in the emission region 133 of the organic layer 130 of the organic light-emitting device 10 or 20 may be extracted toward the outside through the second electrode 150, which is a transflective electrode or a transmissive electrode, and the second capping layer.

The first capping layer and the second capping layer may increase external emission efficiency according to the principle of constructive interference. Accordingly, the light extraction efficiency of the organic light-emitting device 10 or 20 is increased, so that the luminescence efficiency of the organic light-emitting device 10 or 20 may be improved. Each of the first capping layer and second capping layer may include a material having a refractive index (at 589 nm) of about 1.6 or more.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof.

The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In one or more embodiments, at least one of the first capping layer and the second capping layer may each independently include one of Compounds HT28 to $HT_{33}$, one of Compounds CP1 to CP6, N4,N4'-di(naphthalen-2-yl)-N4,N4'-diphenyl[1,1'-biphenyl]-4,4'-diamine (β-NPB), or any combination thereof:

CP1

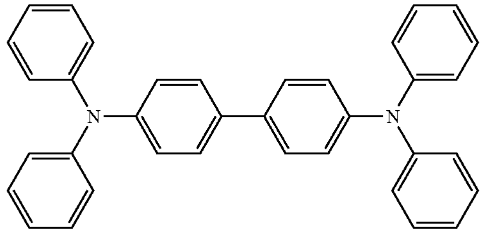

CP2

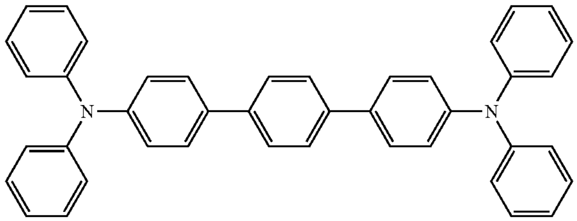

CP3

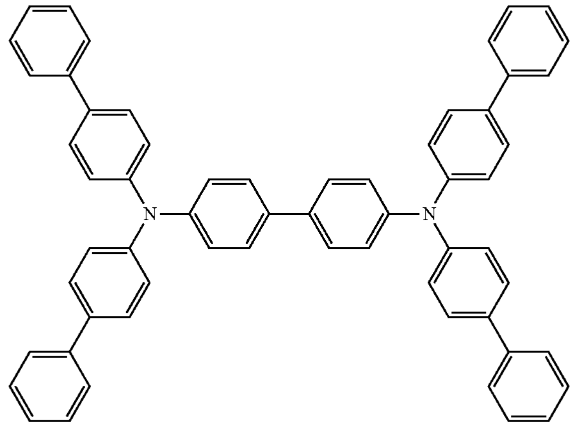

CP4

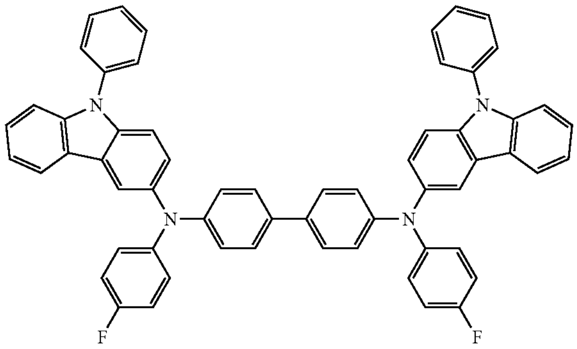

-continued

CP5

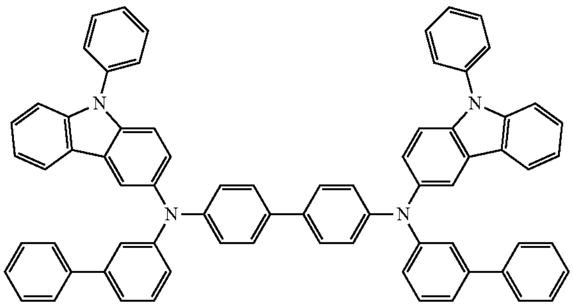

CP6

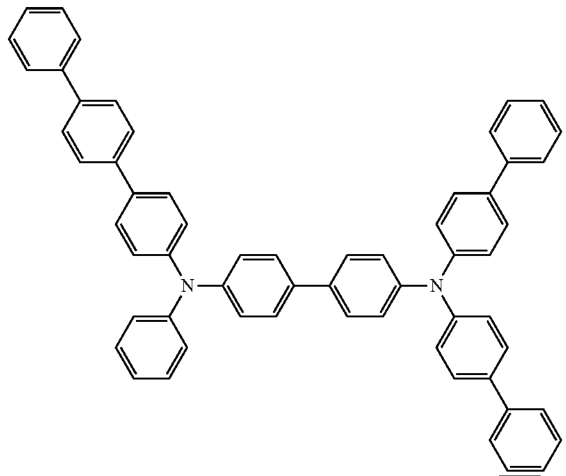

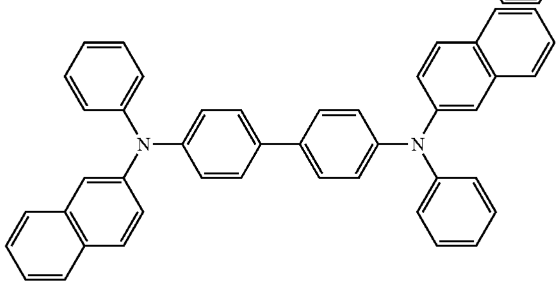

β-NPB

Quantum Dot

In some embodiments, the organic light-emitting device 10 or 20 may include quantum dots. The diameter of the quantum dot may be, for example, in a range of about 1 nm to about 10 nm. The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) or molecular beam epitaxy (MBE), and which requires low costs.

The quantum dot may include a semiconductor compound of Groups II-VI, a semiconductor compound of Groups III-V, a semiconductor compound of Groups a semiconductor compound of Groups a semiconductor compound of Groups IV-VI, an element or a compound of Group IV; or any combination thereof.

Examples of the semiconductor compound of Groups II-VI are a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the semiconductor compound of Groups III-V are a binary compound, such as GaN, GaP, GaAs, GaSb, AlN, AlP, AlAs, AlSb, InN, InP, InAs, InSb, or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like; or any combination thereof. The semiconductor compound of Groups III-V may further include Group II elements. Examples of the semiconductor compound of Groups III-V further including Group II elements are InZnP, InGaZnP, InAlZnP, etc. Examples of the semiconductor compound of Groups III-VI are a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; or any combination thereof. Examples of the semiconductor compound of Groups are a ternary compound, such as AgInS, $AgInS_2$, CuInS, $CuInS_2$, $CuGaO_2$, $AgGaO_2$, or $AgAlO_2$; or any combination thereof.

Examples of the semiconductor compound of Groups IV-VI are a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof. The element or compound of Group IV may include a single element material, such as Si or Ge; a binary compound, such as SiC or SiGe; or any combination thereof.

Each element included in a multi-element compound such as the binary compound, ternary compound and quaternary compound, may exist in a particle with a uniform concentration or non-uniform concentration. The quantum dot may have a single structure or a dual core-shell structure. In the case of the quantum dot having a single structure, the concentration of each element included in the corresponding quantum dot is uniform. In an embodiment, the material contained in the core and the material contained in the shell may be different from each other.

The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The interface between the core and the shell may have a concentration gradient that decreases toward the center of the element present in the shell.

Examples of the shell of the quantum dot may be an oxide of a metal, a metalloid, or a non-metal, a semiconductor compound, or any combination thereof. Examples of the oxide of a metal, a metalloid, or a non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound are, as described herein, a semiconductor compound of Groups II-VI; a semiconductor compound of Groups III-V; a semiconductor compound of Groups III-VI; a semiconductor compound of Groups I-III-VI; a semiconductor compound of Groups IV-VI; or any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The full width at half maximum (FWHM) of an emission wavelength spectrum of the quantum dot may be about 45 nm or less, for example, about 40 nm or less, for example, about 30 nm or less, and within these ranges, color purity or color gamut may be increased. In addition, since the light emitted through the quantum dot is emitted in all directions, the wide viewing angle can be improved. In addition, the quantum dot may be a generally spherical nanoparticle, a generally pyramidal nanoparticle, a generally multi-armed nanoparticle, a generally cubic nanoparticle, a generally nanotube-shaped particle, a generally nanowire-shaped particle, a generally nanofiber-shaped particle, or a generally nanoplate-shaped particle.

Because the energy band gap can be adjusted by controlling the size of the quantum dot, light having various wavelength bands can be obtained from the quantum dot emission layer. Therefore, by using quantum dots of different sizes, an organic light-emitting device that emits light of various wavelengths may be implemented. In an embodiment, the size of the quantum dot may be selected to emit red, green and/or blue light. In addition, the size of the quantum dot may be configured to emit white light by combining light of various colors.

Electronic Apparatus

The organic light-emitting device 10 or 20 may be included in various electronic apparatuses. In an embodiment, the electronic apparatus including the organic light-emitting device may be a light-emitting apparatus, an authentication apparatus, or the like.

The electronic apparatus (for example, light-emitting apparatus) may further include, in addition to the organic light-emitting device 10 or 20, i) a color filter, ii) a color conversion layer, or iii) a color filter and a color conversion layer. The color filter and/or the color conversion layer may be located in at least one traveling direction of light emitted from the organic light-emitting device 10 or 20. In an embodiment, the light emitted from the organic light-emitting device 10 or 20 may be blue light or white light. The organic light-emitting device 10 or 20 may be the same as described above. In an embodiment, the color conversion layer may include a quantum dot. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas. A pixel defining layer may be located among the subpixel areas to define each of the subpixel areas.

The color filter may further include a plurality of color filter areas and light-shielding patterns located among the color filter areas, and the color conversion layer may include a plurality of color conversion areas and light-shielding patterns located among the color conversion areas. The color filter areas (or the color conversion areas) may include a first area emitting first-color light, a second area emitting second-color light, and/or a third area emitting third-color light, and the first-color light, the second-color light, and/or the third-color light may have different maximum emission wavelengths from one another. In an embodiment, the first-color light may be red light, the second-color light may be green light, and the third-color light may be blue light. In an embodiment, the plurality of color filter areas (or the plurality of color conversion areas) may include quantum dots. In detail, the first area may include a red quantum dot, the second area may include a green quantum dot, and the third area may not include a quantum dot. The quantum dot is the same as described herein. The first area, the second area, and/or the third area may each include a scatter.

In an embodiment, the organic light-emitting device 10 or 20 may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. In detail, the first light may be blue light, the first first-color light may be red light, the second first-color light may be green light, and the third first-color light may be blue light.

The electronic apparatus may further include a thin-film transistor in addition to the organic light-emitting device 10 or 20 as described above. The thin-film transistor may include a source electrode, a drain electrode, and an activation layer, wherein any one of the source electrode and the drain electrode may be electrically connected to any one of the first electrode and the second electrode of the organic light-emitting device 10 or 20.

The thin-film transistor may further include a gate electrode, a gate insulating film, or the like. The activation layer may include a crystalline silicon, an amorphous silicon, an organic semiconductor, an oxide semiconductor, or the like.

The electronic apparatus may further include a sealing portion for sealing the organic light-emitting device 10 or 20. The sealing portion and/or the color conversion layer may be placed between the color filter and the organic light-emitting device 10 or 20. The sealing portion allows light from the organic light-emitting device 10 or 20 to be extracted to the outside, while simultaneously preventing ambient air and moisture from penetrating into the organic light-emitting device 10 or 20. The sealing portion may be a sealing substrate including a transparent glass substrate or a plastic substrate. The sealing portion may be a thin-film encapsulation layer including at least one layer of an organic layer and an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the organic light-emitting device 10 or 20, a biometric information collector. The electronic apparatus may take the form of or be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 4:
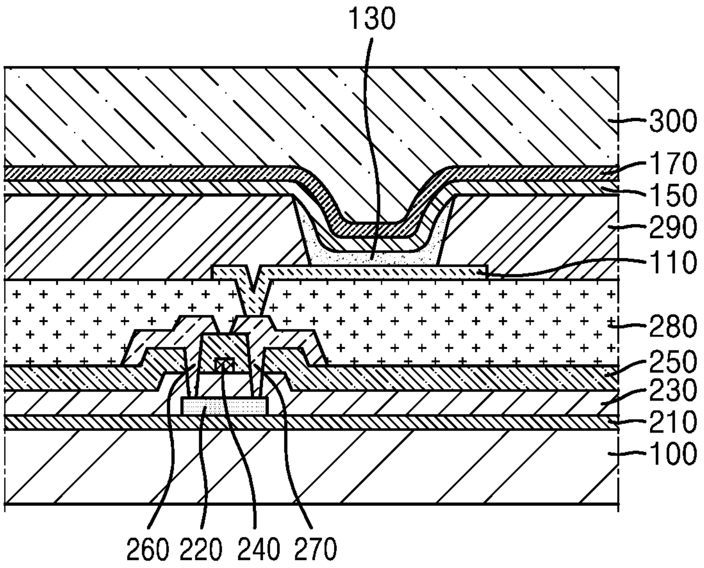
FIG. 4 is a schematic cross-sectional view of an embodiment illustrating a light-emitting apparatus including an organic light-emitting device constructed according to the principles of the invention.
Figure 5:
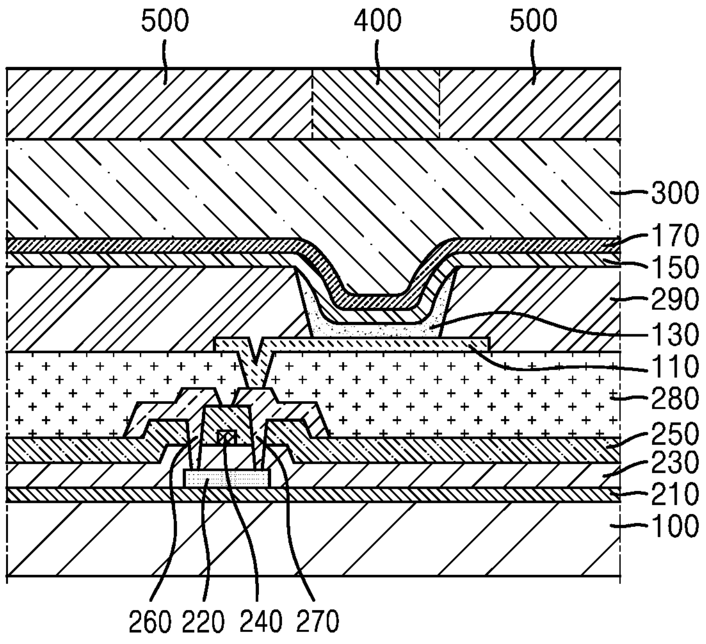
FIG. 5 is a schematic cross-sectional view of another embodiment illustrating a light-emitting apparatus including an organic light-emitting device constructed according to the principles of the invention.

Description of FIGS. 4 and 5

FIG. 4 is a schematic cross-sectional view of an embodiment illustrating a light-emitting apparatus including an organic light-emitting device constructed according to the principles of the invention.

The light-emitting apparatus 180 of FIG. 4 includes a substrate 100, a thin-film transistor (TFT) 200, an organic light-emitting device 10 or 20, and an encapsulation portion 300 that seals the organic light-emitting device 10 or 20. The substrate 100 may be a flexible substrate, a glass substrate, or a metal substrate. A buffer layer 210 may be formed on the substrate 100. The buffer layer 210 may prevent penetration of impurities through the substrate 100 and may provide a substantially flat surface on the substrate 100.

The TFT 200 may be located on the buffer layer 210. The TFT 200 may include an activation layer 220, a gate electrode 240, a source electrode 260, and a drain electrode 270. The activation layer 220 may include an inorganic semiconductor such as a silicon or a polysilicon, an organic semiconductor, or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230. An interlayer insulating film 250 may be located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT 200 is electrically connected to an organic light-emitting device 10 or 20 to drive the organic light-emitting device 10 or 20, and is covered by a passivation layer 280. The passivation layer 280 may include an inorganic insulating film, an organic insulating film, or a combination thereof. The organic light-emitting device 10 or 20 is provided on the passivation layer 280. The organic light-emitting device 10 or 20 may include a first electrode 110, an organic layer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel defining layer 290 containing an insulating material may be located on the first electrode 110. The pixel defining layer 290 exposes a region of the first electrode 110, and an organic layer 130 may be formed in the exposed region of the first electrode 110. The pixel defining layer 290 may be a polyimide or a polyacrylic organic film. At least some layers of the organic layer 130 may extend beyond the upper portion of the pixel defining layer 290 to be located in the form of a common layer. The second electrode 150 may be located on the organic layer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on an organic light-emitting device to protect the organic light-emitting device from moisture or oxygen. The encapsulation portion 300 may include: an inorganic film including a silicon nitride ($SiN_x$), a silicon oxide ($SiO_x$), an indium tin oxide, an indium zinc oxide, or any combination thereof; an organic film including a polyethylene terephthalate, a polyethylene naphthalate, a polycarbonate, a polyimide, a polyethylene sulfonate, a polyoxymethylene, a polyarylate, a hexamethyldisiloxane, an acrylic-based resin (for example, a polymethyl methacrylate, a polyacrylic acid, or the like), an epoxy-based resin (for example, an aliphatic glycidyl ether (AGE), or the like), or a combination thereof; or a combination of the inorganic film and the organic film.

FIG. 5 is a schematic cross-sectional view of another embodiment illustrating a light-emitting apparatus including an organic light-emitting device constructed according to the principles of the invention.

The light-emitting apparatus 190 of FIG. 5 is substantially the same as the light-emitting apparatus 180 of FIG. 4, except that a light-shielding pattern 500 and a functional region 400 are additionally located on the encapsulation portion 300. The functional region 400 may be a combination of i) a color filter area, ii) a color conversion area, or iii) a combination of the color filter area and the color conversion area. In an embodiment, the organic light-emitting device 10 or 20 included in the light-emitting apparatus 190 of FIG. 5 may be a tandem light-emitting device.

Respective layers included in the hole transport region 131, the emission region 133, and respective layers included in the electron transport region 135 may be formed in a certain region by using one or more suitable methods selected from vacuum deposition, spin coating, casting, Langmuir-Blodgett (LB) deposition, ink-jet printing, laser-printing, and laser-induced thermal imaging.

When the respective layers included in the hole transport region 131, the emission region 133, and the respective layers included in the electron transport region 135 are each formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

Definition of Terms

The term "organic layer" as used herein refers to a single layer and/or a plurality of layers located between the first electrode and the second electrode of the organic light-emitting device. A material included in the "organic layer" is not limited to an organic material.

A quantum dot as used herein refers to a crystal of a semiconductor compound, and may include any material capable of emitting light of various emission wavelengths according to the size of the crystal.

As used herein, the term "atom" may mean an element or its corresponding radical bonded to one or more other atoms.

The terms "hydrogen" and "deuterium" refer to their respective atoms and corresponding radicals with the deuterium radical abbreviated "—D", and the terms "—F, —Cl, —Br, and —I" are radicals of, respectively, fluorine, chlorine, bromine, and iodine.

As used herein, a substituent for a monovalent group, e.g., alkyl, may also be, independently, a substituent for a corresponding divalent group, e.g., alkylene.

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, heteroatom(s) as a ring-forming atom. The $C_3$-$C_{60}$ carbocyclic group and the $C_1$-$C_{60}$ heterocyclic group may each be a monocyclic group consisting of one ring or a polycyclic group in which two or more rings are fused with each other. For example, the number of ring-forming atoms of the $C_1$-$C_{60}$ heterocyclic group may be from 3 to 61.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a group T1 or ii) a fused cyclic group in which two or more groups T1 are fused with each other, for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group.

The $C_1$-$C_{60}$ heterocyclic group may be i) a group T2, ii) a fused cyclic group in which two or more groups T2 are fused with each other, or iii) a fused cyclic group in which at least one group T2 and at least one group T1 are fused with each other, for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.

The π electron-rich $C_3$-$C_{60}$ cyclic group may be i) a group T1, ii) a fused cyclic group in which two or more groups T1 are fused with each other, iii) a group T3, iv) a fused cyclic group in which two or more groups T3 are fused with each other, or v) a fused cyclic group in which at least one group T3 and at least one group T1 are fused with each other (for example, the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.

The π electron-deficient nitrogen-containing $C_1$-$C_{60}$ cyclic group may be i) a group T4, ii) a fused cyclic group in which two or more group T4 are fused with each other, iii) a fused cyclic group in which at least one group T4 and at least one group T1 are fused with each other, iv) a fused cyclic group in which at least one group T4 and at least one group T3 are fused with each other, or v) a fused cyclic group in which at least one group T4, at least one group T1, and at least one group T3 are fused with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.

The group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group fused to any cyclic group or a polyvalent group (for example, a divalent group, a trivalent group, a tetravalent group, etc.), depending on the structure of a formula in connection with which the terms are used. In an embodiment, "a benzene group" may be a bengroup, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group, and examples of the divalent $C_3$-$C_{60}$ carbocyclic group and the monovalent $C_1$-$C_{60}$ heterocyclic group are a $C_3$-Ccycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a substituted or unsubstituted divalent non-aromatic fused heteropolycyclic group.

The term "$C_1$-$C_{60}$ alkyl group" as used herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term $C_3$-$C_{10}$ cycloalkenyl group used herein refers to a monovalent cyclic group that has 3 to 10 carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be fused with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be fused with each other.

The term "monovalent non-aromatic fused polycyclic group" as used herein refers to a monovalent group (for example, having 8 to 60 carbon atoms) having two or more rings fused to each other, only carbon atoms as ring-forming atoms, and no aromaticity in its entire molecular structure. Examples of the monovalent non-aromatic fused polycyclic group are an indenyl group, a fluorenyl group, a spiro-bifluorenyl group, a benzofluorenyl group, an indenophenanthrenyl group, and an indeno anthracenyl group. The term "divalent non-aromatic fused polycyclic group" as used herein refers to a divalent group having a structure corresponding to a monovalent non-aromatic fused polycyclic group.

The term "monovalent non-aromatic fused heteropolycyclic group" as used herein refers to a monovalent group (for example, having 1 to 60 carbon atoms) having two or more rings fused to each other, at least one heteroatom other than carbon atoms, as a ring-forming atom, and non-aromaticity in its entire molecular structure. Examples of the monovalent non-aromatic fused heteropolycyclic group are a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having a structure corresponding to a monovalent non-aromatic fused heteropolycyclic group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$R_{10a}$" as used herein refers to:

deuterium (—D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom are O, S, N, P, Si, B, Ge, Se, and any combination thereof.

As used herein, the term "Ph" refers to a phenyl group, the term "Me" refers to a methyl group, the term "Et" refers to an ethyl group, the term "tert-Bu" or "But" refers to a tert-butyl group, and the term "OMe" refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

The symbols * and *' as used herein, unless defined otherwise, each refer to a binding site to a neighboring atom in a corresponding formula.

EXAMPLES

Example 1

As an anode, an ITO substrate was cut to a size of 50 mm×50 mm×0.5 mm, sonicated with acetone, isopropyl alcohol, and pure water for 15 minutes each, and then cleaned by irradiation of ultraviolet rays and exposure of ozone thereto for 30 minutes. Then, the ITO substrate was loaded onto a vacuum deposition apparatus.

The Compound HT3 was deposited on the ITO substrate to form a hole injection layer having a thickness of 120 nm, the Compound HT47 was deposited on the hole injection layer to form a hole transport layer having a thickness of 30 nm, the Compounds C-19 of Group II and PD1 of Group III were co-deposited on the hole transport layer at a weight ratio of 9:1 to form a first emission layer having a thickness of 5 nm, and the Compounds C-30 of Group II and ID1 of Group IV were co-deposited on the first emission layer at a weight ratio of 9:1 to form a second emission layer having a thickness of 30 nm. The Compound ET46 was deposited on the second emission layer to form a first electron transport layer having a thickness of 5 nm, and the Compounds ET47 and LiQ were co-deposited on the first electron transport layer at a weight ratio of 5:5 to form a second electron transport layer having a thickness of 20 nm. The Compound LiQ was deposited on the second electron transport layer to form an electron injection layer having a thickness of 1 nm. The elements Mg and Ag were co-deposited on the electron injection layer at a weight ratio of 5:5 to form a cathode having a thickness of 10 nm, thereby completing the manufacture of an organic light-emitting device.

Example 2

An organic light-emitting device was manufactured in the same manner as in Example 1, except that a first emission layer was deposited to a thickness of 10 nm and a second emission layer was deposited to a thickness of 25 nm.

Example 3

An organic light-emitting device was manufactured in the same manner as in Example 1, except that the Compound C-19 was used instead of the Compound C-30 in forming a second emission layer.

Example 4

An organic light-emitting device was manufactured in the same manner as in Example 3, except that a first emission layer was deposited to a thickness of 10 nm and a second emission layer was deposited to a thickness of 25 nm.

Example 5

An organic light-emitting device was manufactured in the same manner as in Example 1, except that the Compound C-30 was used instead of the Compound C-19 in forming a first emission layer.

Example 6

An organic light-emitting device was manufactured in the same manner as in Example 5, except that a first emission layer was deposited to a thickness of 10 nm and a second emission layer was deposited to a thickness of 25 nm.

Example 7

An organic light-emitting device was manufactured in the same manner as in Example 1, except that the Compounds A-34 of Group I and C-34 were used at a weight ratio of 5:5 instead of the Compound C-19 to form a first emission layer, and the Compounds A-34 and C-34 were used at a weight ratio of 5:5 instead of the Compound C-30 to form a second emission layer.

Example 8

An organic light-emitting device was manufactured in the same manner as in Example 7, except that a first emission layer was deposited to a thickness of 10 nm and a second emission layer was deposited to a thickness of 25 nm.

Comparative Example 1

An organic light-emitting device was manufactured in the same manner as in Example 1, except that a first emission layer was deposited to a thickness of 35 nm and a second emission layer was not formed.

Comparative Example 2

An organic light-emitting device was manufactured in the same manner as in Comparative Example 1, except that, in forming a first emission layer, the Compound C-30 was used instead of the Compounds C-19 and ID1 was used instead of the Compound PD1.

Comparative Example 3

An organic light-emitting device was manufactured in the same manner as in Comparative Example 1, except that, in forming a first emission layer, the Compounds A-34 and C-34 of Group II were used at a weight ratio of 5:5 instead of the Compounds C-19 and ID1 was used instead of the Compound PD1.

Comparative Example 4

An organic light-emitting device was manufactured in the same manner as in Example 1, except that a first emission layer was deposited to a thickness of 25 nm and a second emission layer was deposited to a thickness of 10 nm.

Comparative Example 5

An organic light-emitting device was manufactured in the same manner as in Example 1, except that the Compound mCP was used instead of the Compound C-19, a first emission layer was deposited to a thickness of 15 nm, the Compound mCP was used instead of C-30, and a second emission layer was deposited to a thickness of 15 nm.

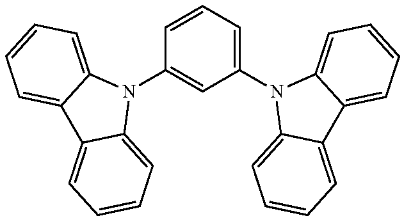

mCP

Evaluation of Examples

The luminescence efficiency, lifespan, and driving voltage of the organic light-emitting devices manufactured according to Examples 1 to 8 and Comparative Examples 1 to 5 were measured at a current density of 10 $mA/cm^2$ by using a source-measure unit sold under the trade designation SMU 236 from Keithley Instrument by Tektronix, Inc., of Beaverton, Oregon and a luminance meter sold under the trade designation PR650 from Konica Minolta, Inc. of Tokyo, Japan, and results thereof are shown in Table 1. The lifespan indicates the amount of time that lapsed when luminance was 90% of initial luminance (100%). The lifespan was measured based on Comparative Example 1 as 100%.

TABLE 1

| | First emission layer | Second emission layer | Driving voltage | Luminescence efficiency | Lifespan |
|---|---|---|---|---|---|
| Example 1 | C-19: PD1 (5 nm) | C-30: ID1 (30 nm) | 100% | 105% | 165% |
| Example 2 | C-19: PD1 (10 nm) | C-30: ID1 (25 nm) | 100% | 104% | 190% |
| Example 3 | C-19: PD1 (5 nm) | C-19: ID1 (30 nm) | 95% | 110% | 180% |
| Example 4 | C-19: PD1 (10 nm) | C-19: ID1 (25 nm) | 88% | 105% | 200% |
| Example 5 | C-30: PD1 (5 nm) | C-30: ID1 (30 nm) | 93% | 105% | 170% |
| Example 6 | C-30: PD1 (10 nm) | C-30: ID1 (25 nm) | 93% | 105% | 175% |
| Example 7 | A-3434: PD1 (5 nm) | A-3434: ID1 (30 nm) | 97% | 105% | 205% |
| Example 8 | A-3434: PD1 (10 nm) | A-3434: ID1 (25 nm) | 93% | 110% | 230% |
| Comparative Example 1 | C-19: PD1 (35 nm) | X | 100% | 100% | 100% |
| Comparative Example 2 | C-30: ID1 (35 nm) | X | 110% | 95% | 110% |
| Comparative Example 3 | A-34 + 34: ID1 (35 nm) | X | 105% | 95% | 135 % |
| Comparative Example 4 | C-19: PD1 (25 nm) | C-30: ID1 (10 nm) | 102% | 105% | 120% |
| Comparative Example 5 | mCP: PD1 (15 nm) | mCP: ID1 (15 nm) | 110% | 80% | 65% |

The results summarized in Table 1 show that the organic light-emitting devices of Examples 1 to 8 have significant and unexpectedly excellent lifespan and luminescence efficiency and low driving voltage, as compared with the organic light-emitting devices of Comparative Examples 1 to 5.

Although not wanting to be bound by theory, organic light-emitting devices constructed according to the principles and embodiments of the invention include a compound having weak hole trapping characteristics in a first emission layer in an emission region neighboring a hole transport region, and a compound having strong hole trapping characteristics in a second emission layer in an emission region neighboring an electron transport region. As a result, a recombination region may be formed at an interface between the first emission layer and the second emission layer. In this manner, the lifespan and luminescence efficiency of the device may be improved. When the recombination region is present near a neighboring hole transport region or electron transport region instead of at the interface between the first emission layer and the second emission layer, deterioration of device materials may occur, and the luminescence efficiency may be decreased due to loss of excitons. However, in the organic light-emitting devices constructed according to the principles and embodiments of the invention, even when a leakage of some charges occurs, the leaked charges will be relocated in the vicinity of the interface between the first emission layer and the second emission layer in the emission region, and thus, the decrease in the luminescence efficiency may be prevented.

Some of the advantages that may be achieved by illustrative implementations of the invention and/or illustrative methods of the invention include improvement of the lifespan and luminescence efficiency of the device and the prevention of decrease in luminescence efficiency.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting device comprising:

a first electrode;

a second electrode; and an organic layer between the first electrode and the second electrode, wherein the organic layer comprises: an emission region; a hole transport region between the first electrode and the emission region; and an electron transport region between the emission region and the second electrode, the emission region comprises a first emission layer proximate to the hole transport region and a second emission layer proximate to the electron transport region, the first emission layer and the second emission layer are different from each other, and Equation 1 is satisfied:

$$VHOD\_EML1\ (\text{at } 10\ mA/cm^2)+0.5 \leq VHOD\_EML2\ (\text{at } 10\ mA/cm^2) \quad \text{Equation 1}$$

wherein, in Equation 1,

VHOD_EML1 (at 10 $mA/cm^2$) is a driving voltage value when a current density of a first hole-only device having a structure comprising the first electrode, the hole transport region, the first emission layer, and the second electrode is 10 $mA/cm^2$, VHOD_EML2 (at 10 $mA/cm^2$) is a driving voltage value when a current density of a second hole-only device having a structure comprising the first electrode, the hole transport region, the second emission layer, and the second electrode is 10 $mA/cm^2$, and the first hole-only device and the second hole-only device have substantially the same structure, except that the first emission layer and the second emission layer are respectively used in the first hole-only device and the second hole-only device, wherein the first emission layer and the second emission layer each, independently from one another, comprise both a first compound comprising a hole transporting host, and a second compound comprising an electron transporting host; or a third compound comprising a bipolar host, wherein the first compound is of Formula 1:

Formula 1

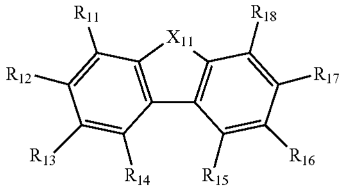

wherein, in Formula 1, $X_{11}$ is O, S, $N(R_{19})$, or $C(R_{19})(R_{20})$, $R_{11}$ to $R_{20}$ are each, independently from one another: $*-(L_{11})_{a11}-A_{11}$, hydrogen, deuterium, a $C_1$-$C_{60}$ alkyl group, a π electron-deficient nitrogen-free cyclic group, $—C(Q_1)(Q_2)(Q_3)$, $—Si(Q_1)(Q_2)(Q_3)$, $—B(Q_1)(Q_2)$, or $—N(Q_1)(Q_2)$, wherein * indicates a binding site to a neighboring atom;

a π electron-deficient nitrogen-free cyclic group substituted with at least one of deuterium, a $C_1$-$C_{60}$ alkyl group, a π electron-deficient nitrogen-free cyclic group, $—C(Q_{31})(Q_{32})(Q_{33})$, $—Si(Q_{31})(Q_{32})(Q_{33})$, $—B(Q_{31})(Q_{32})$, and $—N(Q_{31})(Q_{32})$; or a π electron-deficient nitrogen-free cyclic group substituted with a π electron-deficient nitrogen-free cyclic group substituted with at least one of deuterium, a $C_1$-$C_{60}$ alkyl group, a π electron-deficient nitrogen-free cyclic group, $—C(Q_{21})(Q_{22})(Q_{23})$, $—Si(Q_{21})(Q_{22})(Q_{23})$, $—B(Q_{21})(Q_{22})$, and $—N(Q_{21})(Q_{22})$, $L_{11}$ is: a π electron-deficient nitrogen-free cyclic group, $—C(Q_1)(Q_2)—$, $—Si(Q_1)(Q_2)—$, $—B(Q_1)—$, or $—N(Q_1)—$; or a π electron-deficient nitrogen-free cyclic group substituted with at least one of deuterium, a $C_1$-$C_{60}$ alkyl group, a π electron-deficient nitrogen-free cyclic group, $—C(Q_{31})(Q_{32})(Q_{33})$, $—Si(Q_{31})(Q_{32})(Q_{33})$, $—B(Q_{31})(Q_{32})$, and $—N(Q_{31})(Q_{32})$, a11 is 1, 2, or 3, $A_{11}$ is a π electron-deficient nitrogen-free cyclic group;

a π electron-deficient nitrogen-free cyclic group substituted with at least one of deuterium, a $C_1$-$C_{60}$ alkyl group, a π electron-deficient nitrogen-free cyclic group, $—C(Q_{31})(Q_{32})(Q_{33})$, $—Si(Q_{31})(Q_{32})(Q_{33})$, $—B(Q_{31})(Q_{32})$, and $—N(Q_{31})(Q_{32})$; or a π electron-deficient nitrogen-free cyclic group substituted with a π electron-deficient nitrogen-free cyclic group substituted with at least one deuterium, a $C_1$-$C_{60}$ alkyl group, a π electron-deficient nitrogen-free cyclic group, $—C(Q_{21})(Q_{22})(Q_{23})$, $—Si(Q_{21})(Q_{22})(Q_{23})$, $—B(Q_{21})(Q_{22})$, and $—N(Q_{21})(Q_{22})$, and any two or more substituents among $R_{11}$ to $R_{20}$ are optionally linked to each other to form one: a π electron-deficient nitrogen-free cyclic group; and a π electron-deficient nitrogen-free cyclic group substituted with at least one of deuterium, a $C_1$-$C_{60}$ alkyl group, a π electron-deficient nitrogen-free cyclic group, $—C(Q_{31})(Q_{32})(Q_{33})$, $—Si(Q_{31})(Q_{32})(Q_{33})$, $—B(Q_{31})(Q_{32})$, and $—N(Q_{31})(Q_{32})$, wherein $Q_1$ to $Q_3$, $Q_{21}$ to $Q_{23}$, and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group; or a $C_1$-$C_{60}$ heterocyclic group each, independently from one another unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, wherein the second compound is of Formula 2:

Formula 2

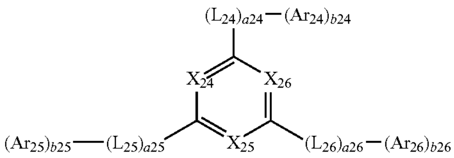

wherein, in Formula 2, $X_{24}$ is $C(R_{24})$ or N, $X_{25}$ is $C(R_{25})$ or N, and $X_{26}$ is $C(R_{26})$ or N, at least one of $X_{24}$ to $X_{26}$ is N, $R_{24}$ to $R_{26}$, are independently from one another, $*-(L_{27})_{a27}-(Ar_{27})_{b27}$, hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, $L_{24}$ to $L_{27}$ are each, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Ar_{24}$ to $Ar_{27}$ are each, independently from one another, a further group represented Formula 2, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, a24 to a27 are each, independently from one another, an integer from 0 to 3, b24 to b27 are each, independently from one another, an integer from 1 to 8, two or more neighboring groups of $Ar_{24}$ to $Ar_{27}$ and $R_{24}$ to $R_{26}$ are, independently from one another, optionally linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,

* indicates a binding site to a neighboring atom, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof, or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, $Q_1$ to $Q_3$, $Q_{11}$ to $Q_{13}$, $Q_{21}$ to $Q_{23}$ and $Q_{31}$ to $Q_{33}$ are, independently from one another: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and wherein the third compound is of Formula 3:

Formula 3

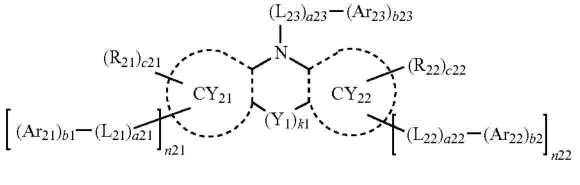

-continued

Formula 3A

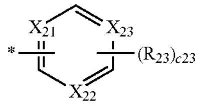

wherein, in Formula 3, $Y_1$ is a single bond, —O—, —S—, $—C(R_{27})(R_{28})—$, $—N(R_{27})—$, $Si(R_{27})(R_{28})—$, —C(=O)—, $—S(=O)_2—$, $—B(R_{27})—$, $—P(R_{27})—$, or $—P(=O)(R_{27})(R_{28})—$, k1 is 0 or 1, $CY_{21}$ and $CY_{22}$ are each, independently from one another, a $C_3$-$C_{60}$ carbocyclic group or a $C_1$-$C_{60}$ heterocyclic group, $L_{21}$ to $L_{23}$ and $L_{28}$ are each, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Ar_{21}$ to $Ar_{23}$ and $Ar_{28}$ are each, independently from one another, a group represented by Formula 3A, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, at least one of $Ar_{21}$ to $Ar_{23}$ is a group represented by Formula 3A, a21 to a23 and a28 are each, independently from one another, an integer from 0 to 3, b21 to b23 and b28 are each, independently from one another, an integer from 1 to 8, c21 to c22 are each, independently from one another, an integer from 1 to 20, c23 is an integer from 0 to 5, n21 and n22 are each, independently from one another, an integer from 1 to 8, $X_{21}$ to $X_{23}$ are each, independently from one another, C or N, when each of $X_{21}$ to $X_{23}$ is C, at least one of $R_{21}$ to $R_{23}$ is, independently from one another, —F; a cyano group; or a $C_1$-$C_{60}$ alkyl group substituted with at least one of —F and a cyano group, $R_{21}$ to $R_{23}$, $R_{27}$ and $R_{28}$ are each, independently from one another, $*-(L_{28})_{a28}-(Ar_{28})_{b28}$, hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, two or more neighboring groups of $Ar_{21}$ to $Ar_{23}$, $Ar_{28}$, $R_{21}$ to $R_{23}$, and $R_{28}$ are, independently from one another, optionally linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,

* indicates a binding site to a neighboring atom, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), $Q_1$ to $Q_3$, $Q_{11}$ to $Q_{13}$, $Q_{21}$ to $Q_{23}$ and $Q_{31}$ to $Q_{33}$ are, independently from one another: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The organic light-emitting device of claim 1, wherein the first electrode comprises an anode, the second electrode comprises a cathode, and the hole transport region comprises a hole injection layer, a hole transport layer, an emission auxiliary layer, an electron blocking layer, or any combination thereof, and the electron transport region comprises a hole blocking layer, a buffer layer, an electron transport layer, an electron injection layer, or any combination thereof.

3. The organic light-emitting device of claim 1, wherein the first emission layer directly contacts the second emission layer.

4. The organic light-emitting device of claim 1, wherein the first emission layer and the second emission layer have different thicknesses from each other.

5. The organic light-emitting device of claim 1, wherein the first emission layer has a thickness less than or equal to a thickness of the second emission layer.

6. The organic light-emitting device of claim 1, wherein holes and electrons are recombined at an interface between the first emission layer and the second emission layer.

7. The organic light-emitting device of claim 1, wherein the first emission layer comprises a first dopant, and the second emission layer comprises a second dopant, and the first dopant and the second dopant are different from each other.

8. The organic light-emitting device of claim 7, wherein the first dopant and the second dopant are each of Formula 4:

Formula 4

$$M_{31}(L_{31})_{n31}(L_{32})_{n32}$$

Formula 4A

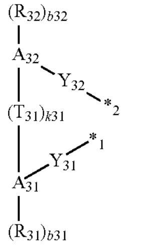

Formula 4B

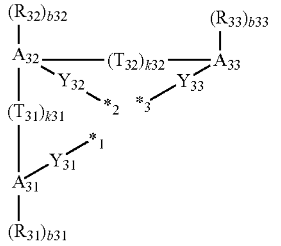

Formula 4C

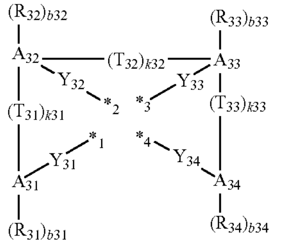

Formula 4D

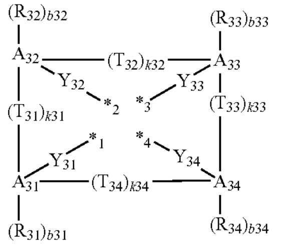

wherein, in Formulae 4 and 4A to 4D, $M_{31}$ is selected from a first-row transition metal of the Periodic Table of Elements, a second-row transition metal of the Periodic Table of Elements, and a third-row transition metal of the Periodic Table of Elements;

$L_{31}$ is a ligand of one of Formulae 4A to 4D;

$L_{32}$ is a monodentate ligand, a bidentate ligand, or a tridentate ligand;

n31 is 1 or 2;

n32 is 0, 1, 2, 3, or 4;

$A_{31}$ to $A_{34}$ are each, independently from one another, a $C_5$-$C_{30}$ carbocyclic group or a $C_1$-$C_{30}$ heterocyclic group;

$T_{31}$ to $T_{34}$ are each, independently from one another, a single bond, a double bond, *—O—*', *—S—*', *—C(=O)—*', *—S(=O)—*', *—C($R_{35}$)($R_{36}$)—*', *—C($R_{35}$)=C($R_{36}$)—*', *—C($R_{35}$)=*', *—Si($R_{35}$)($R_{36}$)—*', *—B($R_{35}$)—*', *—N($R_{35}$)—*', or *—P($R_{35}$)—*';

k31 to k34 are each, independently from one another, of 1, 2, or 3;

$Y_{31}$ to $Y_{34}$ are each, independently from one another, a single bond, *—O—*', *—S—*', *—C($R_{37}$)($R_{38}$)—*', *—Si($R_{37}$)($R_{38}$)—*', *—B($R_{37}$)—*', *—N($R_{37}$)—*', or *—P($R_{37}$)—*';

* and *' each indicate a binding site to a neighboring atom; *1, *2, *3, and *4 each indicate a binding site to $M_{31}$;

$R_{31}$ to $R_{38}$ are each, independently from one another, hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), and $R_{31}$ to $R_{38}$, independently from one another, are optionally linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, b31 to b34 are each, independently from one another, an integer from 0 to 10, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), $Q_1$ to $Q_3$, $Q_{11}$ to $Q_{13}$, $Q_{21}$ to $Q_{23}$ and $Q_{31}$ to $Q_{33}$ are, independently from one another: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

9. The organic light-emitting device of claim 8, wherein the first dopant and the second dopant are each, independently from one another, one of Formulae 4-1 and 4-2:

Formula 4-1

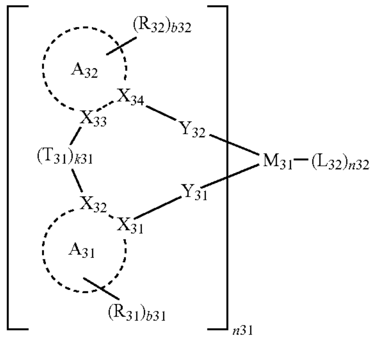

Formula 4-2

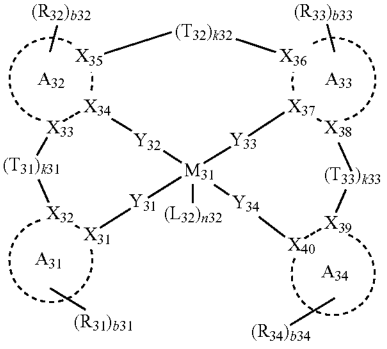

wherein, in Formulae 4-1 and 4-2, $X_{31}$ to $X_{40}$ are each, independently from one another, N or C, and $M_{31}$, $L_{32}$, n31, n32, $A_{31}$ to $A_{34}$, $T_{31}$ to $T_{33}$, k31 to k33, $Y_{31}$ to $Y_{34}$, $R_{31}$ to $R_{38}$, and b31 to b34 have, independently from one another, the same meanings as in claim 8.

10. The organic light-emitting device of claim 9, wherein the first dopant is of Formula 4-2, $M_{31}$ is Pt, and n32 is 0, and the second dopant is of Formula 4-1, $M_{31}$ is Ir, and the sum of n31 and n32 is 3.

11. The organic light-emitting device of claim 8, wherein at least one of $A_{31}$ to $A_{34}$ in the first dopant, independently from one another, is a pyridine group.

12. An electronic apparatus comprising the organic light-emitting device of claim 1.

13. The electronic apparatus of claim 12, further comprising a thin-film transistor having a source electrode and a drain electrode, and the first electrode of the organic light-emitting device is electrically connected to at least one of the source electrode and the drain electrode of the thin-film transistor.

14. The electronic apparatus of claim 12, further comprising a color filter, a color conversion layer, a touch screen layer, a polarizing layer, or any combination thereof.

* * * * *